United States Patent [19]
Eda et al.

[11] Patent Number: 5,747,857
[45] Date of Patent: *May 5, 1998

[54] ELECTRONIC COMPONENTS HAVING HIGH-FREQUENCY ELEMENTS AND METHODS OF MANUFACTURE THEREFOR

[75] Inventors: Kazuo Eda, Nara; Yutaka Taguchi, Osaka; Akihiro Kanaboshi, Neyagawa; Tetsuyoshi Ogura, Osaka, all of Japan

[73] Assignee: Matsushita Electric Industrial Co., Ltd., Osaka, Japan

[*] Notice: The term of this patent shall not extend beyond the expiration date of Pat. No. 5,446,330.

[21] Appl. No.: 182,561

[22] Filed: Jan. 18, 1994

Related U.S. Application Data

[63] Continuation-in-part of Ser. No. 81,805, Jun. 23, 1993, abandoned, Ser. No. 137,843, Oct. 15, 1993, abandoned, and Ser. No. 131,375, Oct. 5, 1993, abandoned, which is a continuation-in-part of Ser. No. 849,609, Mar. 11, 1992, abandoned, and Ser. No. 942,269, Sep. 9, 1992, abandoned.

[30] Foreign Application Priority Data

| Mar. 13, 1991 | [JP] | Japan | 3-47872 |
| Jun. 23, 1992 | [JP] | Japan | 4-164451 |
| Jun. 23, 1992 | [JP] | Japan | 4-164452 |
| Jul. 1, 1992 | [JP] | Japan | 4-174014 |
| Jul. 3, 1992 | [JP] | Japan | 4-176605 |
| Oct. 5, 1992 | [JP] | Japan | 4-266158 |
| Oct. 13, 1992 | [JP] | Japan | 4-274002 |
| Oct. 13, 1992 | [JP] | Japan | 4-274003 |
| Oct. 20, 1992 | [JP] | Japan | 4-281473 |
| Oct. 20, 1992 | [JP] | Japan | 4-281474 |

[51] Int. Cl.$^6$ .......................... H01L 41/10; H01L 41/08
[52] U.S. Cl. .......................... 257/416; 310/320; 310/324
[58] Field of Search .......................... 257/416; 310/313, 310/320, 324; 156/621, 619, 624

[56] References Cited

U.S. PATENT DOCUMENTS 2,133,647 10/1938 Pierce.
2,229,172 1/1941 Hawk.

(List continued on next page.)

FOREIGN PATENT DOCUMENTS 0 143 686 6/1985 European Pat. Off..

(List continued on next page.)

OTHER PUBLICATIONS

Sze, *Semiconductor Devices: Physics and Technology*, 1985, p. 344.

(List continued on next page.)

*Primary Examiner*—Donald Monin
*Attorney, Agent, or Firm*—Wenderoth, Lind & Ponack

[57] ABSTRACT

Integrated circuits utilizing piezoelectric elements can be advantageously constructed by bonding elements together via direct bonds. Such integrated circuits include an electro-acoustic hybrid integrated circuit such as a voltage controlled oscillator wherein a semiconductor substrate having an active element is bonded through direct bonding to a surface acoustic wave resonator or a quartz oscillator as an electro-acoustic element. A quartz device can also be provided which includes a quartz plate, excitation electrodes on opposite surfaces, and a holding member made of a material having a thermal expansion coefficient substantially equal to that of the quartz plate. The holding member is connected to the quartz plate by direct bonding without using any adhesives. Because the thermal expansion coefficients of the quartz plate and the holding member are equal, no thermal stress occurs in the bonding area. As a result, virtually no stress is applied to the quartz plate and the frequency-temperature characteristic can be improved. A piezoelectric filter according to the invention includes an oscillatory piezoelectric plate made of quartz, lithium tantalate, lithium niobate or lithium borate and having an oscillatory portion; a glass plate to which the piezoelectric plate is directly bonded; and first and second oscillatory electrode members which are provided on opposite faces of the oscillatory portion, respectively, such that at least one of the oscillatory electrode members is divided into a plurality of counter electrodes.

63 Claims, 44 Drawing Sheets

U.S. PATENT DOCUMENTS

| | | |
|---|---|---|
| 2,427,825 | 9/1947 | Washburn . |
| 3,239,908 | 3/1966 | Nakamura . |
| 3,339,091 | 8/1967 | Hammond et al. . |
| 3,582,839 | 6/1971 | Pim et al. .................................. 333/191 |
| 3,694,677 | 9/1972 | Guttwein et al. . |
| 4,019,074 | 4/1977 | Shibayama et al. ................. 310/313 A |
| 4,135,108 | 1/1979 | Besson . |
| 4,141,209 | 2/1979 | Barnett et al. . |
| 4,270,105 | 5/1981 | Parker et al. . |
| 4,293,986 | 10/1981 | Kobayashi et al. . |
| 4,317,059 | 2/1982 | Besson . |
| 4,334,168 | 6/1982 | Besson et al. . |
| 4,349,794 | 9/1982 | Kagiwada et al. ....................... 333/141 |
| 4,398,114 | 8/1983 | Minagawa et al. . |
| 4,517,485 | 5/1985 | Berte et al. . |
| 4,531,267 | 7/1985 | Royer . |
| 4,539,501 | 9/1985 | Trong et al. . |
| 4,665,374 | 5/1987 | Fathimulla . |
| 4,719,383 | 1/1988 | Wang et al. . |
| 4,870,313 | 9/1989 | Hirama et al. . |
| 4,898,897 | 2/1990 | Kiyohara et al. . |
| 4,945,079 | 7/1990 | Pedersen et al. . |
| 5,036,241 | 7/1991 | Michaelis et al. . |
| 5,074,630 | 12/1991 | Rodino et al. .............................. 385/14 |
| 5,075,641 | 12/1991 | Weber et al. . |
| 5,150,226 | 9/1992 | Takanashi et al. ....................... 358/471 |
| 5,158,823 | 10/1992 | Enomoto et al. ......................... 428/216 |
| 5,185,589 | 2/1993 | Krishnaswamy et al. . |
| 5,189,914 | 3/1993 | White et al. . |
| 5,198,716 | 3/1993 | Godshall et al. . |
| 5,202,652 | 4/1993 | Tabuchi et al. ........................... 333/193 |
| 5,209,917 | 5/1993 | Ohno et al. ............................... 423/592 |
| 5,221,870 | 6/1993 | Nakahata et al. ..................... 310/313 A |
| 5,221,873 | 6/1993 | Totty et al. ............................... 310/361 |
| 5,281,935 | 1/1994 | Knecht et al. ............................ 333/187 |
| 5,373,579 | 12/1994 | Eda ........................................... 385/131 |
| 5,446,330 | 8/1995 | Eda et al. ............................ 310/313 R |
| 5,448,126 | 9/1995 | Eda et al. . |
| 5,453,652 | 9/1995 | Eda et al. . |
| 5,485,540 | 1/1996 | Eda ........................................... 385/129 |
| 5,504,375 | 4/1996 | Carlson et al. ........................... 257/758 |

FOREIGN PATENT DOCUMENTS

| | | |
|---|---|---|
| 0 503 892 | 9/1992 | European Pat. Off. . |
| 0 531 985 | 3/1993 | European Pat. Off. . |
| 2 458 150 | 12/1980 | France . |
| 25 16 307 | 10/1976 | Germany . |
| 0 156 146 | 10/1985 | Germany . |
| 39 22 671 | 1/1991 | Germany . |
| 61-41215 | 2/1986 | Japan . |
| 61-63107 | 4/1986 | Japan . |
| 62-27040 | 6/1987 | Japan . |
| 62-283301 | 12/1987 | Japan . |
| 63-285195 | 11/1988 | Japan . |
| 2-121512 | 5/1990 | Japan . |
| 2-291710 | 12/1990 | Japan . |
| 3-6912 | 1/1991 | Japan . |
| 3-178206 | 2/1991 | Japan . |
| 4-283957 | 10/1992 | Japan . |
| 5-22071 | 1/1993 | Japan . |
| 513471 | 5/1976 | U.S.S.R. . |
| 510775 | 1/1977 | U.S.S.R. . |
| 580 621 | 11/1977 | U.S.S.R. . |

OTHER PUBLICATIONS

"Quartz Resonators at Fundamental Frequencies Greater Than 100 MHz", Berte et al., 1978 Ultrasonics Symp. Proc.; New Jersey; pp. 148–151.

43rd Annual Symposium on Frequency Control—1989, "A New Design for High Frequency Bulk Resonators", A. Lepek et al., pp. 544–547.

"Fundamental–Mode VHF/UHF Miniature Acoustic Resonators and Filters on Silicon", Grudkowski et al., pp. 993–995, Applied Physics Letters, Vo. 37(11)(1980).

"Advances in Microwave Acoustic Frequency Sources" By Gerber et al., IIEE Transactions on Microwave Theory and Techniques, V. MTT–34, No. 10, Oct. 1986.

Direct–Frequency Crystal Oscillator Line Extends to 1.5 GHz, by Gallagher, Electronics/Jul. 14, 1981, pp. 7E & 8E.

"Silicon–to–Silicon Direct Bonding Method", by Shimbo et al., J. Appl. Phys. (60(8), 15 Oct. 1986, pp. 2987–2989.

"Film Bulk Acoustic Waves Resonator Technology", by S. V. Krishnoswamy, et al. Ultrasonics Symposium, 1990, pp. 529–536 (1990).

"Zero–Temperature–Coefficient Saw Devices On AlN Epitaxial Films", K. Tsubouchi et al. IEEE Transactions, vol. SU–32, No. 5 (1985), pp. 634–644.

"A 400 HMz One–Chip Oscillator Using an Air–Gap Type Thin Film Resonator", by Satoh et al., IEEE Ultrsonics Symposium (1987), pp. 363–369.

"Generalized Bonding" by Goetz et al., 1989 IEEE SOS/SOI Technology Conference, Oct. 3–5, 1989, pp. 125–126.

Hydrogen bond
Covalent bond

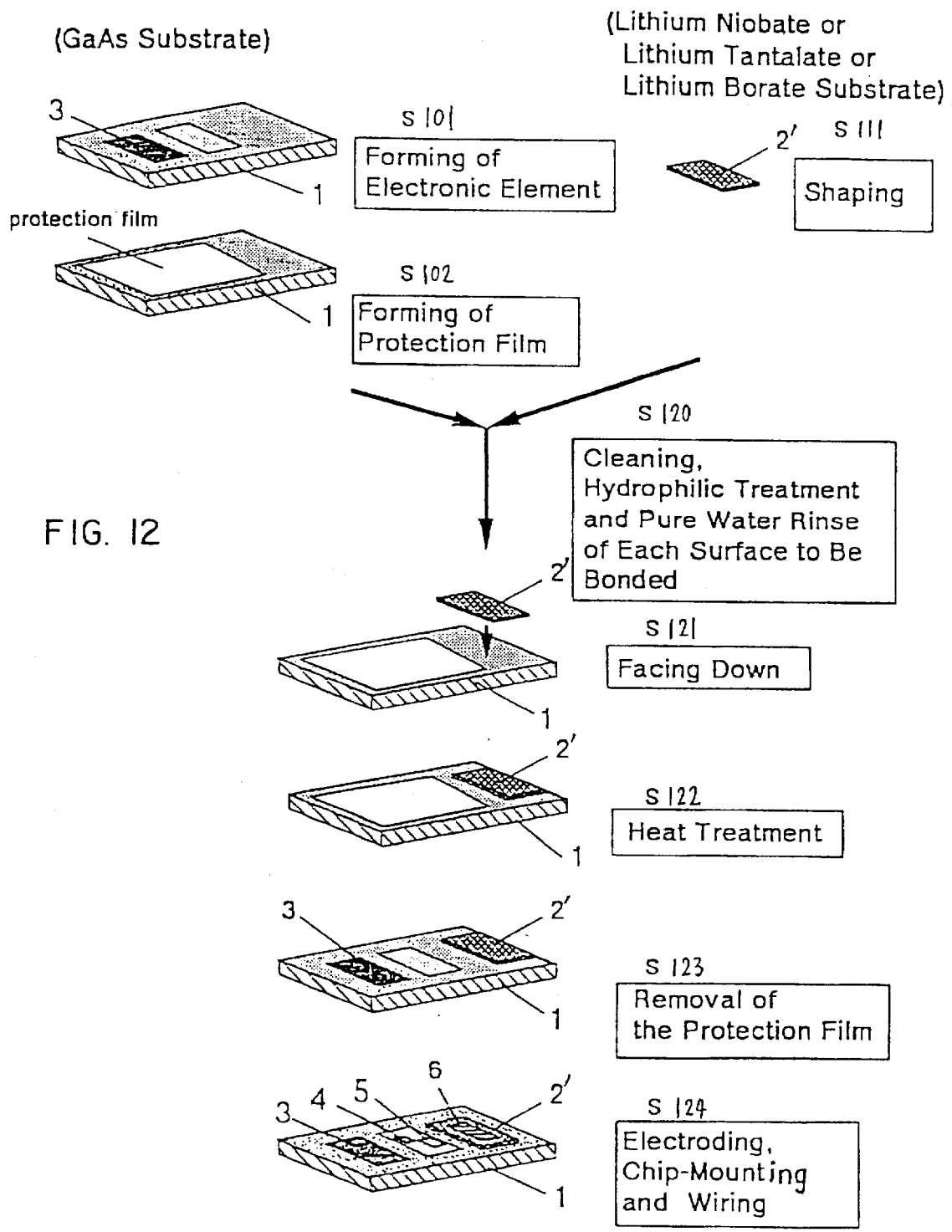

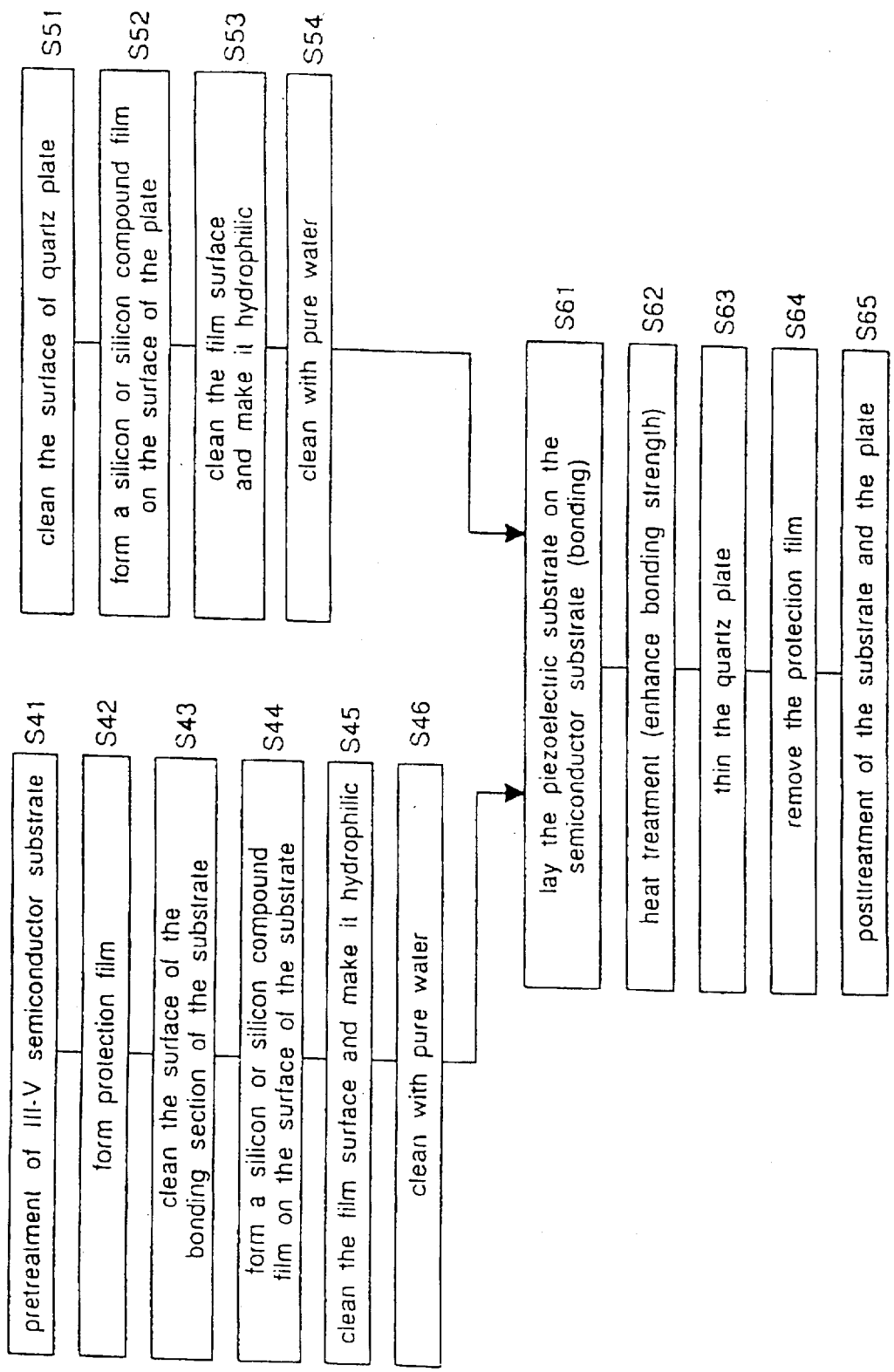

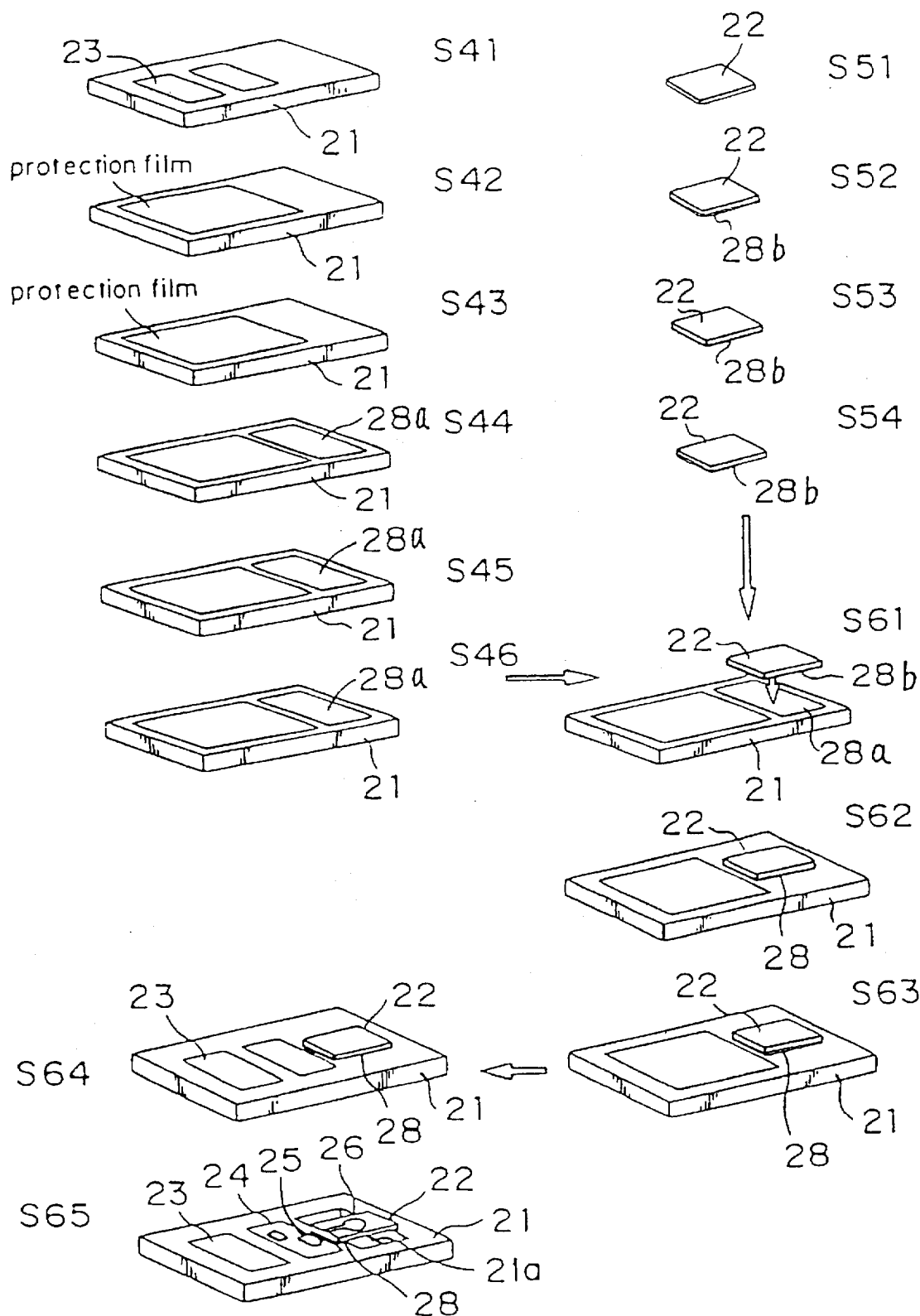

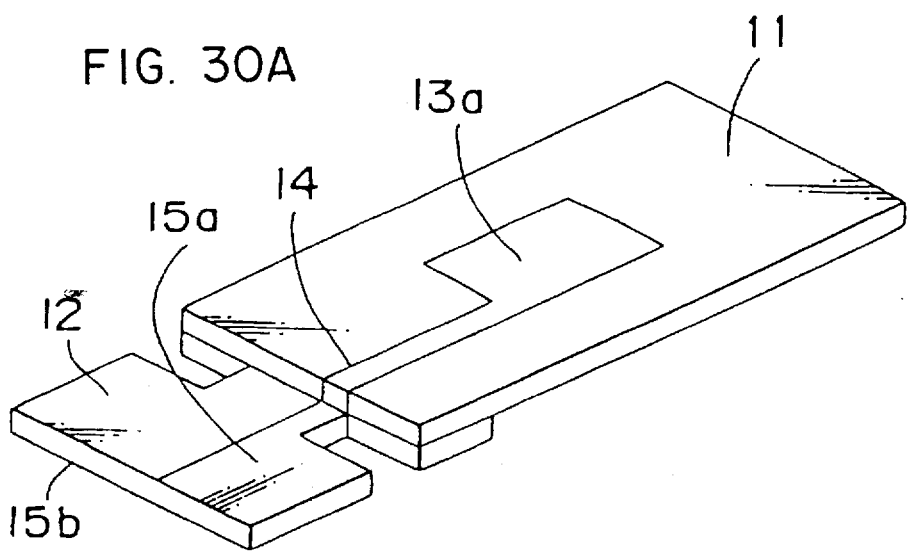

FIG. 36A
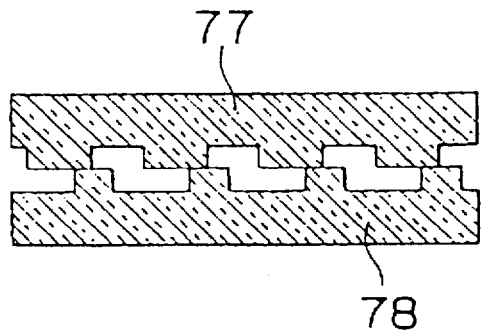
FIG. 36B
FIG. 36C
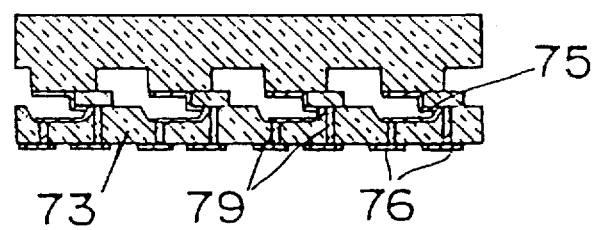
FIG. 36D
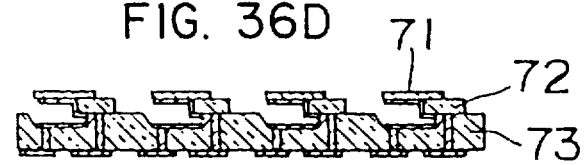
FIG. 36E
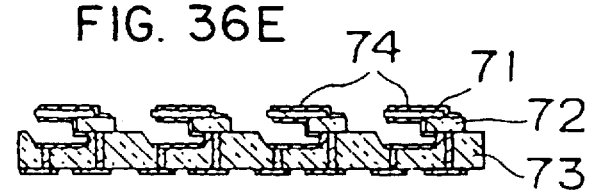
FIG. 36F
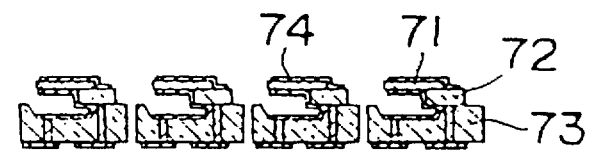

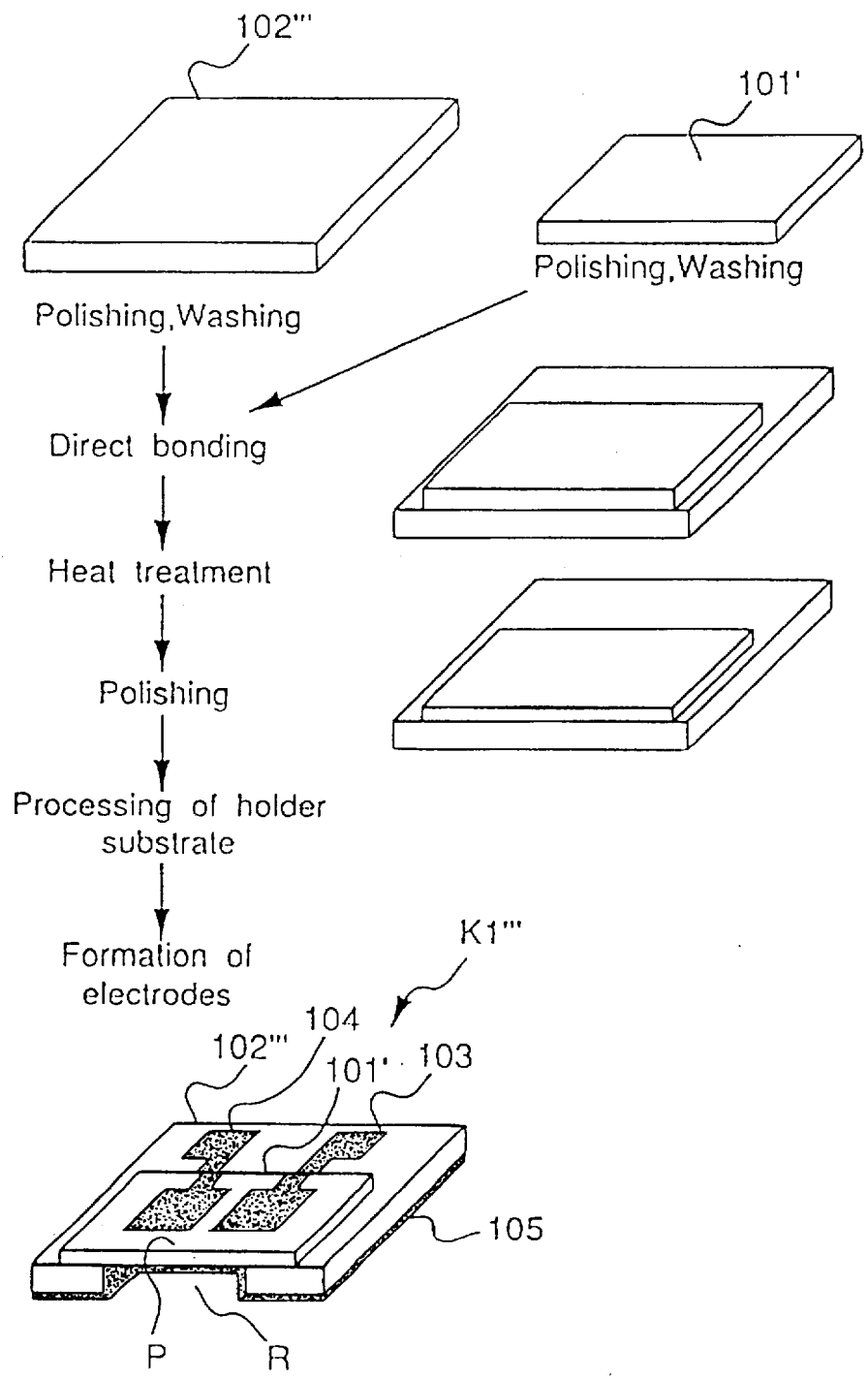

ELECTRONIC COMPONENTS HAVING HIGH-FREQUENCY ELEMENTS AND METHODS OF MANUFACTURE THEREFOR

BACKGROUND OF THE INVENTION

This application is a continuation-in-part of Ser. No. 08/131,375, filed Oct. 5, 1993, which is a continuation-in-part of Ser. Nos. 07/849,609, filed Mar. 11, 1992, and 07/942,269, filed Sep. 9, 1992; Ser. No. 08/081,805, filed Jun. 23, 1993; and Ser. No. 08/137,843, filed Oct. 15, 1993 all now abandoned.

A. FIELD OF THE INVENTION

The present invention relates generally to electronic components utilizing high-frequency elements and to methods for manufacturing such electronic components. Among the types of electronic components addressed by the present invention are: (1) an electro-acoustic hybrid integrated circuit which uses the conversion of sonic energy into electric energy or vice versa, and more particularly, a high frequency circuit such as a voltage controlled oscillator which incorporates a semiconductor device and an electro-acoustic element such as a surface acoustic wave resonator or a quartz oscillator; (2) a quartz device such as a quartz oscillator or quartz filter for use in, for example data and other communications devices; and (3) a piezoelectric filter using piezoelectric properties of an oscillatory piezoelectric plate made of quartz, lithium tantalate, lithium niobate or lithium borate, for use in, for example, mobile communications and the like.

B. DESCRIPTION OF THE RELATED ART (1) An electro-acoustic circuit such as a voltage controlled oscillator (VCO) comprises a transistor as an active element so as to cause the oscillation, an electro-acoustic element to resonate or oscillate at a desired frequency, as well as some electronics components such as capacitors and resistors. The electro-acoustic element is an element which converts sonic energy into electric energy or vice versa, such as a surface acoustic wave resonator of lithium niobate ($LiNbO_3$) or lithium tantalate ($LiTaO_3$) or lithium borate ($Li_2B_7O_4$) or a quartz oscillator.

An electro-acoustic circuit includes the following circuits. FIG. 1 shows an example of a voltage controlled oscillator which comprises a surface acoustic wave resonator (SAW) as an electro-acoustic element, a transistor (Tr), varactor diodes (D) and passive components of capacitors, inductors and resistors. FIG. 2 shows another example of a voltage controlled oscillator wherein a crystal resonator (X) as an electro-acoustic element is used instead of the surface wave resonator. FIG. 3 shows an example of a high frequency amplifier which comprises a frequency filter (F) of quartz filter or surface acoustic wave filter, a transistor (Tr) and passive components. FIG. 4 shows an example of a temperature compensated crystal oscillator (TCXO) which comprises a quartz oscillator (X), a transistor (Tr), varactor diodes (D), a thermistor (Th) and passive components. That is, these circuits include an electro-acoustic element such as a surface acoustic wave resonator, a quartz oscillator or a surface acoustic wave filter or quartz filter besides a transistor as an active component.

Previously, an electro-acoustic element was sealed in a container such as metal case in order to keep the prescribed oscillation or resonance frequency stable for a long time, as well as an electro-acoustic circuit constructed on a board by mounting various components including the electro-acoustic element thereon. However, this makes the size of the surface acoustic wave resonator or the quartz oscillator several times the size of the relevant resonance or oscillation section itself. Then for applications such as car telephones or portable telephones which are required to be compact, it is an important problem to make the size of an electro-acoustic circuit smaller.

In order to reduce the size of such an electronics circuit, it is desirable to integrate a semiconductor element including a transistor with an electro-acoustic element. For example, K. Tsubouchi et al. produces a surface acoustic wave (SAW) device by growing an aluminum nitride film as a piezoelectric substance on a silicon substrate (Zero Temperature-Coefficient SAW Devices on AlN Epitaxial Films, IEEE Transactions on Sonics and Ultrasonics, SU-32 (1985) 634–644). In order to realize a good oscillation or resonance characteristic, a film has to be grown epitaxially or aligned in a specified crystal axis direction. However, such an epitaxially grown or aligned film is realized only for some materials such as aluminum nitride or zinc oxide by a conventional thin film technique, while a material such as lithium niobate or lithium tantalate suitable for a surface acoustic wave resonator cannot be integrated.

As to a quartz oscillator, it is required to reduce the thickness with polishing or etching in order to produce a high frequency oscillator in the submicrowave band from 800 MHz to 1.9 GHz used for car telephones and for portable telephones. For example, A. Lepek et al. (A New Design for High Frequency Bulk Resonators, 43rd Annual Symposium on frequency Control (1989) pp. 544–547) reported that quartz is polished to a thickness of about 10 μm with a precise polishing technique so as to realize the oscillation at a few hundreds MHz. E. A. Gerber et al. (Advances in Microwave Acoustic Frequency Sources, IEEE Transactions on MTT 34 (1986) 1002–1016) also reported quartz resonators operating above 1 GHz.

However, it is very difficult to manufacture the quartz oscillator or the quartz resonator of a thickness less than 10 μm practically. If the thickness is decreased less than 10 μm, it is difficult to fix the quartz plate as an oscillator because the mechanical strength is very weak and the handling of the plate is difficult. Then, the productivity is poor and the cost is high. Practically, it is very difficult to substantially produce a voltage controlled oscillator at a high frequency of 500 MHz or higher by use of a fundamental oscillation mode of quartz oscillator. If a higher harmonic oscillator mode is used, the Q of the resonance decreases. Then, it is also difficult to produce an oscillator of high and stable performance.

In order to make a voltage controlled oscillator compact and to increase the oscillation frequency at the same time, Grudkowski et al. (Fundamental-mode VHF/UHF Miniature Acoustic Resonators and Filters on Silicon, Appl. Phys. Lett. 37 (1980) 993–995) prepared a ZnO film resonator above an air gap on silicon substrate so as to produce a resonator in the submicrowave band. In this case, the resonator of film thickness of a few μm can be prepared easily, and it is possible to produce a resonator in the submicrowave band. However, the temperature dependence of resonance frequency and the Q of the resonance of a ZnO film are worse than quartz oscillator. Therefore the performance of the resonator is inferior to that of a quartz oscillator.

This situation is a common problem that needed to be solved for various high frequency apparatuses such as a voltage controlled oscillator, a temperature compensation crystal oscillator and a high frequency amplifier with use of an electro-acoustic element.

(2) Quartz devices, such as quartz oscillators and quartz filters, have become an essential component in modern data communications because of their extremely high stability. With the advancement of satellite communications, cellular telephones, and other communications devices, device miniaturization combined with improved performance has become a major developmental objective. This is equally true of quartz devices.

Strict frequency stability is essential to any quartz device. Because the frequency of the quartz device varies with the stress applied to the quartz plate, various measures have been used to reduce the stress applied to the quartz plate. For example, in the case of a chip-type quartz device, the quartz plate is fixed with a conductive adhesive to a metallic holding member having a flexible construction inhibiting the application of stress with the complete assembly sealed in a housing in a vacuum or with an inert gas to maintain long-term frequency stability. However, the frequency stability of this construction as the temperature varies is poor because stress applied to the quartz plate as a result of the difference in the thermal expansion coefficients of the metallic holding member, conductive adhesive, and quartz plate cannot be avoided.

Other problems also arise from the use of a conductive adhesive. First, because the adhesive area must be minimized in order to reduce the affect of the adhesive on quartz oscillation, this construction suffers from low mechanical strength and resistance to drops and impact shock. Because of the low heat resistance of the conductive adhesive, the conditions under which the quartz device can be soldered to a circuit board are extremely limited. In addition, the gases emitted during curing of the conductive adhesive are also emitted after sealing the structure, and contribute to deterioration of long-term frequency stability.

Furthermore, the relationship between the position of the quartz plate and the quartz device housing is limited because a space must be provided for applying the adhesive, and a large gap must be provided between the quartz plate and housing to reduce the change in the oscillation frequency with the generation of thermal stress from the difference in thermal expansion coefficients. Even if the size of the quartz plate itself can be reduced, miniaturization of the complete quartz device (including the housing) is extremely difficult.

A method for holding the quartz plate by means of a quartz holding member has been proposed (Japanese patent laid-open number 1990-291710) for the purpose of alleviating the stress applied to the quartz plate by the difference in thermal expansion coefficients. In this method, the quartz vibration member is held to the substrate by a quartz holding member with the direction securing the base and the quartz holding member perpendicular to the direction securing the quartz holding member and quartz vibration member. This suppresses the frequency change resulting from stress caused by a change in the temperature applied to the quartz vibration member.

However, even this method cannot ignore the effects of the thermal expansion coefficient of the conductive adhesive securing the quartz vibration member and quartz holding member, and the frequency stability as the temperature changes is insufficient. For this method to be sufficiently effective, the adhesive area of the adhesive and the conductive adhesive must in principle also be small, resulting in problems with adhesive strength. In addition, the problems caused by gases emitted during adhesive curing described above still remain. As a result, this method cannot be considered to be a sufficient solution.

While applied quartz device products include quartz oscillators, temperature correction quartz oscillators (TCXO), and voltage control quartz oscillators (VCXO), miniaturization has also become a major developmental objective for these products. The quartz devices and control circuits driving the quartz devices used in these products are separately manufactured, assembled, and sealed in a housing. As a result, miniaturizing the complete assembly is still difficult.

It is possible to present a one chip type quartz oscillator, TCXO or VCXO, if it is possible to incorporate a quartz plate to the semiconductor substrate having an IC control circuit. However, the frequency stability of the quartz can be obtained only by preparing the quartz in special steps involving predetermined cutting angle and the crystallization of the single crystal quartz. It is not possible to present a thin plate, single crystalline quartz with a desired crystallization direction by applying the quartz according to the conventional deposition or sputtering.

Other than quartz, aluminum nitride (AlN) and zinc oxide (ZnO) are known as thin plate material having piezoelectric properties, the piezoelectric devices using thin plate made by these materials are not appropriate for the use in the communication devices due to poor quality factor Q and frequency stability, when compared with those of the quartz.

Therefore, the frequency stability—temperature characteristic of a conventional quartz device as described above is impaired because the quartz plate is attached by means of metallic members and adhesives having thermal expansion coefficients different from that of the quartz plate. Other problems with the prior art as described above include low mechanical strength and resistance to dropping and impact shock because the quartz plate is attached with adhesive, reliability problems caused by the heat of soldering, and deterioration of long-term frequency stability resulting from gases emitted from the adhesive inside the sealed housing. There are also fundamental problems relating to the miniaturization of the quartz device and applied quartz device products caused by the structure of the quartz device.

(3) In response to development of mobile communications, there is demand for compact and light elements including filters or the like. Conventionally, various filters have been used as a first intermediate frequency filter for mobile communications and mainly include a piezoelectric filter and an elastic surface wave filter. Generally, the piezoelectric filter has such a basic construction as shown in FIG. 58 and includes an oscillatory piezoelectric plate 1501, a pair of upper electrodes 1502 formed on an upper face of the piezoelectric plate 1501 and a lower electrode 1503 formed on a lower face of the piezoelectric plate 1501. The upper electrodes 1502 and the lower electrode 1503 on the single piezoelectric plate 1501 form two sets of counter electrodes. This known piezoelectric filter is a double mode monolithic piezoelectric filter based on a principle in which electric signals are converted into mechanical oscillations by one set of the counter electrodes and the mechanical oscillations are converted into the electric signals by the other set of the counter electrodes. Bandwidth obtained in such a filter depends upon piezoelectric constant of the piezoelectric plate 1501 and is about 0.2% of that at a central frequency in fundamental mode when an AT-CUT quartz plate in ordinary use is employed. In the case of higher-order mode, i.e. over-tone of n-th order, bandwidth is further narrowed to $1/(n^2)$ of 0.2%.

Meanwhile, in response to recent digitization of mobile communications, channel bands have been widened to about 300 KHz. Meanwhile, first intermediate frequency is raised to about 200 MHz by widening of the channel bands. In the known high-frequency piezoelectric filter, since overtone of higher order is employed, it is difficult to obtain a broad band. Consequently, generally, the elastic surface wave filter has been used for the broad-band first intermediate frequency filter. However, the elastic surface wave filter is neither satisfactory in both shape and weight nor is electrically sufficient due to insertion loss, etc. Meanwhile, in order to operate the electrically excellent piezoelectric filter in fundamental wave mode, the quartz plate should be made thin because the resonance frequency is inversely proportional to thickness of the quartz plate. When the AT-CUT quartz plate in ordinary use is oscillated at, for example, 100 MHz, the quartz plate should have a thickness of about 17 μm and thus, production of the quartz plate is extremely difficult. Furthermore, even if such a quartz plate is produced satisfactorily, handling for mounting the quartz plate and connection of the quartz plate to an external circuit are quite difficult due to small thickness of the quartz plate.

Therefore, for example, a method is also proposed by Japanese Patent Laid-Open Publication No. 3-235408 (1991) in which quartz of an oscillatory portion is made thin by etching so as to be capable of being used at high frequency. In this known method, only the oscillatory portion of the quartz plate having a thickness of about 70 μm is made thin to about 20 μm by etching such that high-frequency oscillation of the oscillatory portion is made possible. Since resonance frequency is controlled by etching, it will be extremely difficult due partly to etching accuracy to mass produce filters in which bandwidth is quite narrow and accuracy of central frequency is strict.

Meanwhile, in order to widen the band, electromechanical coupling coefficient of the piezoelectric substrate may be changed to a larger one. Nevertheless, since there is not much difference of velocity of sound therebetween, problem of thickness control is not solved yet.

A piezoelectric filter at high frequency is disclosed in, for example, a paper entitled "Film Bulk Acoustic wave Resonator Technology" in 1990 Ultrasonic Symposium Proceedings, page 529 and U.S. Pat. No. 4,719,383 entitled "Piezoelectric Shear Wave Resonator and Method of Making Same". In the known piezoelectric filter, a cushioning film 2102 of $SiO_2$ is formed on a substrate 2101 of silicon or gallium-arsenic as shown in FIG. 59. Furthermore, after a thin film 2103 of aluminum nitride or zinc oxide has been formed on the cushioning film 2102, electrodes 2104 and 2105 are formed. As a result, a resonator or a filter is obtained. However, in this technology, zinc oxide or aluminum nitride is used for the piezoelectric member. This piezoelectric member can be advantageously formed by sputtering, i.e. thin film forming technology. However, since the piezoelectric member is made of polycrystalline material, crystals should be aligned in C-axis in order to obtain piezoelectric property. Undesirably, this alignment largely depends upon thin film forming conditions or devices and changes according to thickness of the film deposited on the substrate or material of the ground. On the other hand, quartz, lithium niobate, lithium tantalate, lithium borate or the like in polycrystalline form does not exhibit sufficient piezoelectric property. Especially, quartz is widely used for an oscillator, a filter or the like due to its high stability and excellent temperature characteristics but only α-quartz which is monocrystalline and has a crystalline structure symmetric with respect to a threefold axis exhibits piezoelectric property.

Meanwhile, a similar technology is disclosed in U.S. Pat. No. 5,036,241 entitled "Piezoelectric Laminate and Method of Manufacture". In the known technology, substance having piezoelectric property is bonded to an insulating member by using an adhesive layer and resistivity of the insulating member is controlled by using temperature or light such that polarization is caused by applying voltage to the insulating member. According to this known method, since accuracy of the piezoelectric member in a direction of its thickness determines accuracy of resonance frequency in a device employing resonance in the direction of thickness of the piezoelectric member, thickness of the adhesive layer is required to be controlled accurately. However, in the case where the AT-CUT quartz substrate acts as the piezoelectric member and its central frequency is set to 100 MHz, the substrate has a thickness of 17 μm. In view of production cost of the piezoelectric filter from mass production efficiency and operation for adjustments, the piezoelectric member should have an accuracy of not more than 1 μm. Since error of thickness of the adhesive layer directly determines accuracy of frequency, it is considered impossible to attain such an accuracy of the piezoelectric member in this method and the arrangement.

SUMMARY OF THE INVENTION (1) One object of the present invention to provide an electro-acoustic hybrid integrated circuit suitable for various high frequency apparatuses such as a voltage controlled oscillator of smaller size, of light weight and of better performance.

Another object of the present invention to provide a manufacturing method of such an electro-acoustic hybrid integrated circuit.

In an electro-acoustic hybrid integrated circuit according to the present invention, an active element such as a transistor is formed on the surface of a semiconductor substrate, while an electro-acoustic element is formed with an single crystalline piezoelectric substrate. The single crystalline piezoelectric substrate is bonded through direct bonding to the semiconductor substrate. The electro-acoustic element and the active element as well as passive components are connected so as to form an electro-acoustic circuit.

The word "direct bonding" is used because no other materials, such as organic adhesives, are used to bond two surfaces of two inorganic plates. The direct bonding can be formed between two hydrophilic surfaces of inorganic material.

When the electro-acoustic hybrid integrated circuit is manufactured, pretreatment processes necessary for forming an active element are performed first on the semiconductor substrate at processing temperatures higher than the heat treatment temperature for direct bonding. Then, a thin film including a silicon is formed on at least either the semiconductor substrate and the single crystalline piezoelectric element, and the semiconductor substrate directly with the electro-acoustic element. Next, post treatment processes for forming the active element and for the metallization are performed at a processing temperature lower than the heat treatment temperature for direct bonding and processes for forming an electro-acoustic element on the single crystalline piezoelectric element. Thus, an active element and the electro-acoustic element are integrated as a hybrid integrated circuit.

One advantage of the present invention is that an electro-acoustic circuit can be produced compactly.

Another advantage of the present invention is that the oscillation above 1 GHz can be performed.

(2) Another object of the present invention is to improve the quartz device characteristics, particularly the frequency stability—temperature characteristic, mechanical strength characteristic, reliability after heating, and long-term frequency stability, and to simplify the miniaturization of the quartz device and applied quartz device products.

To achieve this object, a quartz device according to the present invention is characterized by a structure wherein the quartz plate is attached by direct bonding to the holding member, or the quartz plate is attached by direct bonding to the holding member and the holding member is attached by direct bonding to the housing substrate.

In both of the above cases, the holding member directly connected to the quartz plate is made of a material having a thermal expansion coefficient equal to or nearly equal to that of the quartz plate.

When the quartz plate is attached by the holding member to the housing substrate, the holding member structure is characterized by inhibiting the transmission of stress from the housing substrate to the quartz plate.

In the manufacturing method for this quartz device, the surfaces of the quartz plate and holding member, or the quartz plate, holding member, and housing substrate, are hydrophilically treated, the surfaces placed in contact, and heat treatment is applied to induce direct bonding between the surfaces.

Alternatively, the surfaces of the quartz plate and holding member, or the quartz plate, holding member, and housing substrate, are washed, the surfaces placed in contact, and a voltage is applied to the interfaces for anodic bonding forming a direct bond between the surfaces.

With a quartz device thus constructed, there is virtually no stress caused by temperature acting on the quartz plate and holding member because the holding member directly connected to the quartz plate is of a material having a thermal expansion coefficient equal to or nearly equal to that of the quartz plate. When the holding member is attached to the housing substrate, the stress acting on the quartz plate is minimal, the change in the frequency due to stress caused by temperature changes can be minimized, and frequency stability can be improved because virtually all stress due to temperature change is concentrated on the holding member.

Because the quartz plate is attached by direct bonding without using adhesive, the adhesion strength is strong, and mechanical strength and resistance to dropping and impact shock is improved. The heat stability characteristic and reliability after heating are also improved. Long-term frequency stability is also improved because there are no gas emissions from an adhesive.

Miniaturization of the quartz plate, holding member, or housing substrate is also simplified by applying semiconductor processing technologies enabling extremely precise dimensional processing.

An airtight seal is formed around the quartz plate to improve long-term frequency stability. When the quartz plate is effectively sealed airtight by a holding member of a material with the same thermal expansion coefficient, the change in the oscillation frequency resulting from stress induced by a temperature change applied from the housing to the quartz plate can be significantly reduced, and frequency stability can be improved, compared with a construction in which the quartz plate is sealed by a housing of a material with a different thermal expansion coefficient.

(3) A further essential object of the present invention is to provide a piezoelectric filter which can be used also in a superhigh frequency band and can be mass produced.

In order to accomplish this object of the present invention, a method of producing a piezoelectric substrate, according to the present invention comprises the steps of directly bonding a piezoelectric substrate to a substrate for holding the piezoelectric substrate, the piezoelectric substrate acting as an oscillator and being made of one of quartz, lithium tantalate, lithium niobate and lithium borate, while the substrate is made of one of quartz, lithium tantalate, lithium niobate and lithium borate, and mechanically polishing the piezoelectric substrate and the substrate so as to adjust a thickness of the piezoelectric substrate and the substrate. Since the piezoelectric substrate and the substrate are directly bonded to each other, the piezoelectric filter has remarkably high geometric precision by sufficiently controlling the thickness of the piezoelectric substrate and the substrate and flatness of the piezoelectric substrate and the substrate.

Meanwhile, it is possible to formulate the piezoelectric filter by using a piezoelectric substrate which cannot be formed as a thin film.

Furthermore, by mechanically polishing the piezoelectric substrate bonded to the substrate so as to adjust thickness of the piezoelectric substrate, it becomes possible to adjust frequency of the piezoelectric filter. Therefore, adjustments of central frequency of the piezoelectric filter can be adjusted easily and the piezoelectric filter can be mass produced.

BRIEF DESCRIPTION OF THE DRAWINGS

These and other objects and features of the present invention will become clear from the following description taken in conjunction with the preferred embodiments thereof with reference to the accompanying drawings, and in which:

FIG. 12 illustrates the manufacture flow chart of Example 12 of the present invention;

FIG. 27 is a flowchart of the manufacturing method of an electro-acoustic hybrid integrated circuit of Example 33 of the present invention;

FIG. 28 illustrates the manufacture flow chart of Example 34 of the present invention;

FIG. 30a is a perspective view of a quartz device according to Example 36 of the invention;

FIGS. 36a to 36f are cross-sectional views showing the steps for manufacturing the quartz device according to Example 38 of the invention;

FIG. 48 is a view showing production steps of the piezoelectric filter of FIG. 46;

Before the description of the present invention proceeds, it is to be noted that like parts are designated by like reference numerals throughout several views of the accompanying drawings.

DESCRIPTION OF THE PREFERRED EMBODIMENTS (1) The electro-acoustic integrated circuits of the present invention, especially when applied to an oscillator and a high frequency amplifier, and methods for manufacturing such electro-acoustic integrated circuits will be described by way of example with reference to the attached drawings as follows:

EXAMPLE 1

Figure 6:
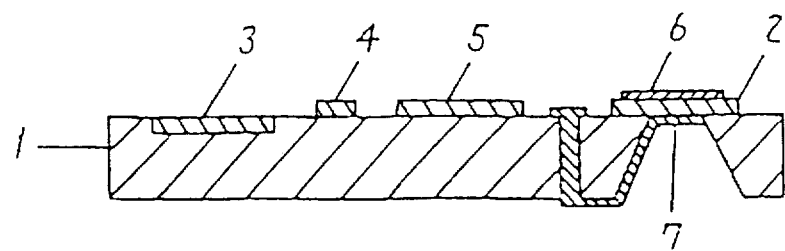
FIG. 6 is a sectional view of the structure of Example 1 of the present invention.

A voltage controlled oscillator according to a first example of this invention is cross-sectionally shown in FIG. 6. In FIG. 6, the reference number 1 indicates a semiconductor substrate made, for example, of silicon, 2 indicates a quartz crystal resonator bonded through direct bonding onto the semiconductor substrate 1, 3 indicates a field effect transistor (FET) formed on the semiconductor substrate 1, 4 indicates a variable capacitance diode chip, 5 indicates a passive chip component part such as a capacitor, an inductor, a resistor and the like, 6 indicates an upper electrode of the quartz crystal resonator 2, and 7 indicates a lower electrode of the quartz crystal resonator 2. The electrical connection of the lower electrode of the resonator and the wiring formed on the semiconductor substrate is made through such a via-hole method that a hole is perforated through the substrate and filled with an electroconductive material thereby electrically connecting the lower electrode to the wiring on the substrate. The component parts formed on the semiconductor substrate and the upper and lower electrodes of the quartz crystal resonator are respectively electrically connected so as to make a voltage controlled oscillator. Such a voltage controlled oscillator as is integrated in a unitary body as shown above is sealingly contained in a container for keeping its environment resistant performance stable. The field effect transistor, the various electrical component parts and the quartz crystal resonator constitute an oscillator. By varying the voltage to be applied to the variable capacitance diode, the capacitance thereof can be varied, and the oscillation frequency can be varied. By structuring as shown above, the oscillation circuit section and the quartz crystal resonator can be integrated into a unitary body, so that it is possible to make the size outstandingly small as compared with conventional ones. In addition, as compared with conventional ones having a quartz crystal resonator sealing contained into a container individually provided, the apparatus of the invention can be reduced to about one-tenth on a volume basis and to about one-fifth on a weight basis.

The word "direct bonding" is used because no other materials, such as organic adhesives, are used to bond two surfaces of two inorganic plates. The direct bonding can be formed between two hydrophilic surfaces of inorganic materials.

The mechanism of the direct bonding is considered as follows. Hydrophilic surfaces of inorganic materials have surface hydroxyl groups. The number of the surface hydroxyl groups depend on the materials and the surface treatment. In order to introduce a sufficient number of hydroxyl groups to surfaces, a hydrophilic treatment is effective.

The surface hydroxyl groups and chemically adsorbed water molecules thereon form hydrogen bonds between the two surfaces. Subsequent heat treatment cause a desorption of the chemically adsorbed water molecules and condensation reaction of the hydrogen bonded hydroxyl groups which results, in covalent bonds. As a result of the formation of the covalent bonds, the strength of the direct bonding between the two surfaces is improved.

Figure 5A:
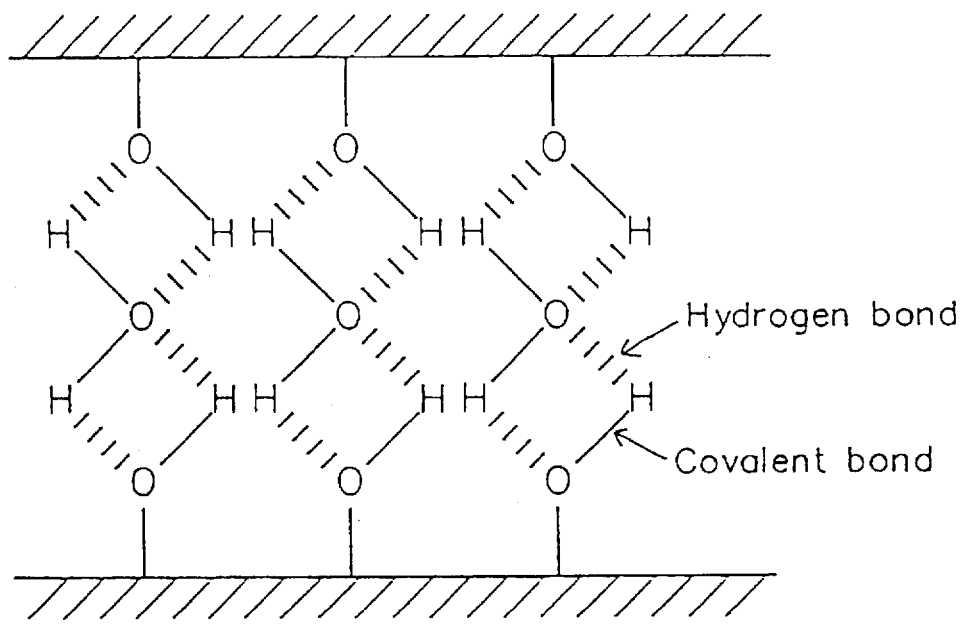
FIGS. 5A to 5C illustrate the mechanism of the formation of the direct bonding.
Figure 5B:
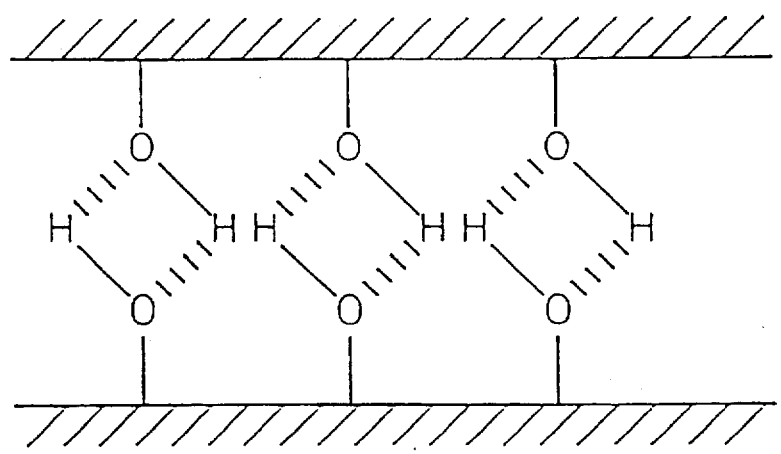
Figure 5C:
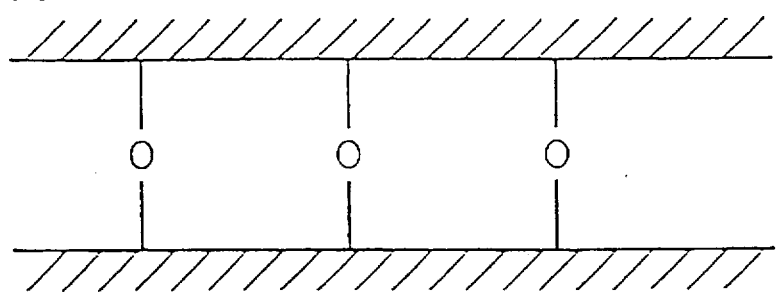

FIGS. 5A to 5C illustrate the mechanism of the formation of the direct bonding schematically. FIG. 5A illustrates the direct bonding immediately after it is formed. When two inorganic plates are superposed with their hydrophilic surfaces facing each other. The surface hydroxyl groups of the two surfaces form hydrogen bonds. Chemically adsorbed water molecules may bridge the hydroxyl groups through hydrogen bonds. Through the hydrogen bonds the two surfaces are bonded together.

FIG. 5B illustrates the direct bonding after a heat treatment at a relatively low temperature, for example 100°–500° C. The heat treatment causes desorption of the adsorbed water molecules. Therefore, the surface hydroxyl groups of one surface form hydrogen bonds directly with those of another surface.

FIG. 5C illustrates the direct bonding after a heat treatment at a relatively high temperature, for example above 700° C. The heat treatment causes desorption of the adsorbed water molecules and condensation reactions between the hydrogen bonded hydroxyl groups. Then, the hydrogen bonds result in covalent bonds, which have higher strength than the hydrogen bonds.

The strength of the direct bonding between two surfaces depend on the density of the surface hydroxyl groups and the value of the dipole moment of the hydroxyl groups. Therefore, the strength of the direct bonding highly depend on surface treatments and materials. Moreover, the temperature at which the condensation reactions of the hydroxy groups take place also depends on the materials.

According to the present invention, hydrophilic treatments may introduce sufficient numbers of surface hydroxyl groups on the surface of a semiconductor substrate and a piezoelectric substrates so as to form direct bonding. As for the surfaces of silicon or quartz, they may have a sufficient number of surface hydroxyl groups such as surface silanols, without a hydrophilic treatment. Because of the nature of the surface of silicon or quartz, deposition of silicon containing compounds on a semiconductor or a piezoelectic substrate improves the strength of the direct bonding. Moreover, the direct bonding of the quartz and silicon is considered to be caused also by a mechanism similar to the direct bonding mechanism, that is, silicon-to-slicon direct bonding, which was revealed by M. Shimbo and others in their report titled as "Silicon Direct Bonding Method", Journal of Applied Physics, Vol. 60 (1986), pp. 2987 to 2989. In other words, the bonding is considered to be taken place at such an atomic level that by the heat treatment, oxygen and silicon atoms on the surface of the quartz crystal, which is a single crystal silicon oxide, are bonded mutually with silicon atoms on the surface of the silicon substrate.

Furthermore, the structure of a surface is very complicated and is not very well known. Therefore, there should be mechanisms other than those mentioned above for the formation of the direct bonding.

If the bonding is made with a bonding material to be used as a general resin or the like, there may arise a problem that various fine processings such as the formation of electrodes and the like to be carried out thereafter cannot be performed.

In this case, however, the method according to this invention is used, the semiconductor substrate and the quartz crystal (single crystal of silicon oxide), particularly when silicon is used as the semiconductor substrate, are bonded to each other through direct bonding. As a result, such a problem does not arise in case that the bonding is made between inorganic substrate and an organic resin, because this invention uses direct bonding between inorganic materials. In case of using a resin binder, there exists a large difference between the thermal expansion coefficient of a resin, which is an organic material, end that of a semiconductor substrate, which is an inorganic material, so that there may arise problems on reliability of oscillator over a long period of time due to thermal stress and thermal stability of the resin itself to be used. On the other hand, this invention bonds it directly onto the semiconductor substrate, so that such problems could be overcome.

EXAMPLE 2

Figure 7:
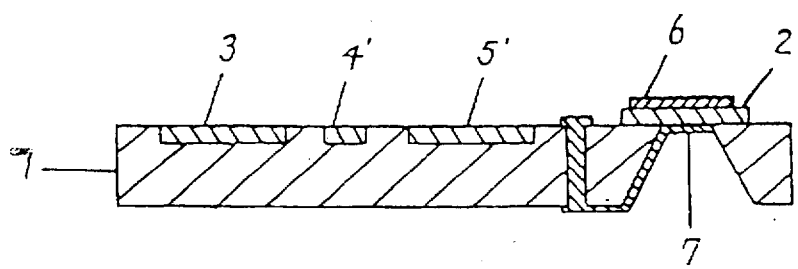
FIG. 7 is a sectional view of the structure of Example 2 of the present invention.

FIG. 7 is a schematically cross-sectional view of a voltage controlled oscillator according to a second example of this invention. In FIG. 7, 1 is a semiconductor substrate made, or example, of silicon, 2 is a quartz crystal resonator bonded through direct bonding onto the semiconductor substrate 1, 3 is a field effect transistor (FET) formed on the semiconductor substrate, 4' is a variable capacitance diode whose capacitance can be varied by varying voltage, 5' is a passive chip component part such as a capacitor, an inductor, a resistor and the like, 6 is an upper electrode of the quartz crystal resonator 2, and 7 is a lower electrode of the quartz crystal resonator 2. The upper and lower electrodes of the quartz crystal resonator and the component parts formed on the semiconductor substrate are respectively electrically connected so as to make a voltage controlled oscillator. The voltage controlled oscillator thus integrated in a unitary body is sealingly contained into a container. This example is different from the first example in that the variable capacitance diode 4' and the passive chip component part 5' are embeddedly formed into the semiconductor substrate to make a unitary body. The variable capacitance diode is easy to be formed integratedly with the semiconductor substrate when the substrate is made of silicon. In addition, referring to the passive chip component part 5', the resistor can be easily obtained as a semiconductor resistor, a thin film resistor of tantalum nitride or the like formed by a diffusion method, the capacitor could be easily formed as a silicon oxide thin film, and the inductor could be easily obtained by forming the wiring pattern in a spiral form. As a result, the oscillator of this example can be more easily compactized than that of the first example, and there does not need to take a time for packaging chip component parts, resulting in an ease in mass-production.

EXAMPLE 3

Figure 8:
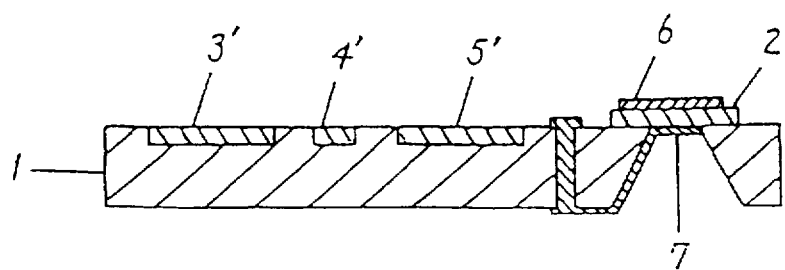
FIG. 8 is a sectional view of the structure of Example 3 of the present invention.

FIG. 8 schematically cross-sectionally shows a voltage controlled oscillator according to a third example of this invention, in which 1 is a semiconductor substrate, 2 is a quartz crystal resonator bonded through direct bonding onto the semiconductor substrate 1, 3' is a bipolar transistor formed on the semiconductor substrate 1, 4' is a variable capacitance diode chip whose capacitance can be varied by voltage, 5' is passive chip component part such as a capacitor, an inductor, a resistor and the like, 6 is an upper electrode of the quartz crystal resonator, and 7 is a lower electrode of the quartz crystal resonator. The oscillator of this example is different from those of the first and second examples in that the active element is the bipolar transistor 3' formed on the semiconductor substrate.

The upper and lower electrodes of the quartz crystal resonator thus formed are electrically connected as to make a voltage controlled oscillator. In addition, the voltage controlled oscillator thus integrated in a unitary body was sealingly contained into a container. With the oscillator thus obtained, the same effects as those in the first and second example can be obtained. Example 3 is different from Example 2 only using a field effect transistor 3 instead of a bipolar transistor 3' in Example 2.

EXAMPLE 4

A production method of a voltage controlled oscillator according one example of this invention will be described below as a fourth example.

First, a silicon semiconductor substrate is subjected to fine processes including a semiconductor process, which are to be carrier out at a temperature of 570° C. or more, at predetermined positions. For example, a FET and a variable capacitance diode were formed at their predetermined positions by a diffusion processing method or the like, which is carried out at a temperature as high as 1000° C. or more in general. Next, a quartz crystal resonator is superposingly placed on the semiconductor substrate thus processed and heated at 560° C. or less, thereby bonding the quartz to the silicon. In order to etch the substrate only in a part of area beneath the quartz crystal resonator leaving an area necessary for holding the resonator, the remaining area is covered by applying a photoresist or the like and then, subjected to an etching process, thus removing only the silicon in the part of the area beneath the resonator except the area necessary for holding the resonator. Next, the semiconductor processes including the formation of electrodes are carried out, then or thereafter, an electrode is formed on each of the both surfaces of the quartz crystal resonator by a vacuum deposition method or the like, and wiring is patterned by a generally used photolithographic method. Referring to the heating temperature, for example, at a temperature of 500° C., the bonding is made possible by holding it for about ten minutes at that temperature. If it exceeds 560° C., the crystal structure of quartz is changed, and the performance of a quartz crystal resonator cannot be obtained as predetermined. As a result, the heating temperature or bonding is required to be 560° C. or less. Even at a comparatively low temperature, the direct bonding is made possible, for example, even at a temperature as low as 300° C., when held for about one hour at that temperature, the bonding strength at a sufficient level is obtained. As a result, as the heat treatment temperature for the direct bonding, it is preferable for the heat to range from 300° C. to 500° C.

EXAMPLE 5

Another production method of a voltage controlled oscillator according to one example of this invention will be described below as a fifth example.

As in the fourth example, first, a silicon semiconductor substrate is subjected to such semiconductor processes as to be carried out at a temperature of 570° C. or more at the predetermined positions. For example, a FET and a variable capacitance diode are formed at their predetermined positions by a diffusion processing method or the like. Then, a quartz crystal resonator is superposingly placed on the silicon semiconductor substrate thus processed and heated thereby bonding the quartz of the resonator and the silicon of the substrate through direct bonding. Thereafter, the quartz crystal resonator thus bonded is thinned by a polishing or etching method. By applying this method, a quartz crystal resonator having an initial thickness of about 200 μm is easily thinned to a thickness of 5 μm or less. By further applying a fine etching method thereto, it can be further thinned, thus even a thickness as small as 1 μm can be realized. In case of using quartz crystal AT cut, if it is about 1 μm thick, a fundamental wave oscillation is made possible at a frequency level of about 1 to 2 GHz. Next, by applying the same processes as in the fourth example, it is made possible to produce a voltage controlled oscillator having the semiconductor substrate and the quartz crystal resonator integrated in a unitary body with each other. With the voltage controlled oscillator thus produced, the fundamental wave mode is made possible at such a high frequency level of 2 GHz as not to be obtainable conventionally.

EXAMPLE 6

Yet another production method of a voltage controlled oscillator according to one example of this invention will be described below as a sixth example.

As in the fourth example, first, a silicon semiconductor substrate is subjected to such semiconductor processes as to be carried out at a temperature of 570° C. or more at the predetermined position. Next, the silicon and a quartz crystal resonator are directly bonded to each other under the application of a heat and pressure. The quartz crystal resonator can be bonded thereto by the gravitational effect of its own weight, however, the bonding strength could be improved by applying a pressure at a level of 100 g/cm$^2$ to 10 kg/cm$^2$ by a method where a sufficient weight is placed at the area to be bonded to each other. Next, as in the fifth example, the quartz crystal resonator is thinned by a polishing or etching method as desired. Then, by applying the same processes as in the fourth embodiment, it is made possible to produce a voltage controlled oscillator having the semiconductor substrate and the quartz crystal resonator integrated in a unitary body with each other as well as to obtain the same effects as obtained in the fourth example.

EXAMPLE 7

Another production method of a voltage controlled oscillator according one example of this invention will be described below as a seventh example.

As in the fourth example, first, a silicon semiconductor substrate is subjected to semiconductor processes at the predetermined positions. Next, the surface of the silicon substrate and the surface of a quartz crystal resonator are thoroughly cleaned. That is, each of them is repeatedly boiled with an organic solvent in order to remove any contaminants on the surface. Next, the silicon substrate is subjected to a hydrophilic treatment with a solution of ammonia and hydrogen-peroxide. The quartz crystal resonator is subjected to removal of the surface layer with an etching solution of the hydrofluoric acid system. Then, both the surfaces are rinsed with pure water and superposed uniformly as soon as possible after rinsing, thus both are capable of direct bonding to each other easily. Next, the quartz crystal resonator is thinned by applying a polishing or etching method as desired in the same way as in the fifth example. Thereafter, by being subjected to the same processes as in the fifth example, a voltage controlled oscillator having the semiconductor and the quartz crystal resonator integrated in a unitary body with each other is made possible to be produced, thus being obtainable the same effects as those in the fourth and fifth examples. The production method shown in this example allows the bonding to be carried out at room temperature. As a result, it can be carried out after all processes have been performed. In this case, it is considered that the silicon substrate and the quartz crystal resonator are bonded to each other through hydrogen bonds between the hydroxyl groups of the silicon surface and the quartz surface, which means that the surface treatment of the substrate is extremely important. In addition, by further heat-treating the specimen thus bonded at a temperature of 560° C. or less, the bonding strength can be further improved.

EXAMPLE 8

Figure 9A:
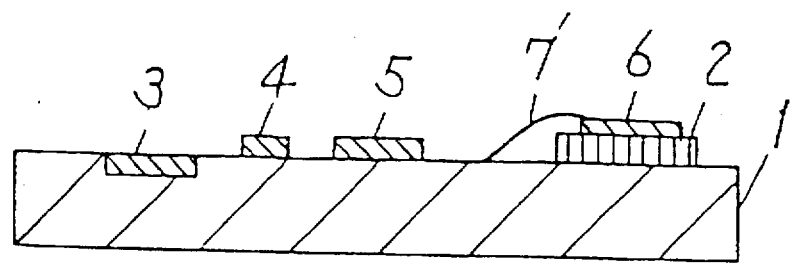
FIG. 9A is a sectional view of the structure of Example 8 of the present invention.
Figure 9B:
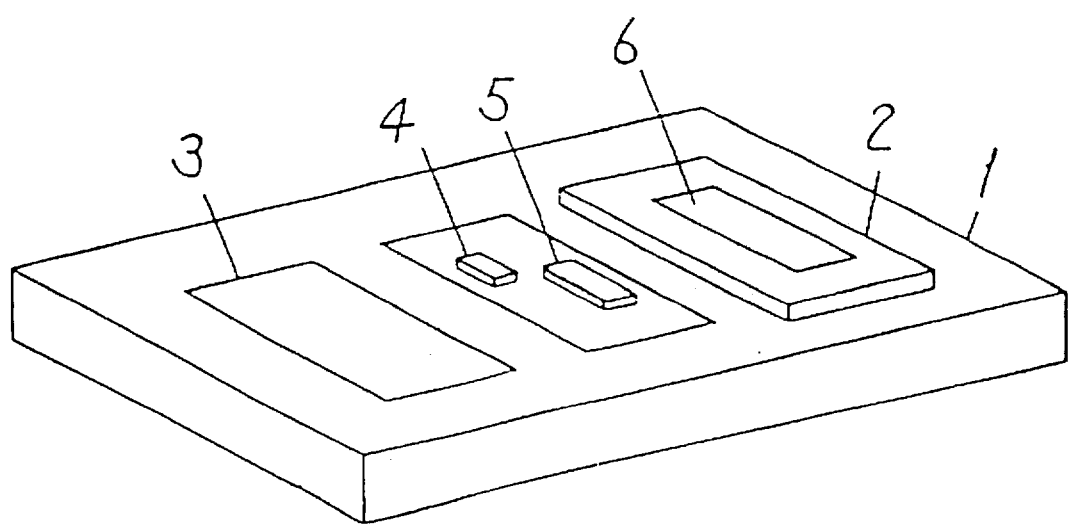
FIG. 9B is a perspective view of the structure of Example 8 of the present invention.

FIGS. 9A and 9B are a side view and a perspective view, respectively, of an oscillator as an eighth example of the present invention. Referring to FIGS. 9A and 9B, the reference numeral 1 denotes a substrate made of GaAs, a III-V group compound semiconductor. The reference numeral 2 denotes a single crystalline piezoelectric substrate or a quartz crystal substrate which constitutes a surface acoustic wave resonator. The quartz crystal substrate 2 is bonded through direct bonding to the GaAs substrate 1. The reference numeral 3 denotes a transistor formed on the GaAs substrate 1. Varactor diodes 4 having an electrostatic capacitance varying with the applied voltage, and passive chip components 5 such as capacitors, inductors, and resistors are mounted on the GaAs substrate 1. Comb-type electrodes 6 are provided on the quartz crystal substrate 2 to form the surface acoustic wave resonator, and wires 7' connect the electrodes 6 with interconnections formed on the GaAs substrate 1.

FIGS. 9A and 9B schematically illustrate a typical arrangement of the above-described components. In an actual implementation, the arrangement of the components and the connection of electrodes are properly determined so that a voltage controlled oscillator having a circuit configuration shown in FIG. 1 can be obtained.

The varactor diode 4 and the passive chip components 5 such as capacitors and resistors may be incorporated in the GaAs substrate 1. Also, a metal thin film may be formed on the GaAs substrate 1 as wirings instead of the wires 7'.

By varying the voltage applied to the varactor diodes 4, the electrostatic capacitance of the varactor diodes 4 and thus the oscillation frequency can be varied.

The GaAs substrate 1 and the quartz crystal substrate 2 are bonded without any organic bonding agent therebetween. Such an integrated structure is then sealed in a container. The thus-obtained voltage controlled oscillator can be made significantly smaller than the conventional one in which the substrates are integrated after having been sealed separately. In practice, it is easy to reduce the volume of the oscillator to about a tenth and the weight thereof to about a fifth of the conventional oscillator in which the surface acoustic wave resonator is first sealed in a container before being integrated.

The direct bonding has other advantages. If semiconductor substrate and the single crystalline piezoelectric substrate are bonded to each other with an ordinary bonding agent made of resin or the like, the subsequent semiconductor process after the bonding is not possible because such a bonding agent is not durable against high temperature and chemicals. However, according to this example where the GaAs substrate 1 and the quartz crystal substrate 2 are directly bonded, such a problem can be greatly alleviated.

Further, if a bonding agent made of resin or the like is used, the parallelization of the GaAs substrate and the quartz crystal substrate attached thereto is not satisfactory. This results in lowering the accuracy of the size of the comb-type electrodes 6 to be formed on the quartz crystal substrate in a later photolithographic process. For example, in order to obtain a resonance frequency in the order of 1 GHz, the electrodes 6 should have a width of a micron or less. Under this condition, if a satisfactory parallelization is not obtained, a surface acoustic wave resonator for a submicrowave band cannot be formed. According to this example, however, since the GaAs substrate 1 and the quartz crystal substrate 2 are directly bonded, the parallelization thereof is determined only by the accuracy of the surface finish of the substrates which can be sufficiently enhanced. Thus, the above-described problem can be prevented. This is especially effective when a high resonance frequency is required.

Other problems arising when a bonding agent made of resin is used include inferior heat resistance and inferior long-term reliability. The latter is due to the thermal strain caused because the thermal expansion coefficient of the organic resin greatly differs from that of the GaAs substrate and the quartz crystal substrate both of which are inorganic. These problems can also be prevented according to this example.

Figure 1:
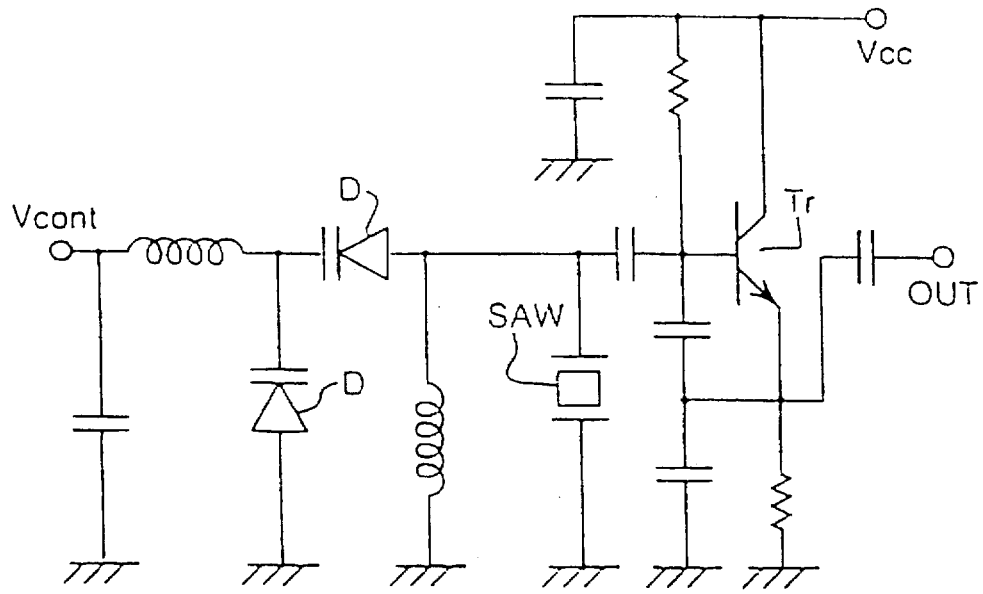
FIG. 1 is a circuit diagram of a voltage controlled oscillator with use of surface wave resonator.

Though the oscillator having the circuit configuration shown in FIG. 1 is described in this example, it is needless to say that oscillators having other circuit configurations can also be integrated as described above.

Since the electron mobility of the GaAs substrate is about six times as high as that of an Si substrate, a high frequency transistor can be easily fabricated on the GaAs substrate. Accordingly, the GaAs substrate is especially suitable for the manufacture of a high frequency circuit having, especially, a frequency of 1 GHz or more.

Though the surface acoustic wave resonator is formed as the electro-acoustic element in this example, a bulk acoustic wave element can also be formed.

Quartz as the electro-acoustic element has an electromechanical coupling coefficient (the coefficient corresponding to the rate of the conversion of the electric energy to the mechanical energy) of 0.2%, the smallest among those of lithium niobate, lithium tantalate, and lithium borate. However, quartz has a crystal orientation where the dependence of the resonance frequency upon the temperature is zero (i.e., the resonance frequency does not vary at all in the range of temperatures actually used). Such a crystal orientation can be found, for example, in a crystal cut called an AT cut. Moreover, quartz can obtain the highest value of Q (the value corresponding to the inverse of an energy loss at resonance). in practice, it is easy to obtain a value Q of 20000 or more. With these properties, quartz can be used for a temperature compensated oscillator which is temperature-independent, a high frequency device which requires a filter having an extremely narrow specific bandwidth (the ratio of the center frequency in the pass band to the pass frequency band) of 0.1% or less, and an oscillator with high accuracy and high stability. According to this example, since the quartz crystal substrate having a desired crystal orientation can be directly bonded to the GaAs substrate, the resultant electro-acoustic element is significantly superior to a piezoelectric thin film formed by a conventional thin-film technique.

EXAMPLE 9

Figure 3:
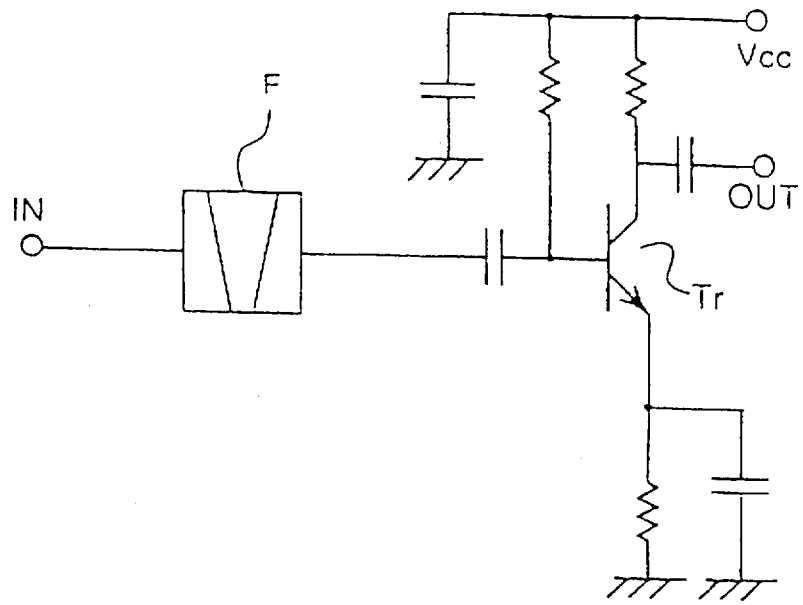
FIG. 3 is a circuit diagram of a high frequency amplifier.

FIG. 3 is a circuit diagram of a high frequency amplifier as a ninth example of the present invention, in which a filter and an amplifying circuit including a transistor and capacitors are directly connected. Such a high frequency amplifier can be obtained as in Example 8: That is, the electronic elements are formed on a GaAs substrate, while the filter, a surface acoustic wave filter, is formed on a quartz crystal substrate. These components are then connected by wirings so as to obtain the circuit configuration shown in FIG. 3. In this way, the electro-acoustic integrated circuit in which the filter and the amplifying circuit are integrated can be manufactured. Since the GaAs substrate and the quartz crystal substrate are bonded through direct bonding to each other as in Example 8, the same effects as those described in Example 8 can be obtained.

EXAMPLE 10

Figure 10:
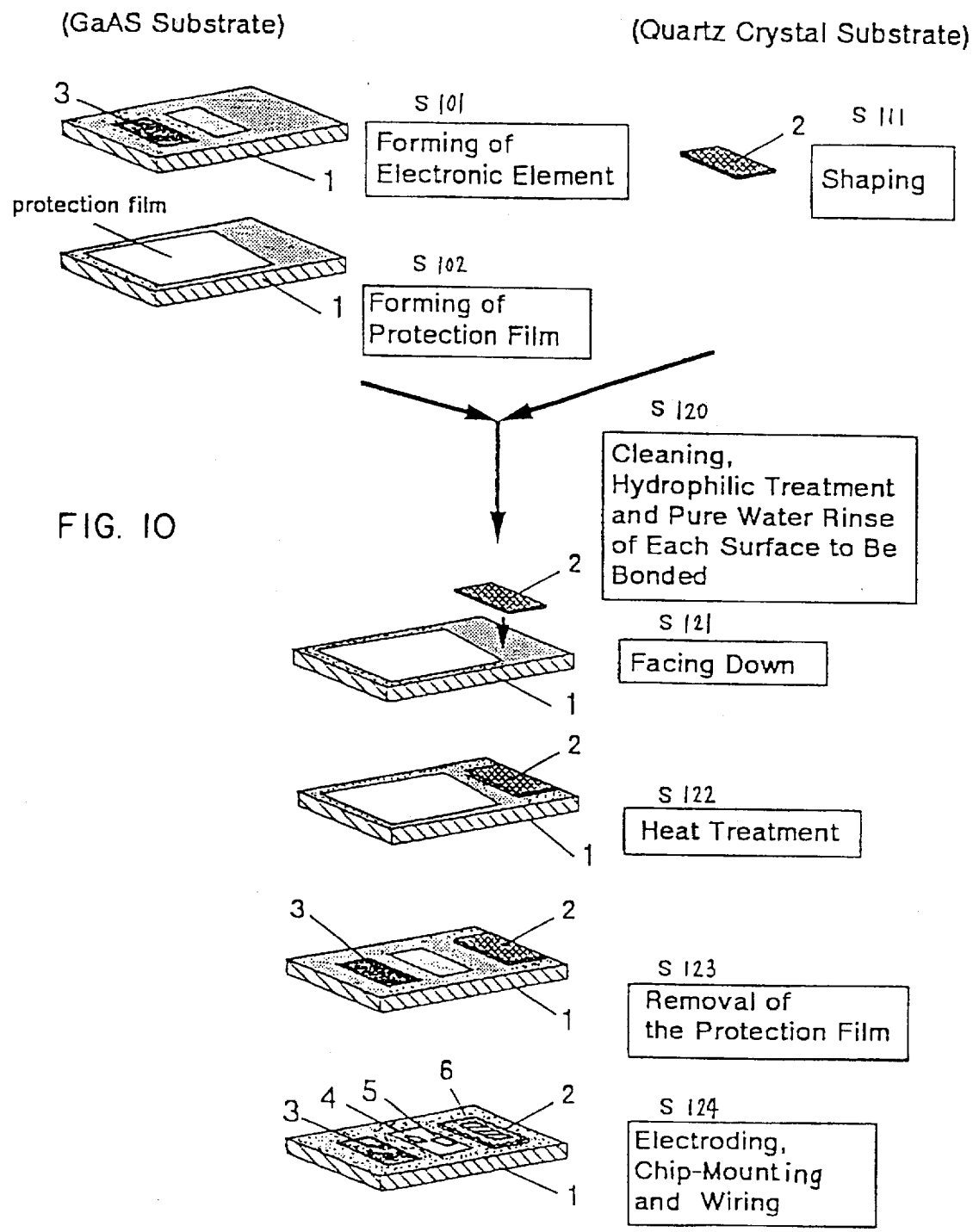
FIG. 10 illustrates the manufacture flow chart of Example 10 of the present invention.

A method for manufacturing the oscillator of Example 8 as a tenth example of the present invention will be described with reference to the manufacture flow chart of FIG. 10 as follows:

First, one or more concaves are formed on prescribed areas of the GaAs substrate 1 by etching or the like. Then, a series of semiconductor processes are carried out so that electronic elements such as the transistor 3 and the varactor diodes 4 are formed inside the concaves. The semiconductor processes include processes carried out at a temperature higher than that for the heat treatment required for subsequent direct bonding, such as a diffusion process. The diffusion process is normally performed at 1000° C. or more. The areas of the GaAs substrate 1 in which the electronic elements are formed are then covered with a protection film.

Then, the surface of a portion of the GaAs substrate 1 and a surface of the quartz crystal substrate 2 which are to be bonded to each other are sufficiently cleaned. In practice, these surfaces are cleaned with a solvent so as to remove organic substances therefrom, and slightly etched with a hydrofluoric acid. Thereafter, these surfaces are made hydrophilic by the treatment with a solution of ammonia-hydrogen peroxide at 60°–70° C. The treated surfaces are then sufficiently rinsed with pure water, and uniformly attached to each other. In this way, the two substrates can be easily bonded.

The bonded substrates are then subjected to the heat treatment to enhance the bonding strength. The bonding strength can be enhanced when the heat treatment is performed at 100°–800° C. For example, the bonding strength increases several times by maintaining the temperature of 200° C. for one hour. As a result, the strength of several tens of kilograms per $cm^2$ can be obtained. With the temperature increase, As tends to evaporate from the GaAs substrate. Such evaporation of As should is preferably minimized by covering GaAs substrate with a GaAs wafer or any other means.

In principle, as the temperature for the heat treatment is higher, the quartz crystal substrate should be thinner in thickness and smaller in size, so that the bonding strength can be improved without causing troubles of pealing off and breakage, though the shape and size of the quartz crystal substrate may be a little restricted because the thermal expansion of the GaAs substrate is different from that of the quartz crystal substrate.

Next, a series of processes including the electrode formation process are carried out at a temperature lower than that for the heat treatment required for the direct bonding. During or after these processes, electrodes are formed on the exposed surface of the quartz crystal substrate by vacuum vapor deposition or the like, and then wiring patterns are formed by a normal photolithographic method. Aluminum or gold is used for the electrodes.

The above manufacturing method for the oscillator is also applicable to the manufacture of a high frequency amplifier in which a filter is used as the electro-acoustic element and the circuit configuration is a little different from that of the oscillator.

Though the above manufacturing method is for a circuit using a surface acoustic wave resonator or filter as the electro-acoustic element, the method is also applicable to a circuit using a bulk acoustic wave element as the electro-acoustic element. In this case, a portion of the semiconductor substrate beneath the bulk acoustic wave element is hollowed out by etching or the like after the heat treatment for bonding.

EXAMPLE 11

Figure 11A:
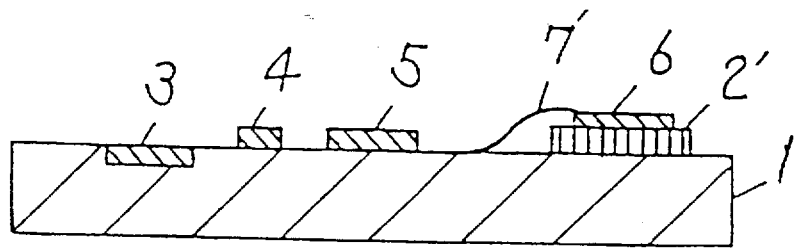
FIG. 11A is a sectional view of the structure of Example 11 of the present invention.
Figure 11B:
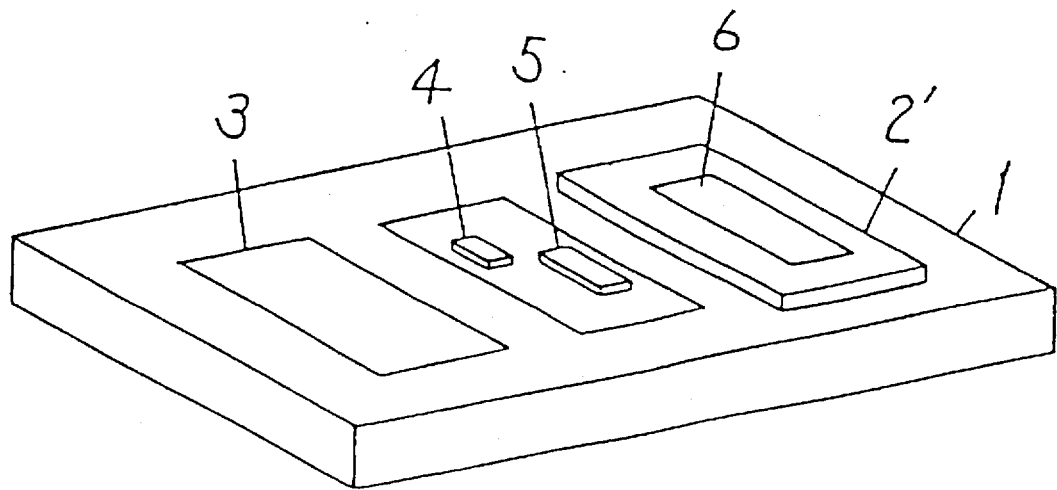
FIG. 11B is a perspective view of the structure of Example 11 of the present invention.

FIGS. 11A and 11B are a side view and a perspective view, respectively, of an oscillator as an eleventh example of the present invention. Referring to FIGS. 11A and 11B, the reference numeral 1 denotes a substrate made of GaAs, a III-V group compound semiconductor. The reference numeral 2' denotes a single crystalline piezoelectric substrate made of material selected from the group consisting of lithium niobate, lithium tantalate, and lithium borate, which constitutes a surface acoustic wave resonator. The single crystalline piezoelectric substrate 2' is bonded through direct bonding to the GaAs substrate 1. The other reference numerals 3 to 7' denote the same components as those described in Example 8, and the description thereof is omitted here.

FIGS. 11A and 11B schematically illustrate a typical arrangement of the above-described components. As in Example 8, in an actual implementation, the arrangement of the components and the connection of electrodes are properly determined so that a voltage controlled oscillator having a circuit configuration shown in FIG. 1 can be obtained.

The varactor diodes 4 and the passive chip components 5 such as capacitors and resistors may be incorporated in the GaAs substrate 1.

The GaAs substrate 1 and the single crystalline piezoelectric substrate 2' are bonded through direct bonding by attaching the surfaces of the two substrates to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller than the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding described in Example 8 are also obtained.

Though the oscillator having the circuit configuration shown in FIG. 1 is described in this example, it is needless to say that oscillators having other circuit configurations can also be integrated as described above.

Since the electron mobility of the GaAs substrate is about six times as high as that of an Si substrate, a high frequency transistor can be easily fabricated on the GaAs substrate. Accordingly, the GaAs substrate is especially suitable for the manufacture of a high frequency circuit.

The structure of this example is also applicable to a high frequency amplifier having the circuit configuration shown in FIG. 3 as described in Example 9. The same effects as those described above are also obtained by this application.

Lithium niobate has a large electromechanical coupling coefficient, which is in the range of 5% (128°, Y-cut, crystal orientation of X-axis propagation) to 17% (64°, Y-cut, X-axis propagation). Lithium niobate is therefore suitable for a resonator or a filter which has a high frequency, a low energy loss, and a wide bandwidth (specific bandwidth: 2–5%). In practice, it is used for a circuit including a resonator type RF filter or a band-pass filter, a voltage controlled oscillator having a wide bandwidth, and the like used, for example, for a portable telephone having a band in the range of 800 MHz to 1.9 GHz.

Lithium tantalate has an intermediate-level electromechanical coupling coefficient, which is 0.75–5% (36°, Y-cut, X-axis propagation). Lithium tantalate has a temperature dependence (18–32 ppm) superior to that of lithium niobate (50–100 ppm). In practice, it is used for a circuit including a RF filter or a band-pass filter which has a high frequency, a low energy loss, and an intermediate bandwidth (specific bandwidth: 1–2%), a voltage controlled oscillator having an intermediate bandwidth, and the like.

Lithium borate has an electromechanical coupling coefficient of 1% which is larger than that of quartz (0.2%), while having a crystal orientation where the temperature dependence is zero. Accordingly, lithium borate is used for a filter or an oscillator which has high precision, high stability, and an intermediate bandwidth. Since lithium borate can be easily etched with a low-concentration alkaline solution, it has following advantages: first, a substrate made of lithium borate can be etched to form an ultra-thin sheet having a thickness of 10 μm or less after the bonding thereof to a semiconductor substrate without damaging the semiconductor substrate. Secondly, lithium borate is suitable for forming an electro-acoustic element having a complicated shape, such as a tuning fork.

The single crystalline piezoelectric substrate 2' of this example can be made of either of the above materials having a desired crystal orientation. Accordingly, an excellent electro-acoustic element can be realized by this example compared with conventional piezoelectric thin films formed by various thin-film techniques.

EXAMPLE 12

A method for manufacturing the oscillator of Example 11 as a twelfth example of the present invention will be described with reference to the manufacture flow chart of FIG. 12 as follows:

The manufacturing process of this example is basically the same as that described in Example 10, except that the quartz substrate 2 in Example 10 is replaced with the single crystalline piezoelectric substrate 2' made of material selected from the group consisting of lithium niobate, lithium tantalate, and lithium borate. The single crystalline piezoelectric substrate 2' can also be bonded through direct bonding to the GaAs substrate 1 by the hydrophilic treatment, the rinse with pure water, and the heat treatment after the attachment of the surfaces as described in Example 10. Necessary electronic circuits and wirings are also formed as described in Example 10. The temperature for the heat treatment can also be in the range of 100°–800° C., so as to obtain favorable direct bonding.

The above manufacturing method for the oscillator is also applicable to the manufacture of a high frequency amplifier in which a filter is used as the electro-acoustic element and the circuit configuration is a little different from that of the oscillator. Further, a bulk acoustic wave element can also be formed as the electro-acoustic element as described in Example 10.

EXAMPLE 13

Figure 13A:
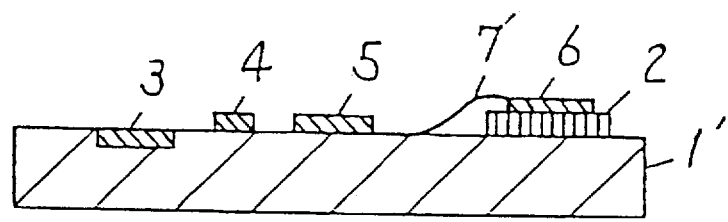
FIG. 13A is a sectional view of the structure of Example 13 of the present invention.
Figure 13B:
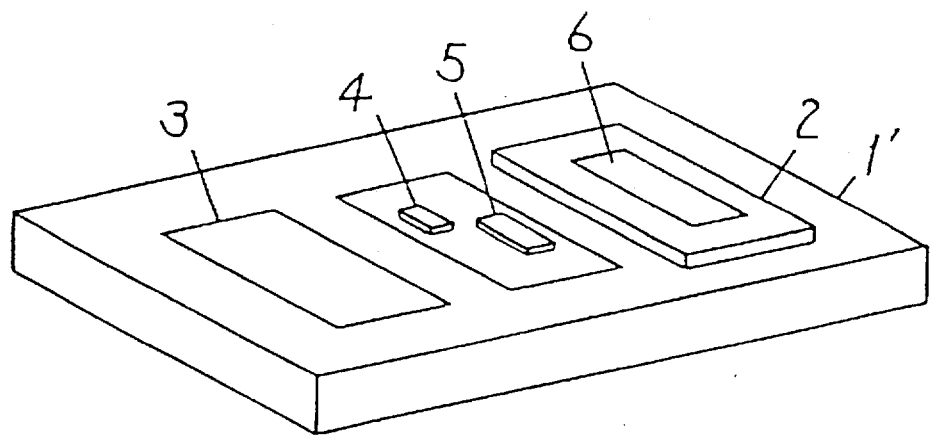
FIG. 13B is a perspective view of the structure of Example 13 of the present invention.

FIGS. 13A and 13B are a side view and a perspective view, respectively, of an oscillator as a thirteenth example of the present invention. Referring to FIGS. 13A and 13B, the reference numeral 1' denotes a substrate made of InP, a III-V group compound semiconductor. The reference numeral 2 denotes a single crystalline piezoelectric substrate or a quartz crystal substrate which constitutes a surface acoustic wave resonator. The quartz substrate 2 is bonded through direct bonding to the InP substrate 1'. The other reference numerals 3 to 7' denote the same components as those described in Example 1, and the description thereof is omitted here.

FIGS. 13A and 13B schematically illustrate a typical arrangement of the above-described components. As in Example 8, in an actual implementation, the arrangement of the components and the connection of electrodes are properly determined so that a voltage controlled oscillator having a circuit configuration shown in FIG. 1 can be obtained.

The varactor diodes 4 and the passive chip components 5 such as capacitors and resistors may be incorporated in the InP substrate 1'.

The InP substrate 1' and the quartz crystal substrate 2 are bonded through direct bonding by attaching the surfaces of the two substrates to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller then the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding described in Example 8 are also obtained.

Though the oscillator having the circuit configuration shown in FIG. 1 is described in this example, it is needless to say that oscillators having other circuit configurations can also be integrated as described above.

Since the electron mobility of the InP substrate is about twice as high as that of an Si substrate, a high frequency transistor can be easily fabricated in the InP substrate. Accordingly, the InP substrate is especially suitable for the manufacture of a high frequency circuit.

The structure of this example is also applicable to a high frequency amplifier having the circuit configuration shown in FIG. 3 as described in Example 9. The same effects as those described above are also obtained by this application.

EXAMPLE 14

A method for manufacturing the oscillator of Example 13 as a fourteenth example of the present invention will be described.

The manufacturing process of this example is basically the same as that described in Example 10, except that the GaAs substrate 1 in Example 10 is replaced with the InP substrate 1'. The InP substrate 1' can also be bonded through direct bonding with the quartz crystal substrate 2 by the hydrophilic treatment, the rinse with pure water, and the heat treatment after attaching the surfaces as described in Example 10. Necessary electronic circuits and wirings are also formed as described in Example 10. The temperature for the heat treatment can also be in the range of 100–800° C., so as to obtain favorable direct bonding.

The above manufacturing method for the oscillator is also applicable to the manufacture of a high frequency amplifier in which a filter is used as the electro-acoustic element and the circuit configuration is a little different from that of the oscillator.

EXAMPLE 15

Figure 14A:
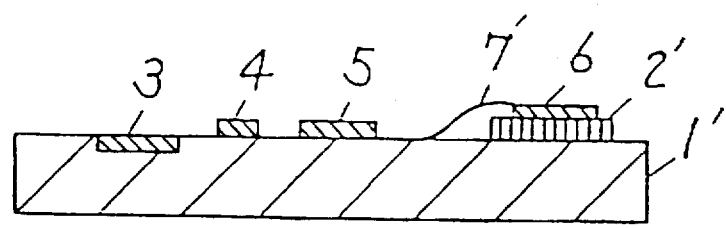
FIG. 14A is a sectional view of the structure of Example 15 of the present invention.
Figure 14B:
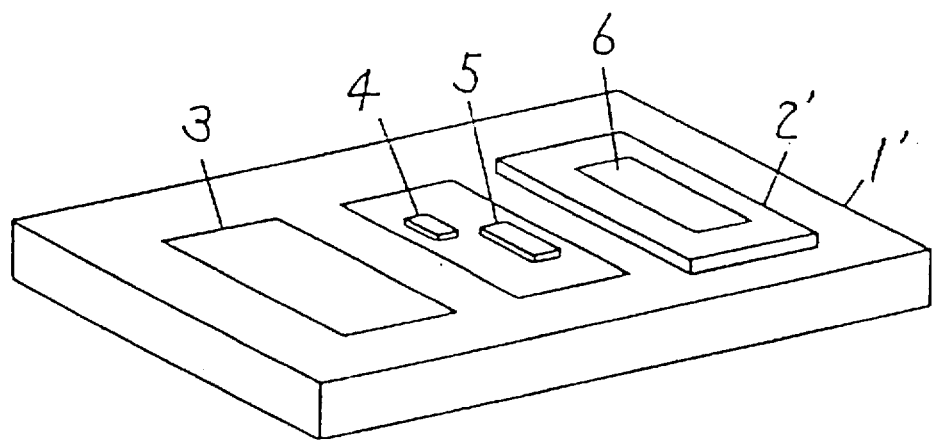
FIG. 14B is a perspective view of the structure of Example 15 of the present invention.

FIGS. 14A and 14B are a side view and a perspective view, respectively, of an oscillator as a fifteenth example of the present invention. Referring to FIGS. 14A and 14B, the reference numeral 1' denotes a substrate made of InP, a III-V group compound semiconductor. The reference numeral 2' denotes a single crystalline piezoelectric substrate made of material selected from the group consisting of lithium niobate, lithium tantalate, and lithium borate, which constitutes a surface acoustic wave resonator. The single crystalline piezoelectric substrate 2' is bonded through direct bonding to the InP substrate 1'. The other reference numerals 3 to 7' denote the same components as those described in Example 8, and the description thereof is omitted here.

FIGS. 14A and 14B schematically illustrate a typical arrangement of the above-described components. As in Example 8, in an actual implementation, the arrangement of the components and the connection of electrodes are properly determined so that a voltage controlled oscillator having a circuit configuration shown in FIG. 1 can be obtained.

The varactor diodes 4 and the passive chip components 5 such as capacitors and resistors may be incorporated in the InP substrate 1'.

The InP substrate 1' and the single crystalline piezoelectric substrate 2' are bonded through direct bonding by attaching the surfaces of the two substrates to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller than the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding described in Example 8 are also obtained.

Though the oscillator having the circuit configuration shown in FIG. 1 is described in this example, it is needless to say that oscillators having other circuit configurations can also be integrated as described above.

Since the electron mobility of the InP substrate is about twice as high as that of an Si substrate, a high frequency transistor can be easily fabricated on the InP substrate. Accordingly, the InP substrate is especially suitable for the manufacture or a high frequency circuit.

The structure of this example is also applicable to a high frequency amplifier having the circuit configuration shown in FIG. 3 as described in Example 9. The same effects as those described above are also obtained by this application.

EXAMPLE 16

A method for manufacturing the oscillator of Example 15 as a sixteenth example of the present invention will be described.

The manufacturing process of this example is basically the same as that described in Example 10, except that the GaAs substrate 1 in Example 10 is replaced with the InP substrate 1', and the quartz substrate 2 is replaced with the single crystalline piezoelectric substrate 2' made of material selected from the group consisting of lithium niobate, lithium tantalate, and lithium borate. The InP substrate 1' can also be bonded through direct bonding with the single crystalline piezoelectric substrate 2' by the hydrophilic treatment, the rinse with pure water, and the heat treatment after attaching the surfaces as described in Example 10. Necessary electronic circuits and wirings are also formed as described in Example 10. The temperature for the heat treatment can also be in the range of 100°–800° C., so as to obtain favorable direct bonding.

The above manufacturing method for the oscillator is also applicable to the manufacture of a high frequency amplifier in which a filter is used as the electro-acoustic element and the circuit configuration is a little different from that of the oscillator.

EXAMPLE 17

Figure 15A:
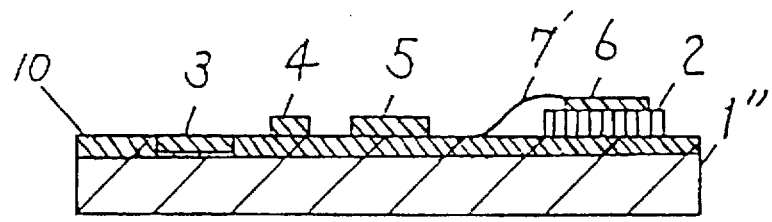
FIG. 15A is a sectional view of the structure of Example 17 of the present invention.
Figure 15B:
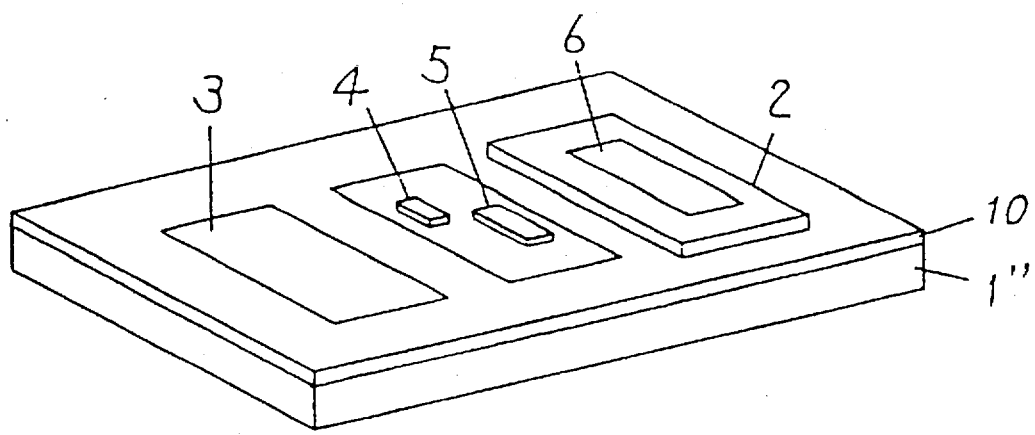
FIG. 15B is a perspective view of the structure of Example 17 of the present invention.

FIGS. 15A and 15B are a side view and a perspective view, respectively, of an oscillator as a seventeenth example of the present invention. Referring to FIGS. 15A and 15B, the reference numeral 1" denotes a substrate made of GaAs, a III-V group compound semiconductor. The reference numeral 10 denotes an InGaAs layer formed on the GaAs substrate 1". The reference numeral 2 denotes a single crystalline piezoelectric substrate or a quartz substrate which constitutes a surface acoustic wave resonator. The quartz crystal substrate 2 is bonded through direct bonding to the InGaAs layer 10. The other reference numerals 3 to 7' denote the same components as those described in Example 8, and the description thereof is omitted here.

FIGS. 15A and 15B schematically illustrate a typical arrangement of the above-described components. As in Example 8, in an actual implementation, the arrangement of the components and the connection of electrodes are properly determined so that a voltage controlled oscillator having a circuit configuration shown in FIG. 1 can be obtained.

The varactor diodes 4 and the passive chip components 5 such as capacitors and resistors may be incorporated in the GaAs substrate 1" and the InGaAs layer 10 formed thereon.

The InGaAs layer 10 and the quartz crystal substrate 2 are bonded through direct bonding by attaching the surfaces thereof to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller than the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding, described in Example 8 are also obtained.

Though the oscillator having the circuit configuration shown in FIG. 1 is described in this example, it is needless to say that oscillators having other circuit configurations can also be integrally formed as described above.

Since the electron mobility of the InGaAs layer, as well as that of the GaAs substrate, is about three to five times as high as that of an Si substrate, a high frequency transistor can be easily fabricated on the InP substrate. Accordingly, the InP substrate is especially suitable for the manufacture of a high frequency circuit.

The structure of this example is also applicable to a high frequency amplifier having the circuit configuration shown in FIG. 3 as described in Example 9. The same effects as those described above are also obtained by this application.

EXAMPLE 18

A method for manufacturing the oscillator of Example 17 as a eighteenth example of the present invention will be described.

The manufacturing process of this example is basically the same as that described in Example 10, except that the GaAs substrate 1 in Example 10 is replaced with the GaAs substrate 1" and the InGaAs layer 10 formed thereon. The quartz crystal substrate 2 and the InGaAs layer 10 can also be bonded through direct bonding to each other by the hydrophilic treatment, the rinse with pure water, and the heat treatment after attaching the surfaces as described in Example 10. Necessary electronic circuits and wirings are also formed as described in Example 10. The temperature for the heat treatment can also be in the range of 100°–800° C., so as to obtain favorable direct bonding. The electronic elements are formed on the InGaAs layer 10. The thickness of the InGaAs layer 10 required for the formation of the electronic elements is 1–5 μm.

The above manufacturing method for the oscillator is also applicable to the manufacture of a high frequency amplifier in which a filter is used as the electro-acoustic element and the circuit configuration is a little different from that of the oscillator.

EXAMPLE 19

Figure 16A:
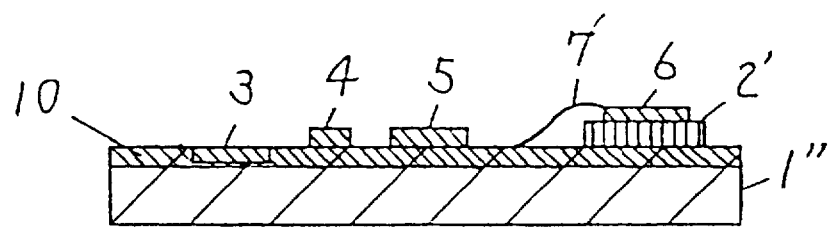
FIG. 16A is a sectional view of the structure of Example 19 of the present invention.
Figure 16B:
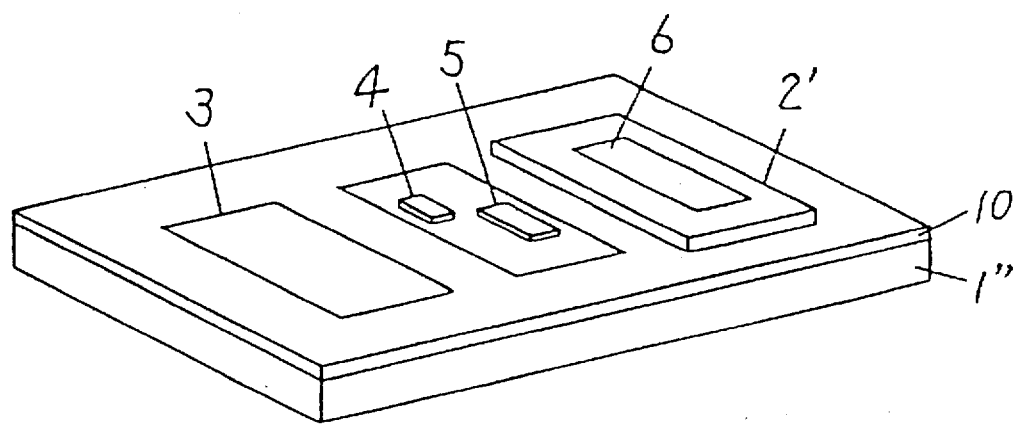
FIG. 16B is a perspective view of the structure of Example 19 of the present invention.

FIGS. 16A and 16B are a side view and a perspective view, respectively, of an oscillator as a nineteenth example of the present invention. Referring to FIGS. 16A and 16B, the reference numeral 1" denotes a substrate made of GaAs, a III-V group compound semiconductor. The reference numeral 10 denotes an InGaAs layer formed on the GaAs substrate 1". The reference numeral 2' denotes a single crystalline piezoelectric substrate made of material selected from the group consisting of lithium niobate, lithium tantalate, and lithium borate, which constitutes a surface acoustic wave resonator. The single crystalline piezoelectric substrate 2' is bonded through direct bonding to the InGaAs layer 10. The other reference numerals 3 to 7' denote the same components as those described in Example 8, and the description thereof is omitted here.

FIGS. 16A and 16B schematically illustrate a typical arrangement of the above-described components. As in Example 8, in an actual implementation, the arrangement of the components and the connection of electrodes are properly determined so that a voltage controlled oscillator having a circuit configuration shown in FIG. 1 can be obtained.

The varactor diodes 4 and the passive chip components 5 such as capacitors and resistors may be incorporated in the GaAs substrate 1" and the InGaAs layer 10 formed thereon.

The InGaAs layer 10 and the single crystalline piezoelectric substrate 2' are bonded through direct bonding by attaching the surfaces thereof to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller than the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding described in Example 8 are also obtained.

Though the oscillator having the circuit configuration shown in FIG. 1 is described in this example, it is needless to say that oscillators having other circuit configurations can also be integrated as described above.

Since the electron mobility of the InGaAs layer, as well as that of the GaAs substrate, is about three to five times as high as that of an Si substrate, a high frequency transistor can be easily fabricated on the InP substrate. Accordingly, the InP substrate is especially suitable for the manufacture of a high frequency circuit.

The structure of this example is also applicable to a high frequency amplifier having the circuit configuration shown in FIG. 3 as described in Example 9. The same effects as those described above are also obtained by this application.

EXAMPLE 20

A method for manufacturing the oscillator of Example 19 as a twentieth example of the present invention will be described.

The manufacturing process of this example is basically the same as that described in Example 10, except that the GaAs substrate 1 in Example 10 is replaced with the GaAs substrate 1" and the InGaAs layer 10 formed thereon, and the quartz substrate 2 is replaced with the single crystalline piezoelectric substrate 2' made of material selected from the group consisting of lithium niobate, lithium tantalate, and lithium borate. The single crystalline piezoelectric substrate 2' and the InGaAs layer 10 can also be bonded through direct bonding to each other by the hydrophilic treatment, the rinse with pure water, and the heat treatment after attaching the surfaces as described in Example 10. Necessary electronic circuits and wirings are also formed as described in Example 10. The temperature for the heat treatment can also be in the range of 100°–800° C., so as to obtain favorable direct bonding. The electronic elements are formed on the InGaAs layer 10. The thickness of the InGaAs layer 10 required for the formation of the electronic elements is 1–5 μm.

The above manufacturing method for the oscillator is also applicable to the manufacture of a high frequency amplifier in which a filter is used as the electro-acoustic element and the circuit configuration is a little different from that of the oscillator.

In the above examples, GaAs, InP and InGaAs were used as the III-V group compound semiconductor for the semiconductor substrate. Other III-V group compound semiconductors which resemble in the chemical and electronic properties to those mentioned above can also be used.

EXAMPLE 21

Figure 17A:
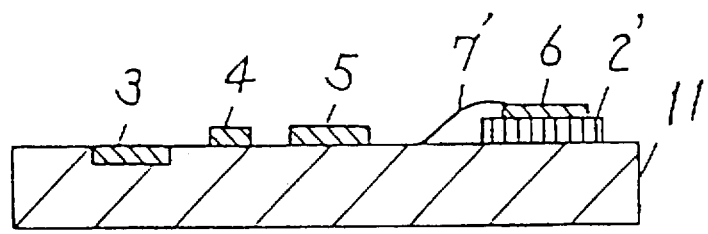
FIG. 17A is a sectional view of the structure of Example 21 of the present invention.
Figure 17B:
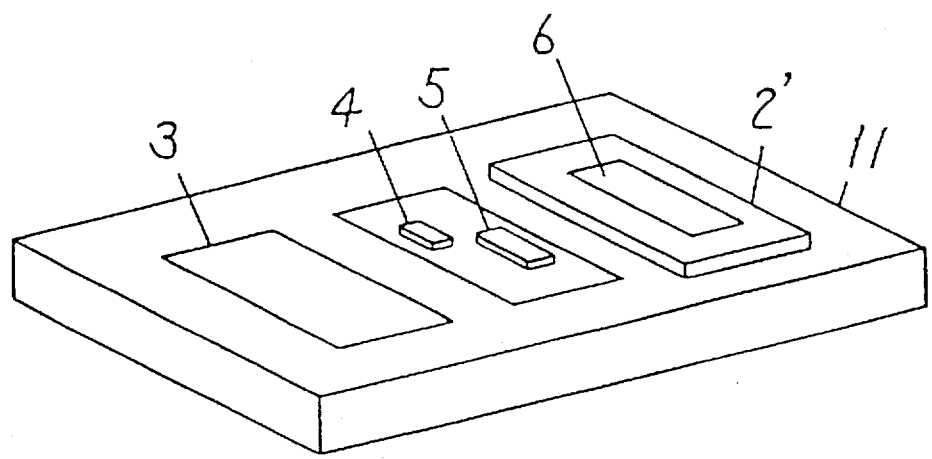
FIG. 17B is a perspective view of the structure of Example 21 of the present invention.

FIGS. 17A and 17B are a side view and a perspective view, respectively, of an oscillator as a twenty first example of the present invention. Referring to FIGS. 17A and 17B, the reference numeral 11 denotes a substrate made of Si. The reference numeral 2' denotes a single crystalline piezoelectric substrate made of material selected from the group consisting of lithium niobate, lithium tantalate, and lithium borate, which constitutes a surface acoustic wave resonator. The single crystalline piezoelectric substrate 2' is bonded through direct bonding on the Si substrate 11. The other reference numerals 3 to 7' denote the same components as those described in Example 1, and the description thereof is omitted here.

FIGS. 17A and 17B schematically illustrate a typical arrangement of the above-described components. As in Example 8, in an actual implementation, the arrangement of the components and the connection of electrodes are properly determined so that a voltage controlled oscillator having a circuit configuration as shown in FIG. 1 can be obtained.

The varactor diodes 4 and the passive chip components 5 such as capacitors and resistors may be incorporated in the Si substrate 11.

The Si substrate 11 and the single crystalline piezoelectric substrate 2' are bonded through direct bonding by attaching the surfaces of the two substrates to each other after the hydrophilic treatment of each surface and then heat-treating the attached substrates. By this direct bonding, the same functions and effects as those described in Example 8 are obtained. That is, with the above structure, since the oscillating circuit and the resonator can be integrally formed, the resultant voltage controlled oscillator can be made significantly smaller than the conventional ones. In practice, it is easy to reduce the volume of the oscillator to about a tenth and the weight thereof to about a fifth the conventional oscillator in which the surface acoustic wave resonator is first sealed in a container before being integrated. Other effects of the direct bonding described in Example 8 are also obtained.

Though the oscillator having the circuit configuration shown in FIG. 1 is described in this example, it is needless to say that oscillators having other circuit configurations can also be integrated as described above.

The Si semiconductor substrate costs only a tenth or less of the cost of the III-V group compound semiconductors. Further, since large-scale integration is possible with the Si substrate, it is possible to form a memory circuit on the Si semiconductor substrate for storing individual properties of the electro-acoustic element and correcting the stored properties.

EXAMPLE 22

A method for manufacturing the oscillator of Example 21 as a twenty second example of the present invention will be described.

The manufacturing process of this example is basically the same as that described in Example 10, except that the GaAs substrate 1 in Example 10 is replaced with the Si substrate 11, and the quartz substrate 2 is replaced with the single crystalline piezoelectric substrate 2' made of the material selected from the group consisting of lithium niobate, lithium tantalate, and lithium borate. The single crystalline piezoelectric substrate 2' and the Si substrate 11 can also be bonded through direct bonding with each other by the hydrophilic treatment, the rinse with pure water, and the heat treatment after attaching the surfaces as described in Example 10. Necessary electronic circuits and wirings are also formed as described in Example 10. The temperature for the heat treatment can also be in the range of 100°–800° C., so as to obtain favorable direct bonding. The electronic elements are formed on the Si substrate 11.

EXAMPLE 23

Figure 18A:
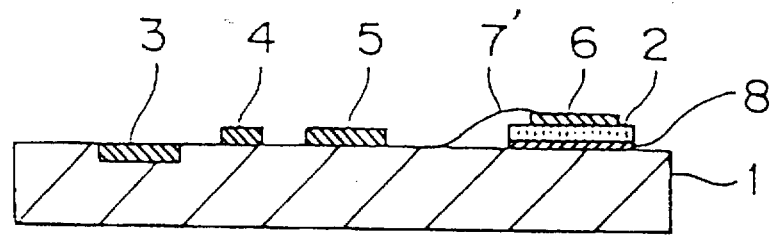
FIG. 18A is a sectional view of the structure of Example 23 of the present invention.
Figure 18B:
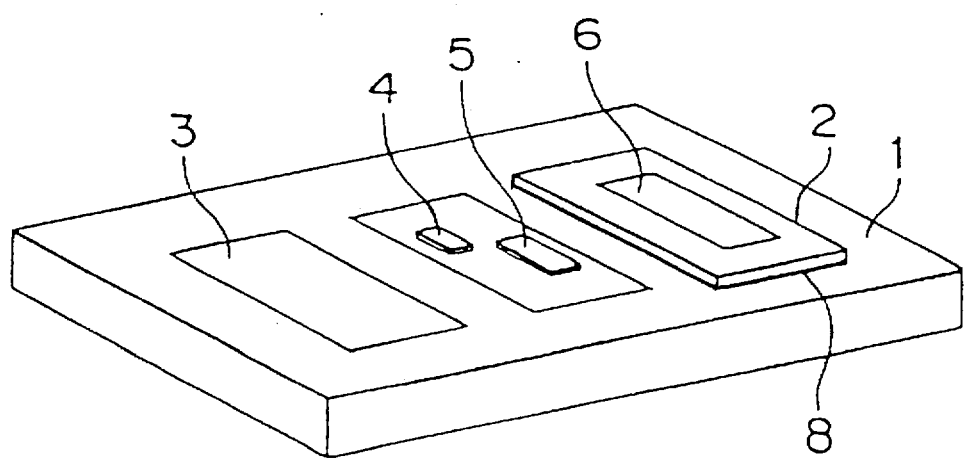
FIG. 18B is a perspective view of the structure of Example 23 of the present invention.

FIGS. 18A and 18B show the structure of a voltage controlled oscillator of Example 23 of the present invention schematically, wherein the reference numeral 1 denotes a silicon (Si) substrate while the reference numeral 2 denotes a single crystalline piezoelectric substrate or a lithium niobate or lithium tantalate substrate which constitutes a surface acoustic wave resonator (SAW). The reference numeral 8 denotes a silicon compound thin film such as a silicon oxide film or a silicon film deposited on the silicon substrate 1 and/or on the single crystalline piezoelectric substrate 2, and the film thickness is 0.1 µm to several µm. The silicon substrate 1 bonds through direct bonding with the single crystalline piezoelectric substrate 2 via the thin films 8. A silicon film may also be used for direct bonding instead of the silicon oxide film 8. The reference numeral 3 denotes a transistor formed on the silicon substrate 1 with photolithography process. Varactor diode chips (D) 4 with an electrostatic capacitance to vary with the applied voltage and passive chip components 5 such as capacitors, inductors and resistors are mounted on the silicon substrate 1. Comb-like electrodes 6 are provided on the single crystalline piezoelectric substrate 2 to form the surface acoustic wave resonator, and wires 7' connect the electors 6 with the metallic lines on the silicon substrate 1. The components 2–5 mounted on the silicon substrate 1 and the two electrodes 6 are connected to form a voltage controlled oscillator. Further, the voltage controlled oscillator integrated on the silicon substrate 1 as a hybrid integrated circuit is sealed in a container (not shown).

The voltage controlled oscillator has for example a circuit shown in FIG. 1, and it comprises the transistor, the surface acoustic wave resonator (SAW) and the various electronics components 4, 5 such as varactor diodes (D). This is a known circuit and detailed explanation is omitted here. The oscillation frequency of the output OUT of the voltage controlled oscillator can be changed according to the voltage $V_{cont}$ applied to the varactor diodes 4. Other circuits different from that shown in FIG. 1 may also be used. The numbers of varactor diodes and other passive electronics components vary with a circuit, and the arrangement thereof on the semiconductor substrate is designed suitably for each case.

As explained above, in this voltage-controlled oscillator, the oscillator circuit and the surface acoustic wave resonator are integrated on a semiconductor substrate as a hybrid integrated circuit. Thus, the volume decreases easily to about a tenth the counterpart of a prior art structure with a surface acoustic wave resonator sealed in a container is used, while the weight also decreases to about a fifth the counterpart of the prior art structure.

The direct bonding has further advantages. In the present invention, the silicon substrate and the single crystalline piezoelectric substrate 2 are bonded through direct bonding via the silicon oxide thin films 8 formed on one or both of the surfaces of the substrates 1 and 2. That is, the bonding is performed via inorganic substances, and the semiconductor process can be performed further after the bonding. On the contrary, if the semiconductor substrate 1 and the single crystalline piezoelectric element 2 are bonded to each other with an ordinary bonding agent made from resin or the like, the semiconductor process cannot be further performed after the bonding owing to worse heat resistance and worse chemical resistance.

Further, if a bonding agent made from resin or the like is used, the degree of parallelization between the silicon substrate 1 and the lithium niobate or lithium tantalate substrate 2 becomes worse, and the precision of the size of the comb-type electrodes 6 formed with photolithography on the single crystalline piezoelectric substrate 2 thereafter becomes worse. For example, if the resonance frequency is of the order of 1 GHz, the electrode size is required to be about 1 µm of line and space width. Therefore, when the parallelization is worse, a surface acoustic wave resonator for the submicrowave band cannot be operated. On the contrary, in this example, the direct bonding is performed directly via the thin films 8, and the film preparation can be controlled in general in the order of one nanometer. Thus, the above-mentioned problem can be solved. This effect of direct bonding is especially advantageous at high frequencies.

If a bonding agent made from resin is used, the secular change is another problem due to the thermal strain caused by the difference of thermal expansion coefficients between the resin as an organic material and the silicon substrate 1 and the single crystalline piezoelectric substrate 2 both made of inorganic materials. However, the present example solves this problem by direct bonding.

EXAMPLE 24

Figure 19A:
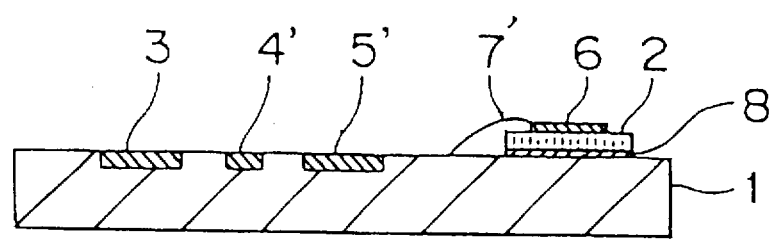
FIG. 19A is a sectional view of the structure of Example 24 of the present invention.
Figure 19B:
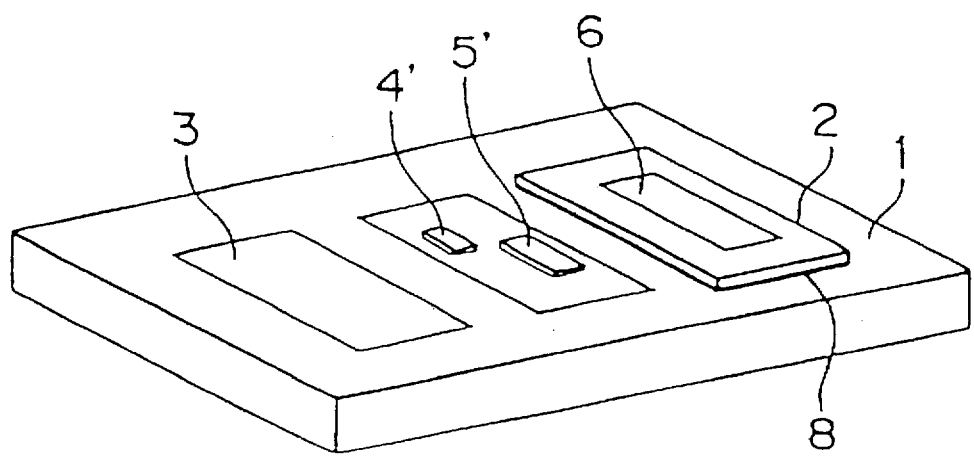
FIG. 19B is a perspective view of the structure of Example 24 of the present invention.

FIGS. 19A and 19B show the structure of a voltage controlled oscillator of Example 24 of the present invention schematically of the same circuit as Example 23. The reference numerals 1–3 and 6–8 denote the same as in Example 23. That is, the reference numeral 1 denotes a silicon substrate, while the reference numeral 2 denotes a single crystalline piezoelectric substrate. The reference numeral 8 denotes a silicon compound film such as a silicon oxide film or a silicon film formed on the silicon substrate 1 and/or on the single crystalline piezoelectric substrate 2 for direct bonding of the silicon substrate 1 with the single crystalline piezoelectric substrate 2. The reference numeral 3 denotes a field effect transistor 3. The reference numeral 6 denotes an electrode of the surface acoustic wave resonator, and the reference numeral 7' denotes a wire connecting the electrode 6 with the metallic lines on the silicon substrate 1.

The reference numeral 4' denotes a varactor diode chip, while the reference numeral 5' denotes passive chip components such as capacitors. The components 3, 4', 5' and the two electrodes 6 are connected to form a voltage controlled oscillator shown in FIG. 3. Further, the voltage controlled oscillator integrated as a hybrid integrated circuit is sealed in a container (not shown).

This example is different from Example 23 in a point that the varactor diode chips 4' and the passive chip components 5' are formed with photolithography process in the silicon substrate 1 as known in a semiconductor process. It is easy to integrate the varactor diode chips 4' when the silicon substrate 1 is used. The resistors of the passive components 5' can be made easily by forming silicon resistors made by diffusion process or thin film resistors made from tantalum nitride; the capacitors can be made easily by forming silicon nitride films; and the inductors can be made easily by forming spiral metal patterns. By adopting this structure, the voltage controlled oscillator can be mace more compactly than that of Example 23. The mounting of the chip components 4 and 5 needed in Example 23 can be omitted in the manufacturing steps, and this is convenient for mass production.

EXAMPLE 25

Figure 20:
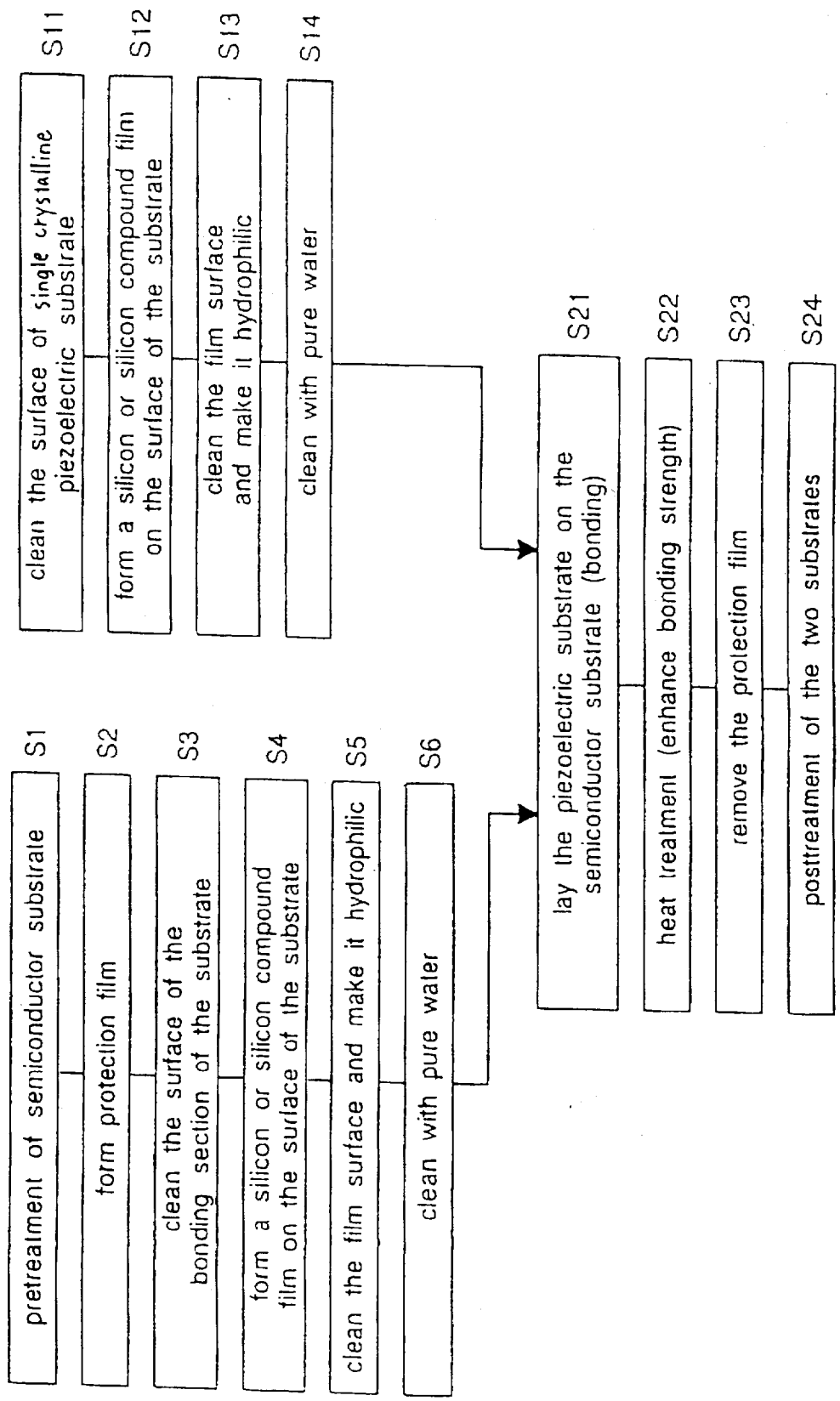
FIG. 20 is a flowchart of the manufacturing method of an electro-acoustic hybrid integrated circuit of Example 25 of the present invention.
Figure 21:
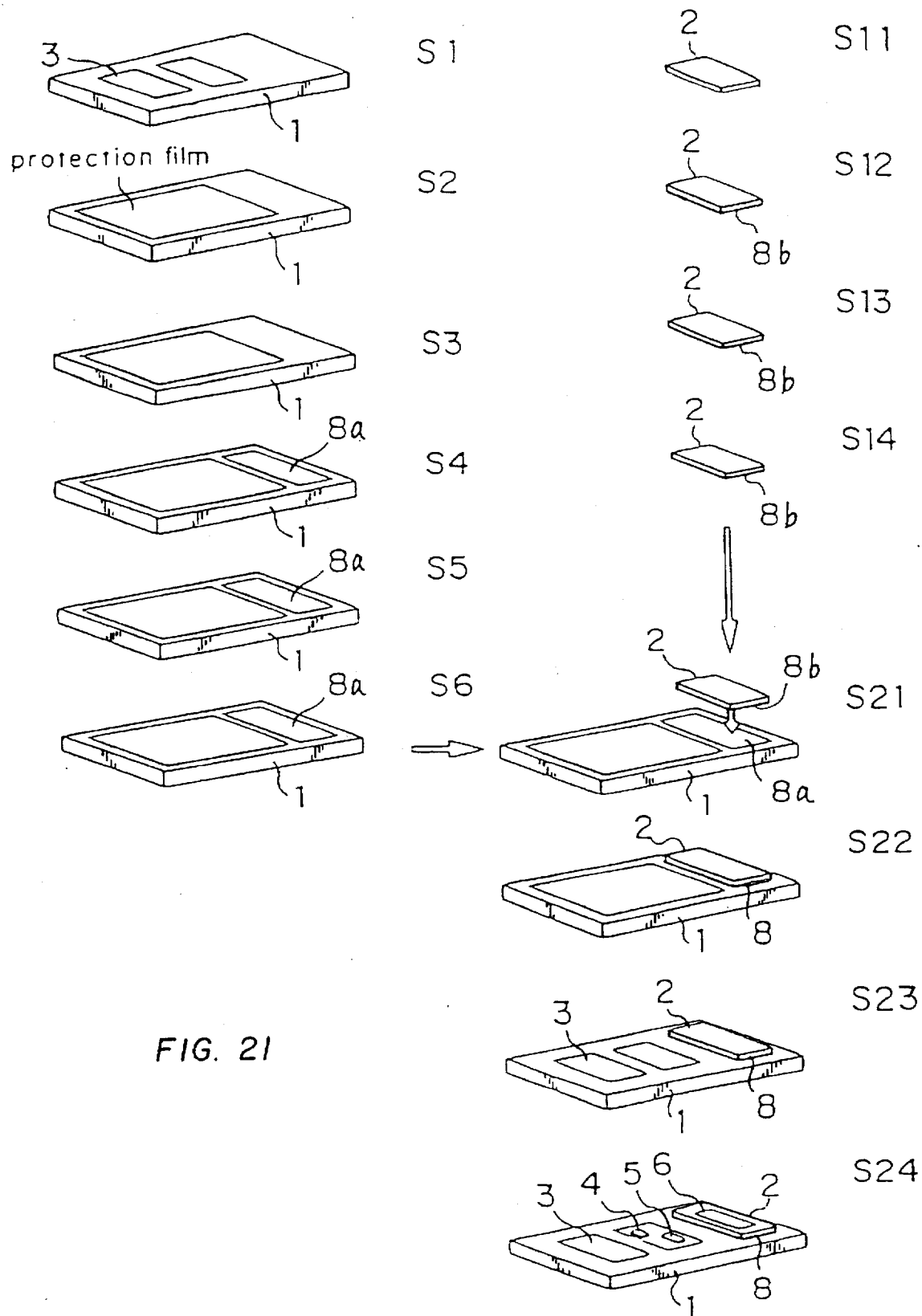
FIG. 21 illustrates the manufacture flow chart of Example 25 of the present invention.

An example of a manufacturing method of a voltage controlled oscillator is explained with reference to FIGS. 20 and 21.

First, one or more depressed areas are formed in pre-scribed positions on a silicon substrate 1 with etching or the like and a series of semiconductor process, including a diffusion process, necessary for a field effect transistor 3, varactor diodes 4 and the like is carried out at the heat treatment temperature or direct bonding or higher (step S1). The diffusion process is performed usually at a temperature as high as 1000° C. or higher.

Next, a protection film is formed on the silicon section which has been subjected to the above-mentioned processes if necessary (step S2). The protection film is made of a metallic or oxide film which can resist the above-mentioned processes and can be removed finally. Then, the surface of a section used for the bonding later with a single crystalline piezoelectric substrate 2 is cleaned very much (step S3). In concrete, the surface layer of silicon is etched and removed with a fluoric acid etchant.

Then, a first silicon oxide film 8a is formed on the silicon substrate 1 with a chemical vapor deposition process or the like (step S3). The film thickness of the silicon oxide and the uniformity of the films can be easily controlled for films of thickness of about 0.1–3 µm. The sputtering or the vacuum deposition may also be used.

The surface of the silicon oxide film 8a is cleaned with the buffered fluoric acid, and the surface is subjected to a processing to make it hydrophilic (step S5).

On the other hand, the surface of the single crystalline piezoelectric substrate 2 is cleaned (step S11). Then, a second silicon oxide film 8b is also formed on the single crystalline piezoelectric substrate 2 with a chemical vapor growth process or the like (step S12). The thickness and the uniformity of the second silicon oxide film 8b can be controlled similarly to the first silicon oxide film.

The surface of the silicon oxide film 8b is cleaned with the buffered fluoric acid, and the surface is subjected to a processing so as to make it hydrophilic (step S13).

Then, the surfaces of the first and second silicon oxide films 8a and 8b are cleaned sufficiently with pure water (steps S6 and S14). Next, the surfaces of the two silicon oxide films 8a and 8b are contacted uniformly immediately (step S21). Thus, the direct bonding between the silicon substrate 1 and the single crystalline piezoelectric substrate 2 can be formed through hydrogen bonds between hydroxyl groups absorbed on the surfaces of the silicon oxide films 8a and 8b. The as-formed direct bonding is sufficiently hard.

Furthermore, the bonding strength becomes harder by the heat treatment at 100°–800° C., preferably at 300°–600° C. (step S22). When the heat treatment temperature is high, the shape, the size or the like of the single crystalline piezoelectric substrate 2 is limited somewhat due to the difference of the thermal expansion coefficients between the silicon substrate 1 and the single crystalline piezoelectric substrate 2. However, the bonding strength can be improved essentially, without causing peel-off materials and damages, when the thickness and the area of the single crystalline piezoelectric substrate 2 are decreased with increase in the heat treatment temperature.

As to the effect of the heat treatment on the bonding strength, for example the heat treatment of on hour at 200° C. can increase the bonding strength several times, to several tens kg/cm². If the temperature is increased above 800° C., lithium atoms leave for the surface of lithium niobate or lithium tantalate. Thus, the surface characteristic is deteriorated and the prescribed performance as a surface acoustic wave resonator cannot be obtained. Therefore, the bonding temperature has to be 800° C. or lower when lithium niobate or lithium tantalate is used for the single crystalline piezoelectric substrate 2.

Next, the protection film is removed if it is formed in step S2 (step S23). Then, various processes such as electrode formation which are processed at temperatures below the heat treatment temperature for bonding. Then, electrodes are formed on the surface of the single crystalline piezoelectric substrate with vacuum deposition or the like, and then the metal pattern is formed with a conventional photolithography (step S24). The electrodes are made from aluminum, gold/chromium or the like.

The direct bonding is possible even if a silicon oxide film 8 is formed only one of the substrates 1 and 2, that is, only on the surface of the single crystalline piezoelectric substrate 2 or of the silicon substrate 1. The bonding is also possible if the single crystalline piezoelectric substrate 2 is made from an oxide other than lithium niobate or lithium tantalate. The bonding temperature can be lowered by applying an electric voltage at the bonding interface.

The direct bonding is possible at room temperature and it can be carried out after all processes are completed.

If a controlled voltage oscillator of Example 24 is manufactured, the varactor diodes 4' and the passive electronics components are fabricated in steps S1 and S24.

EXAMPLE 26

An example of a manufacturing method of a voltage controlled oscillator is explained with reference to FIGS. 20 and 21. In this example, an amorphous silicon film is used for the film 8.

Similarly to Example 25, one or more depressed areas are formed in prescribed positions on a silicon substrate 1 with etching or the like, and a series of semiconductor process, including a diffusion process, necessary for a field effect transistor 3, varactor diodes 4 and the like is carried out at the heat treatment temperature for direct bonding or higher (step S1). Next, a protection film is formed on the silicon section which has been subjected to the above-mentioned processes if necessary (step S2). Then, the surface of a section for direct bonding is cleaned very much (step S3). Then, a first amorphous silicon thin film 8a is formed on the silicon substrate 1 with a plasma chemical vapor deposition process or the like (step S4). The film thickness of the amorphous silicon is about 0.1–3 µm as in Example 25. The surface of the amorphous silicon film 8a is cleaned with the buffered fluoric acid, and the surface is subjected to a hydrophilic treatment to make it hydrophilic (step S5).

On the other hand, the surface of the single crystalline piezoelectric substrate 2 is cleaned (step S11). Then, a second amorphous silicon thin film 8b of thickness of 0.1–0.3 µm is also formed on the single crystalline piezoelectric substrate 2 with a plasma chemical vapor deposition process or the like (step S12). The surface of the amorphous silicon film 8b is cleaned with the buffered fluoric acid, and the surface is subjected to a processing to make it hydrophilic (step S13).

Then, the surfaces of the first and second amorphous silicon films 8a and 8b are cleaned sufficiently with pure water (step S14). Next, the surfaces of the two amorphous silicon films 8a and 8b are contacted uniformly immediately (step S21). Thus, the direct bonding between the silicon substrate 1 and the single crystalline piezoelectric substrate 2 can be formed through hydrogen bonds between hydroxyl groups on the surfaces of the amorphous silicon films 8a and 8b. The as-formed direct bonding is sufficiently strong.

Furthermore, the bonding becomes stronger by the heat treatment at 100°–800° C., preferably at 300°–600° C. (step S22). Next, the protection film is removed if it is formed in step S2 (step S23). Then, various processes such as electrode formation which are processed at temperatures below the heat treatment temperature for direct bonding. Then, electrodes are formed on the surface of the single crystalline piezoelectric substrate with vacuum deposition or the like, and then the metal pattern is formed with a conventional photolithography (step S24). The electrodes are made from aluminum, gold/chromium or the like.

The bonding strength with use of amorphous silicon films is higher than that of Example 25 with use of silicon oxide films. Because the direct bonding is possible at room temperature, the bonding process (step S21) may be carried out after all processing is completed.

The direct bonding is possible even if an amorphous silicon film 8 is formed only one of the substrate 1, 2, that is only on the surface of the single crystalline piezoelectric substrate 2 or of the silicon substrate 1. The direct bonding is also possible if the single crystalline piezoelectric substrate 2 is made from an oxide other than lithium niobate or lithium tantalate electric voltage. The bonding temperature can be lowered by applying an electric voltage at the bonding interface.

EXAMPLE 27

Figure 22:
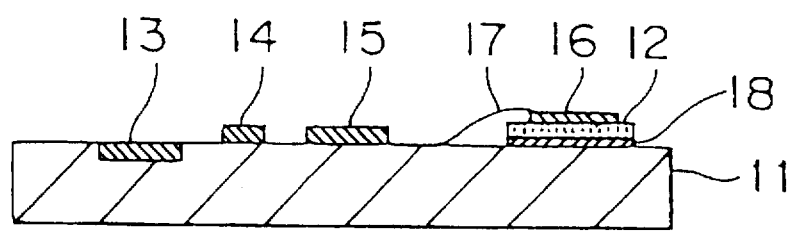
FIG. 22 is a sectional view of the structure of Example 27 of the present invention.

FIG. 22 shows an example of the structure of a voltage controlled oscillator of the present invention. The perspective view of the voltage controlled oscillator is similar to FIG. 18B and it is not shown here. The reference numeral 11 denotes a GaAs substrate as a representative of III-V group compound semiconductors while the reference numeral 12 denotes a single crystalline piezoelectric substrate or a lithium niobate or lithium tantalate substrate which constitutes a surface acoustic wave resonator (SAW). The reference numeral 18 denotes a silicon compound film such as a silicon oxide film or a silicon film formed on the GaAs substrate 11 and/or on the single crystalline piezoelectric substrate 12, and the film 18 bonds the GaAs substrate 11 directly with the single crystalline piezoelectric substrate 12 via the films 18. A transistor 13 is formed on the GaAs substrate 11. Varactor diode chips (D) 14 with an electrostatic capacitance to vary with the applied voltage and passive chip components 15 such as capacitors, inductors and resistors are mounted on the GaAs substrate 11. Comb-like electrodes 16 are provided on the single crystalline piezoelectric substrate 12 to form the surface acoustic wave resonator, and wires 17 connect the electrodes 16 with the metallic lines on the GaAs substrate 11. The components 12–15 mounted on the GaAs substrate 11 and the two electrodes 16 are connected to form a voltage controlled oscillator as shown in FIG. 1. A voltage-controlled oscillator comprises the transistor, the various electronics components 14, 15 and the surface acoustic wave resonator (SAW). Further, the voltage controlled oscillator integrated as a hybrid integrated circuit is sealed in a container (not shown).

Similarly to Example 23, by using this structure, the oscillator circuit and the surface acoustic wave resonator are integrated as a hybrid integrated circuit. Thus, the volume decreases easily to about a tenth the counterpart of a prior art structure wherein a surface acoustic wave resonator put in a closed container is used, while the weight also decreases to about a fifth the counterpart of the prior art structure. The above-mentioned problems with use of a bonding agent made from resin can also be avoided.

This example is different from Example 23 in the point that a GaAs substrate 11 is used instead of a silicon substrate 1. III-V group compound semiconductors such as GaAs, InP and InGaAs have a larger mobility than silicon generally. The mobility of GaAs is about six times that of silicon.

Therefore, a high speed semiconductor can be formed by using a III-V compound semiconductor, and a transistor which can be operated at several tens GHz can be formed easily. Thus, the operation at higher frequencies of an electro-acoustic hybrid integrated circuit becomes possible, and the voltage controlled oscillator of this example can be operated at higher frequencies than that Example 23.

EXAMPLE 28

Figure 23:
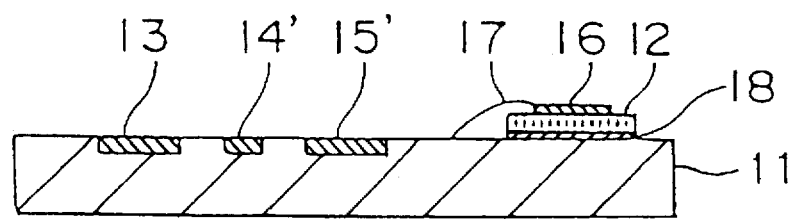
FIG. 23 is a sectional view of the structure of Example 28 of the present invention.

FIG. 23 shows an example of the structure of a voltage controlled oscillator of the present invention. The perspective view of the voltage controlled oscillator is similar to FIG. 18B and it is not shown here. The reference numerals 11–13 and 16–18 denote the same as in Example 27 (FIG. 22). The silicon oxide or silicon film 18 bonds the GaAs substrate 11 and the single crystalline piezoelectric substrate 12 through direct bonding. The reference numeral 14' denotes a varactor diode chip which changes the electrostatic capacitance with the applied voltage, and the reference numeral 15' denotes passive chip components such as capacitors, inductors and resistors. The components on the GaAs substrate and the two electrodes of the surface acoustic wave resonator are connected to form a voltage controlled oscillator as shown in FIG. 1. The voltage controlled oscillator constructed integrated as explained above is out in a container (not shown).

This example is different from Example 27 in a point that the varactor diode chip 14' and the passive chip components 15' are made on the GaAs substrate 11 as a body integrally, similarly to Example 24. It is easy to integrate the varactors diode chips 14' when the GaAs substrate 11 is used. The resistors can be made easily by forming GaAs resistors made by a diffusion process or thin film resistors made from tantalum nitride. The capacitors can be made easily by forming silicon nitride films, and the inductors can be made easily by forming a spiral metal pattern. By adopting this structure, the voltage controlled oscillator can be made more compactly than that of Example 25. The mounting of the chip components are not needed, and this makes mass production easy.

EXAMPLE 29

Figure 24:
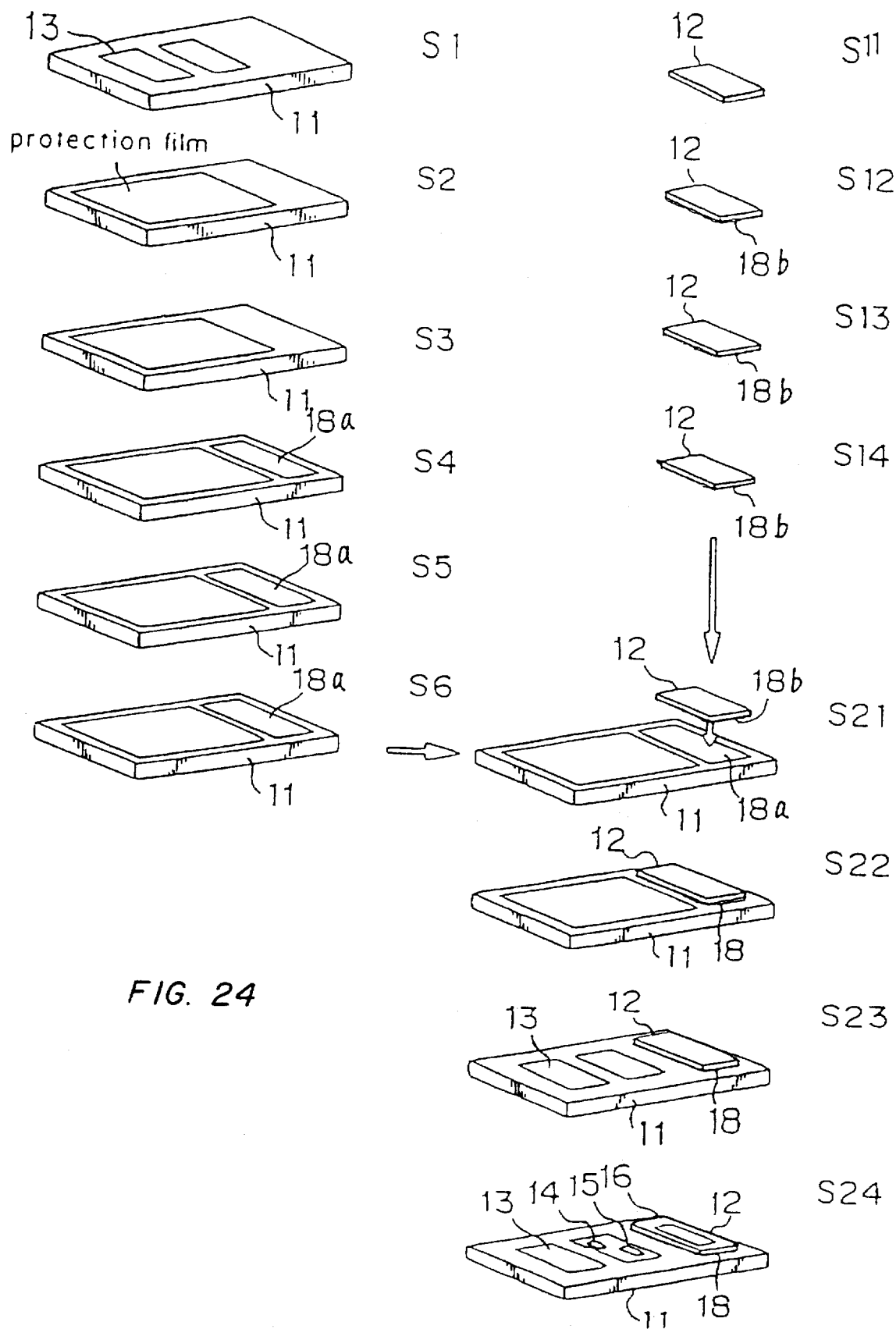
FIG. 24 illustrates the manufacture flow chart of Example 29 of the present invention.

An example of a manufacturing method of voltage controlled oscillator of the present invention is explained with reference to FIGS. 20 and 24.

First, one or more depressed areas are formed in prescribed positions on a GaAs substrate 11 with etching or the like, and a series of semiconductor process, including a diffusion process, necessary for a field effect transistor 13, varactor diodes 14 and the like is carried out at the heat treatment temperature for direct bonding or higher (step S1).

Next, a protection film is formed on the GaAs section which has been subject to the above-mentioned processes if necessary (step 52). The protection film is made of a metallic or oxide film which can resist the above-mentioned processes and can be finally removed. Then, the surface of a GaAs section used for the bonding later is cleaned thoroughly (step S3). Finally, the surface layer of GaAs is etched and removed with a fluoric acid etchant.

Then, a first silicon oxide thin film 18a is formed on the GaAs substrate 11 with a chemical vapor deposition process or the like (step S4). The film thickness of the silicon oxide film can be controlled easily about 0.1–3 μm.

The surface of the silicon oxide film 18a is cleaned with the buffered fluoric acid, and the surface is subjected to a hydrophilic treatment so as to make it hydrophilic (step S5).

On the other hand, the surface of the single crystalline piezoelectric substrate 12 is cleaned (step S11). Then, a second silicon oxide thin film 18b is also formed on the single crystalline piezoelectric substrate 12 with a chemical vapor growth process or the like (step S12). The thickness and the uniformity of the second silicon oxide film 18b can be controlled similarly to the first silicon oxide film.

The surface of the silicon oxide film 18 is cleaned with the buffered fluoric acid, and the surface is subjected to a processing to make it hydrophilic (Step S13).

Then, the surface of the first and second silicon oxide films 18a and 18b are cleaned sufficiently with pure water (steps S6 and S14). Next, the surface of the two silicon oxide films 18a and 18b are contacted uniformly immediately (step S21). Thus, the direct bonding between the GaAs substrate 11 and the single crystalline piezoelectric substrate 12 can be formed, through hydrogen bonds between hydroxyl groups on the surfaces of the silicon oxide films 18a and 18b. The as-formed direct bonding is sufficiently hard.

Furthermore, the direct bonding becomes harder by the heat treatment at 100°–800° C., preferably at 300°–600° C. (step S22). When the heat treatment temperature is high, the ranges of the shape, the size or the like of the single crystalline piezoelectric substrate 12 is limited somewhat due to the difference of the thermal expansion coefficients between the GaAs substrate 11 and the single crystalline piezoelectric substrate 12. However, the bonding strength can be improved essentially, without causing peel-off materials and damages, when the thickness and the area of the single crystalline piezoelectric substrate 12 are decreased with increase in the heat treatment temperature.

The effect of the heat treatment on the bonding strength is similar to Example 25. If the temperature is increased above 800° C., lithium atoms leave from the surface of lithium niobate or lithium tantalate. Thus, the surface characteristic is deteriorated and the prescribed performance as a surface acoustic wave resonator cannot be obtained. Therefore, the direct bonding temperature has to be 800° C. or lower when lithium niobate or lithium tantalate is used for the single crystalline piezoelectric substrate 2.

Next, the protection film is removed if it is formed in step S2 (step S23). Then, various processes such as electrode formation which are processed at temperatures below the heat treatment temperature for bonding. Then, electrodes are formed on the surface of the single crystalline piezoelectric substrate with vacuum deposition or the like, and then the metal pattern is formed with a conventional photolithography (step S24). The electrodes are made from aluminum, gold/chromium or the like. Thus, the structure of Example 27 can be manufactured by using a method similar to Example 25.

The direct bonding is possible even if a silicon oxide film 18 is formed only one of the substrates 11, 12, that is, only on the surface of the single crystalline piezoelectric substrate 12 or of the GaAs substrate 11. The direct bonding is also possible if the single crystalline piezoelectric substrate 12 is made from an oxide other than lithium niobate or lithium tantalate. Further, the direct bonding is also possible by using silicon oxide films when a III-V compound substrate other than GaAs substrate is used.

EXAMPLE 30

An example of a manufacturing method of voltage controlled oscillator is explained with reference to FIGS. 20 and 24. In this example, an amorphous silicon film is used for the film 18.

Similarly to Example 29, one or more depressed areas are formed in prescribed positions on a GaAs substrate 11 with etching or the like, and a series of semiconductor process, including a diffusion process, necessary for a field effect transistor 13, varactor diodes 14 and the like is carried out at the heat treatment temperature for direct bonding or higher (step S1). Next, a protection film is formed on the GaAs section which has been subjected to the above-mentioned processes if necessary (step S2). Then, the surface of a GaAs section used for bonding later is cleaned very much (step S3). In concrete, the surface layer of GaAs is etched and removed with a fluoric acid enchant.

Then, a first amorphous silicon thin film 18a is formed on the GaAs substrate 11 with a plasma chemical vapor deposition process or the like (step S4). The film thickness of the amorphous film is about 0.1–3 µm as in Example 29. The surface of the amorphous silicon film 18a is cleaned with the buffered fluoric acid, and the surface is subjected to a hydrophilic treatment make it hydrophilic (step S5).

On the other hand, the surface of the single crystalline piezoelectric substrate 12 is cleaned (step S11). Then, a second amorphous silicon thin film 18b of a thickness of 0.1–0.3 µm is also formed on the single crystalline piezoelectric substrate 12 with a plasma chemical vapor deposition process or the like (step S12). The surface of the amorphous silicon film 18b is cleaned with the buffered fluoric acid, and the surface is subjected to a processing to make it hydrophilic (step S13).

Then, the surfaces to the first and second amorphous oxide films are cleaned sufficiently with pure water (step S14). Next, the surfaces of the two amorphous silicon films 18a and 18b are contacted uniformly immediately (step S21). Thus, the direct bonding between the GaAs substrate 11 and the single crystalline piezoelectric substrate 12 can be formed through hydrogen bonds between hydroxyl groups on the surfaces of the amorphous silicon films 18a and 18b. The as-formed direct bonding is sufficiently hard.

Furthermore, steps S22–S24 are performed to form an electro-acoustic hybrid integrated circuit wherein the GaAs substrate 11 and the electro-acoustic element are integrated.

The direct bonding is possible even if an amorphous silicon film 18 is formed if only one of the substrates 11 and 12, that is, only on the surface of the single crystalline piezoelectric substrate 12 or of the GaAs substrate 11. The direct bonding is also possible if the single crystalline piezoelectric substrate 12 is made from an oxide other than lithium niobate or lithium tantalate.

EXAMPLE 31

Figure 25A:
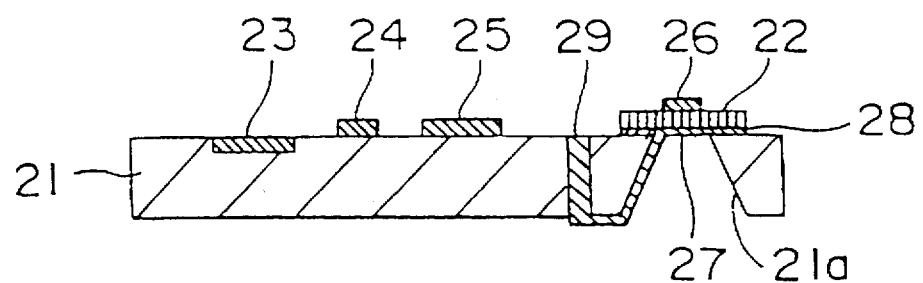
FIG. 25A is a sectional view of the structure of Example 31 of the present invention.
Figure 25B:
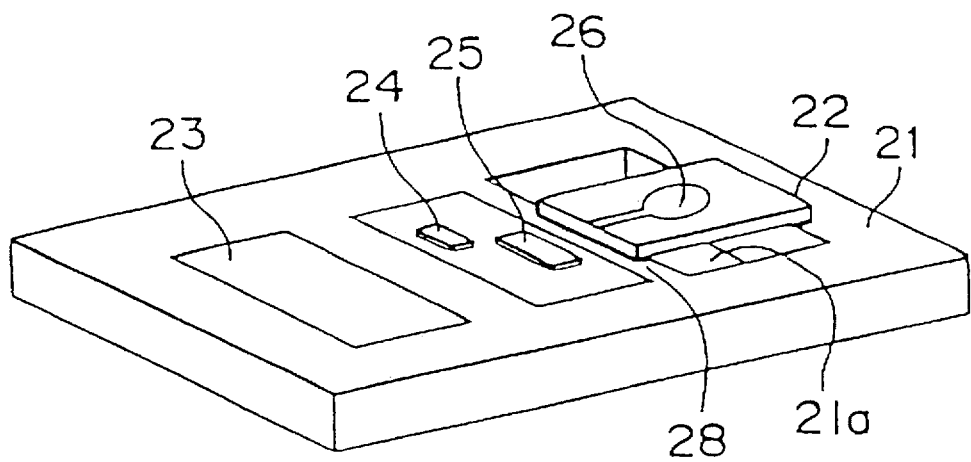
FIG. 25B is a perspective view of the structure of Example 31 of the present invention.

FIGS. 25A and 25B show an example of the structure of a voltage controlled oscillator of the present invention, wherein the reference numeral 21 denotes a GaAs substrate, the reference numeral 22 denotes a quartz oscillator bonded to the GaAs substrate 21, the reference numeral 23 denotes a transistor formed on the GaAs substrate 21, the reference numeral 24 denotes a varactor diode chip which changes the electrostatic capacitance with the applied voltage, the reference numeral 25 denotes passive chip components such as capacitors, inductors and resistors, the reference numeral 26 denotes an upper electrode of the quartz oscillator 22 and the reference numeral 27 denotes a lower electrode arranged at the back side of the quartz oscillator 22. A throughhole 21a is provided in the GaAs substrate 21 just below the quartz oscillator 22 in order to connect the lower electrode 27 to the back side of the quartz oscillator 22. The lower electrode 27 is connected electrically with the metal lines on the GaAs substrate 21 through a via-hole 29 (or a throughhole formed in the substrate 21, covered with a conductor on the inside of the throughhole, to connect both sides of the substrate 21 electrically) or the like. Further, the components of the GaAs substrate 21 and the two electrodes of the quartz oscillator 22 are connected to form a voltage controlled oscillator as shown in FIG. 25B. The reference numeral 28 denotes a silicon oxide film or a silicon film formed on the GaAs substrate 21 and/or on the quartz oscillator 22 (except an area in correspondence to the throughhole 21a) to bond the GaAs substrate 21 and the quartz oscillator 22 through direct bonding. Further, the voltage controlled oscillator is sealed in a closed container (not shown). The field effect transistor, the various electronics components and the quartz oscillator 22 constructs an oscillator shown in FIG. 2.

By adopting this structure the volume decreases to about a tenth the counterpart of a prior art structure wherein a quartz oscillator put in a container is used, while the weight also decreases to about a fifth the counterpart of the prior art structure.

In this Example, the GaAs substrate 21 and the quartz (a single crystal of silicon oxide) 22 are bonded through direct bonding by using the silicon oxide at the surface of the quartz itself and the silicon oxide or silicon films formed on the GaAs substrate and/or on the quartz, without using an ordinary bonding agent made from resin or the like. Thus, advantages similar to Example 25 can be obtained.

Figure 2:
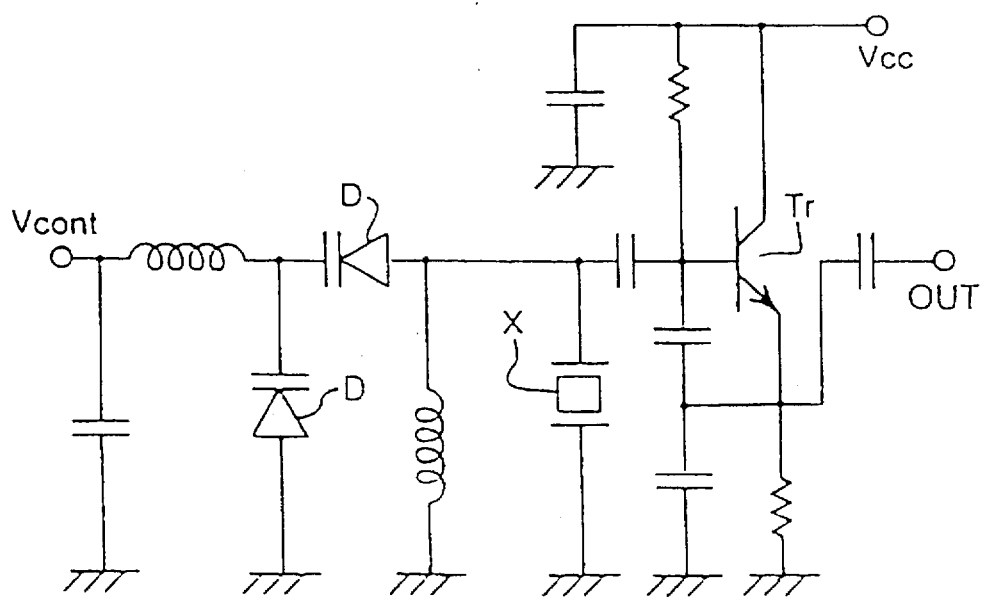
FIG. 2 is a circuit diagram of a voltage controlled oscillator with use of a quartz oscillator.

Other voltage controlled oscillator circuits different from that shown in FIG. 2 may also be used. The numbers of varactor diodes and other passive electronics components vary with each circuit, and the arrangement thereof on the semiconductor substrate is designed suitably for each case.

EXAMPLE 32

Figure 26A:
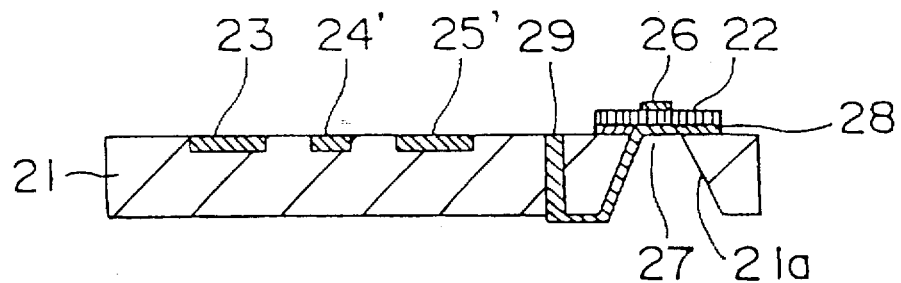
FIG. 26A is a sectional view of the structure of Example 32 of the present invention.
Figure 26B:
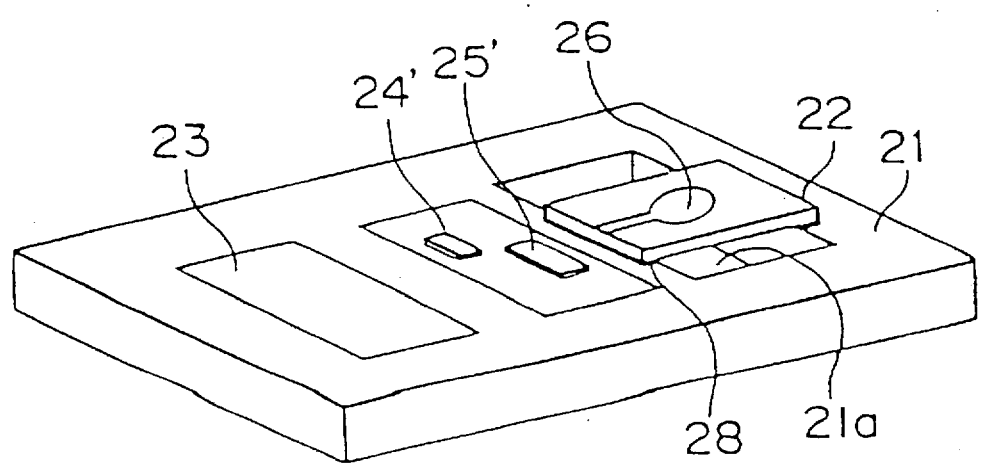
FIG. 26B is a perspective view of the structure of Example 32 of the present invention.

FIGS. 26A and 26B show an example of the structure of a voltage controlled oscillator of the present invention, wherein the reference numerals 21–23 and 26–29 denote the same as in Example 31. The reference numeral 24' denotes a varactor diode chip which changes the electrostatic capacitance with the applied voltage, and the reference numeral 25' denotes passive chip components such as capacitors, inductors and resistors. The lower electrode 27 is connected with the metal lines on the GaAs substrate 21 through a via-hole 29. Further, the components of the GaAs substrate 21 and the two electrodes of the quartz oscillator 22 are connected to form a voltage controlled oscillator. The voltage controlled oscillator constructed as explained above is sealed in a closed container (not shown).

This example is different from Example 31 in a point that the varactor diode chip 24' and the passive chip components 25' are integrated directly in the GaAs substrate 21 as in Example 28. By adopting this structure, the voltage controlled oscillator can be made more compactly than that of Example 31. The mounting of the chip components 24' and 25' are not needed, similarly to Example 28, and this makes mass production easy.

EXAMPLE 33

Figure 29:
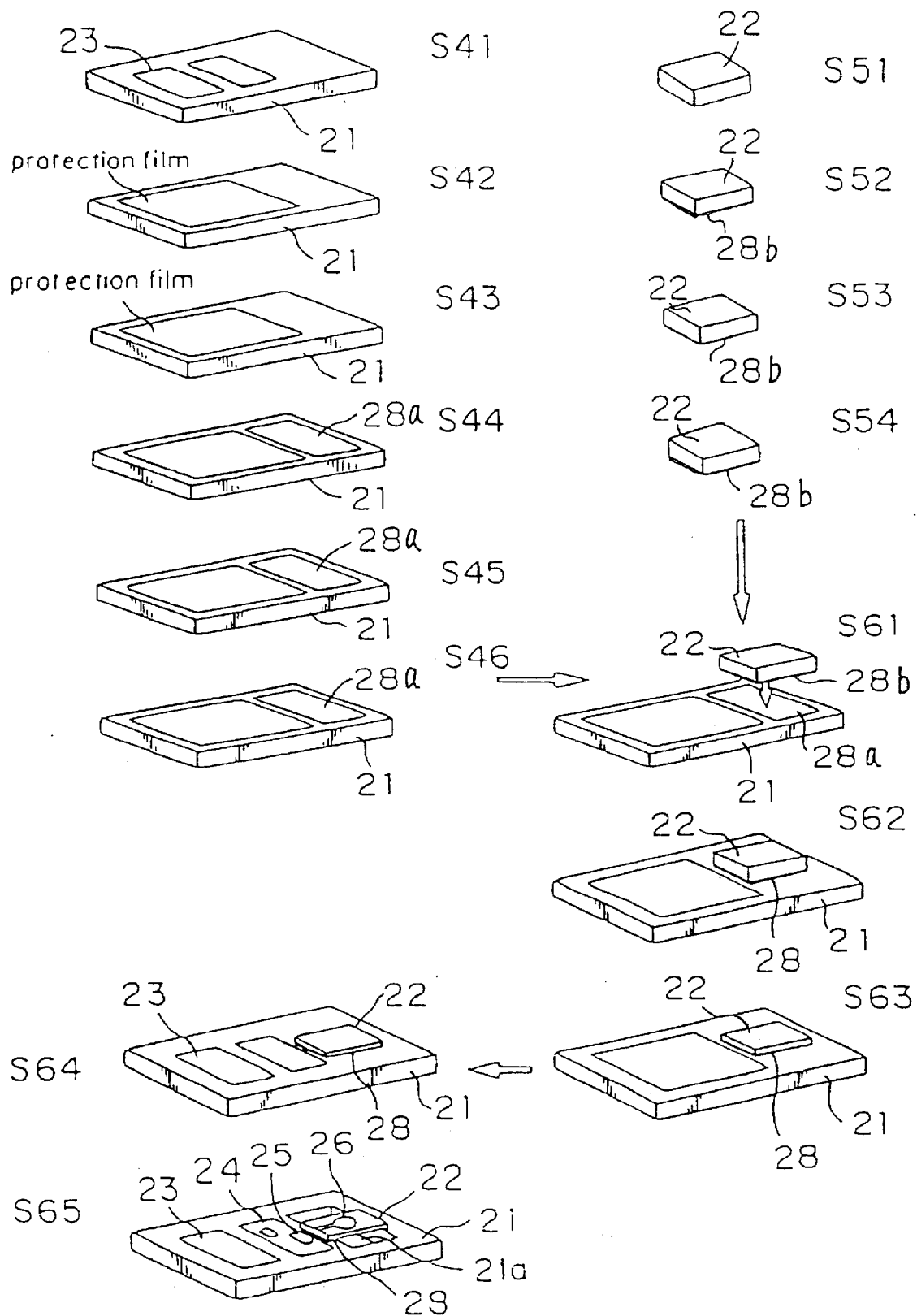
FIG. 29 illustrates the manufacture flow chart of Example 35 of the present invention.

An example of a manufacturing method of voltage controlled oscillator of the present example is explained with reference to FIGS. 27 and 29.

First, one or more depressed areas are formed in prescribed positions on a GaAs substrate 21 as an example of III–V compound semiconductor with etching or the like, and a series of semiconductor process, including a diffusion process, necessary for a field effect transistor 23, varactor diodes 24 and the like is carried out at the heat treatment temperature for direct bonding or higher (step S41). The diffusion process is performed usually at a temperature as high as 870° C. or higher.

Next, a protection film is armed on the GaAs section which has been subjected to the above-mentioned processes if necessary (step S42). The protection film is made of a metallic or oxide film which can resist the above-mentioned processes and can be removed finally. Then, the surface of a section for the direct bonding is cleaned very much (step S43). In concrete, the surface layer of GaAs is etched and removed with a fluoric acid etchant.

Then, a first silicon oxide thin film 28a is formed on an area on the GaAs substrate 21 with a chemical vapor growth process or the like (step S44). The film thickness of the silicon oxide and the uniformity of the films can be controlled easily for films of thickness of about 0.1–3 μm.

The surface of the silicon oxide film 28a is cleaned with the buffered fluoric acid, and the surface is subjected to a hydrophilic treatment to make it hydrophilic (step S45).

On the other hand, the surface of the quartz oscillator 22 is cleaned (step S51). Then, a second silicon oxide thin film 28b is also formed on the quartz oscillator 2 with a chemical vapor growth process or the like (step S52). The thickness and the uniformity of the second silicon oxide film 28b can be controlled similarly to the first silicon oxide film.

The surface of the silicon oxide film 28b is cleaned with the buffered fluoric acid, and the surface is subjected to a processing to make it hydrophilic (step S53).

Then, the surface of the first and second silicon oxide films 28a and 28b are cleaned sufficiently with pure water (steps S46 and S54). Next, the surfaces of the two silicon oxide films 28a and 28b are contacted uniformly immediately (step S61). Thus, the direct bonding between the silicon substrate 21 and the quartz oscillator 22 can be formed through hydrogen bonds between s hydroxyl groups on the surfaces of the silicon oxide films 28a and 28b. The as-formed direct bonding is sufficiently hard.

Furthermore, the bonding becomes harder by the heat treatment at 100°–860° C., preferably at 300°–600° C. (step S62). When the heat treatment temperature is high, the ranges of the shape, the size or the like of the quartz oscillator 22 is limited somewhat due to the difference of the thermal expansion coefficients between the silicon substrate 21 and the quartz oscillator 22. However, the bonding strength can be improved essentially, without causing peel-off materials and damages, when the thickness and the area of the quartz oscillator 22 are decreased with increase in the heat treatment temperature.

As to the effect of the heat treatment on the bonding strength, for example the heat treatment of one hour at 200° C. can increase the bonding strength several times, to several tens kg/cm$^2$. If the temperature is increased above 870° C., the crystal structure of quartz changes. Therefore, the bonding temperature has to be 860° C. or lower.

Then, if necessary, the quartz substrate is thinned as explained in Example 34 (step S63).

Next, a hole 21a is formed just below the quartz oscillator 22, and the silicon oxide film 28 exposed through the hole 21a etch away after the remaining part is covered with a resist or the like. Then, the resist and the protection film, if the protection film is formed in step S42, are removed (step S64). Then, various processes such as electrode formation which are processed at temperatures below the heat treatment temperature for bonding and below 860° C. Then, electrodes 23 and 24 are formed on the two surfaces of the quartz oscillator 22 with vacuum deposition or the like, and then the metal pattern is formed with a conventional photolithography (step S65). The electrodes are made from aluminum, gold/chromium or the like.

EXAMPLE 34

An example of a manufacturing method of voltage controlled oscillator is explained with reference to FIGS. 27 and 28.

Similar to Example 33, after at least an active element is formed on a prescribed recess, the bonding with a quartz plate 22 is performed (steps S61 and S62). Next, the quartz oscillator 22 is processed to decrease the thickness with polishing or etching (step S63). Thus, for example, a quart: substrate or initial thickness of 200 µm can be formed easily to have the thickness of 5 µm or less. If a precise etching process is used, the quartz plate can be made thin further to thickness of 1 µm. If quartz AT cut is used, the thickness of 1 µm makes it possible to oscillate at about 1.6 GHz of fundamental wave. Then, by performing processes (steps S64 and S65) similar to those of Example 33, a voltage controlled oscillator which integrates the GaAs substrate 21 and the quartz oscillator 22 can be produced.

Such a voltage controlled oscillator can oscillate at a frequency as high as 1.6 GHz which cannot be realized previously. Especially, if a GaAs substrate 22 is used, a transistor which operates at frequencies higher by several times than a silicon transistor, the thin quartz oscillator is very advantageous at a high fréquency region of 1 GHz or higher.

Further, if the frequency exceeds 1 GHz, the long metallic lines deteriorates the high frequency characteristic. However, the integration according to this Example can improves the performance.

EXAMPLE 35

An example of a manufacturing method of voltage controlled oscillator is explained with reference to FIGS. 27 and 29. In this example, an amorphous silicon thin film is used for direct bonding.

Similarly to Example 33, after at least an active element is formed on a prescribed recess, an amorphous silicon film is formed with plasma CVD or the like at least on the GaAs substrate as a bonding plane (step S44). The film thickness of the amorphous silicon is about 0.1–3 µm, similarly to Example 33. Then, the surfaces of the amorphous silicon film 28a and of the quartz oscillator 22 are made very clean (steps S45 and S53). The cleaning process is roughly similar to Example 33. The silicon surface is cleaned with an etchant of buffered fluoric acid. Then, the two surfaces are cleaned with pure water sufficiently and they are layered uniformly immediately (steps S46, S54 and S61). Thus, the direct bonding can be realized easily. Then, the bonding is enhanced by heat treatment. Next, the quartz plate can be thinned further if necessary with polishing or etching similarly to in Example 34. Then, by performing processes similar to those of Example 33 (steps S62–65), a voltage controlled oscillator which integrates the GaAs substrate and the quartz oscillator can be produced, and advantages similar to Examples 33 and 34 can be obtained. The direct bonding is possible at room temperature, and it can be carried out after all processes are completed.

The direct bonding is possible even if an amorphous silicon oxide film is formed only one of the substrates 21 and 22, that is, only on the surface of the quartz plate 22 or of the silicon substrate 21. A lithium niobate or lithium tantalate may also be used instead of the quartz oscillator.

As a silicon compound for the direct bonding, a silicon oxide is used in the examples mentioned above. Silicon oxide films prepared by a chemical vapor deposition process varies somewhat with the conditions of the deposition. Nitrogen atoms may also be included in a silicon oxide film. However, the direct bonding is possible in these cases.

In Examples 23 and 24, the lower electrode of the quartz crystal resonator is electrically connected onto the surface of the semiconductor substrate through the via-hole perforatedly provided therethrough. However, it may be structured so that the lower surface of the semiconductor substrate becomes a common ground electrode. In this case, the via-hole does not need to be provided.

In each example, the voltage controlled oscillator was exemplified as the preferred example, however, when a temperature compensated quartz crystal oscillator is to be taken as an example, it can be produced in the same way as already explained above and obtains the same effects as those shown above even if a temperature detection circuit and a control circuit for feeding the detected temperature back to a oscillating circuit are additionally provided to a circuit of each example as a chip component part. In addition, using the quartz crystal resonator as a resonance type frequency filter and structuring an amplification apparatus of a high-frequency receiving circuit can be obtained, which also can be obtained the same effects as those shown in the above-described examples. In other words, such effects as to be small in size and weight, high in performance and low in cost can be obtained.

Figure 4:
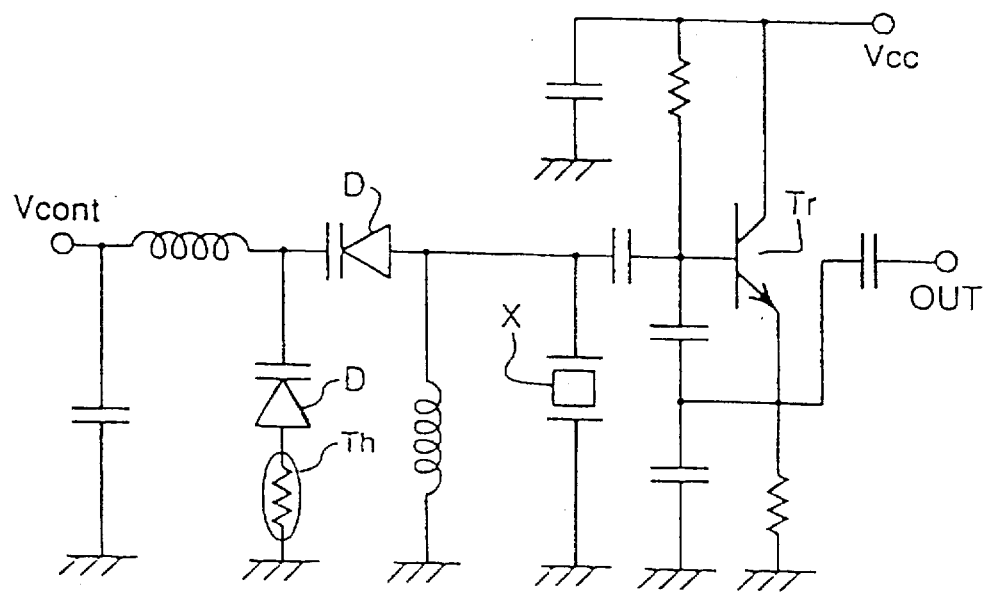
FIG. 4 is a circuit diagram of a temperature compensated crystal oscillator.

Though the above-mentioned examples relate to voltage controlled oscillators, it is apparent that the present invention can be applied not only to a voltage controlled oscillator but also to other electro-acoustic circuits such as a high frequency amplifier (FIG. 3) and a temperature compensated crystal oscillator (FIG. 4) by bonding an electro-acoustic element (F, X) directly to a semiconductor substrate for a transistor element.

The hybrid integrate circuits and the manufacturing methods of the examples have the advantages explained below.

Because fundamental elements of a transistor and an electro-acoustic element such as a surface acoustic wave resonator for generating oscillation are integrated as one body, the size and the weight of an electro-acoustic circuit can be reduced to a large extent.

Because a semiconductor substrate and an electro-acoustic element are bonded through direct bonding, the planar property is very good, and the submicron photolithography necessary for the setting of oscillation frequency can be used. Further, the reliability on heat and vibration can be improved to a large extent.

If polishing or etching processing of quartz is performed, the thickness can be decreased to 5 µm or less easily. Therefore, a voltage controlled oscillator of a fundamental wave in the submicrowave band (several hundreds MHz to several GHz) can be manufactured easily. Then, the voltage controlled oscillator will have better performance at a lower cost.

When the integration is performed on a GaAs substrate, the high frequency characteristic of a transistor made on a substrate can be improved several time than a case with use of a silicon transistor. Then, the performance as a voltage controlled oscillator can be extended to higher frequencies.

The direct bonding at room temperature is essentially possible, and the degree of freedom of the manufacturing processes is vary large. This is favorable for the mass production.

(2) The quartz devices such as quartz oscillators or filters, and methods of manufacture therefor, will now be described by way of example and with reference to the drawings.

EXAMPLE 36

Figure 30B:
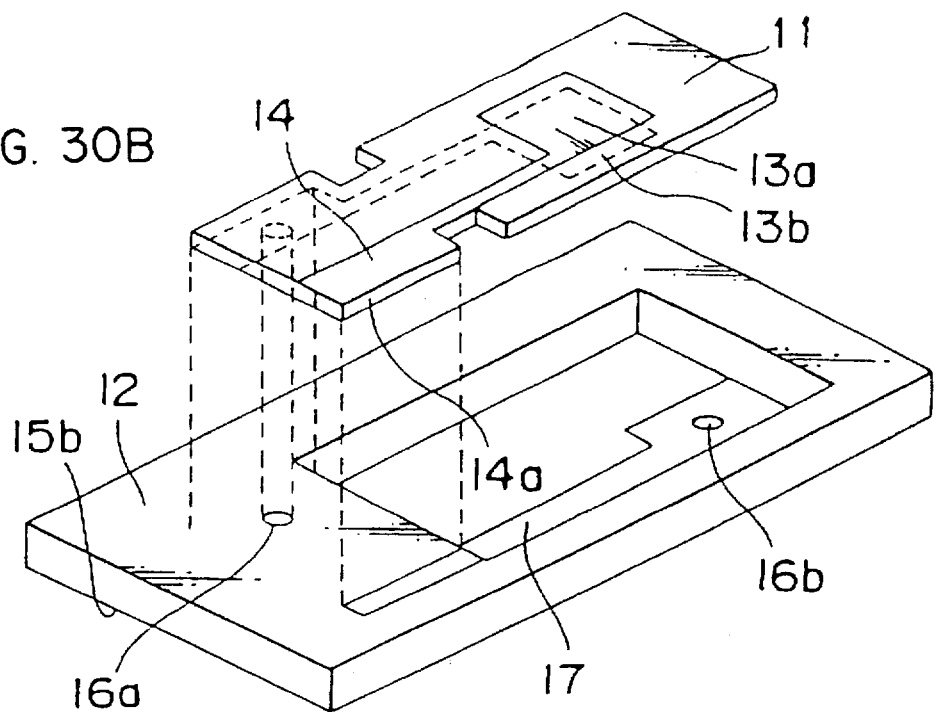
FIGS. 30b to 30d are an exploded view, a perspective view and a cross-sectional view, respectively, showing a modification of Example 36.

A quartz device according to Example 36 of the present invention is described below with reference to the accompanying figures, of which FIG. 30a is an external view of this quartz device. As shown in this figure, the quartz device comprises a quartz plate 11 made of single crystal quartz, holding member 12 made of quartz, excitation electrode 13a, runner electrode 14, and terminal 15a. A counter electrode 13b, such as shown in FIG. 30b, is provided on the opposite surface of the quartz plate 11. A runner electrode extends from the counter electrode 13b and is electrically connected to terminal 15b through a pin electrode extending through a through hole provided in holding member 12 in a manner similar to that shown in FIG. 30d.

In this example, the quartz plate 11 is an AT cut quartz blank measuring 40 μm thick, 3 mm long, and 2 mm wide. The holding member 12 is an H-shaped, AT cut quartz blank measuring 50 μm thick, 2 mm long, and 2 mm wide. Instead of AT cut, other cut, such as BT cut can be employed. The excitation electrode 13, runner electrode 14, and terminal 15 are each a 300 Å thick chrome vapor deposition film with a 3000 Å thick gold vapor deposition film coating.

The quartz plate 11 and the holding member 12 are attached at respective end portions by direct bonding in a manner that will not inhibit vibration of the quartz plate 11.

The direct bonding is further described below. Direct bonding is a technology in which a silicon substrate, quartz plate, or glass plate are directly bonded by means of covalent bonding between the atoms in the free (unbonded) crystal surface of one substrate and the atoms in the crystal surface of another substrate.

There are two ways of obtaining a directly bonded interface.

The first method uses hydrophilic groups on the substrate surfaces by first polishing, washing, and treating the surfaces of the silicon substrate and quartz plate (or other members if applicable) to form hydrophilic groups on the surfaces thereof. The surfaces are then placed in contact in a clean atmosphere and, thereafter, heat treated to obtain a strong bond. The present example is described below with respect to a manufacturing method using this first method. The adhesion strength of the direct bond interface obtained with this method is approximately several ten kgw/cm$^2$ in the initial stage when contact is made after hydrophilic group formation. This improves to several hundred kgw/cm$^2$ after heat treatment is applied. It is to be noted that the adhesion strength at the bonded interfaces is herein defined as "the limit value of the tensile stress at which the interfaces separate when tensile stress is applied perpendicular to the interface."

This bond is specifically formed as follows. After treating the substrates to be bonded to form hydrophilic groups on the surface, the substrates are bonded by the hydrogen bonds of the hydrophilic groups formed on the substrate surfaces and the hydrogen molecules at the adhesion interface during the initial bonding stage of simple contact between the substrate surfaces. The hydrogen molecules at this interface are removed by heat treatment, and the bond formed by the hydrogen molecules gradually changes to a strong covalent bond between the constituent atoms of the crystal. As a result of this direct bonding of the various members, adhesion strength is high, and no adhesives are used, resulting in strong resistance to heat treatment and vibration, and eliminating emission of unwanted gases often produced from adhesives.

The second method of obtaining a direct bond interface is anodic bonding. First, the silicon substrate and quartz plate are polished, cleaned, and placed in direct contact, and a voltage is then applied while heating the interface to bond the surfaces by electrostatic attraction. A quartz device with a direct bond interface and the same structure as that of the present embodiment manufactured with the first method described above was also obtained. As in the quartz device obtained with the first method, adhesion strength is high, and no adhesives are used, resulting in strong resistance to heat treatment and vibration, and eliminating emission of unwanted gases.

The temperature characteristics of the quartz device are determined by the cut angle of the quartz plate. In the case of an AT cut quartz plate, if the change (f−f0)/f0 in the frequency f at a given temperature relative to the frequency f0 at the reference temperature (normally 25° C.) is expressed as ppm, the change in frequency f is normally ±5 ppm in the temperature range from −20° C. to 70° C. However, in the case of a conventional quartz device, the actual temperature characteristic deteriorates because stress caused by temperature changes in the metallic holding member and conductive adhesive act on the quartz plate. In the case of a quartz device according to the present example of the invention, however, the holding member 12 bonded to the quartz plate 11 has a thermal expansion coefficient equal to that of the quartz plate 11. The frequency-temperature characteristic is therefore greatly improved because there is virtually no temperature change-induced stress acting on the quartz plate.

This improvement was demonstrated by comparing a quartz device according to this example with a conventional quartz device manufactured to the same shape as the present example (40 μm thick, 3 mm long, and 2 mm wide) with an excitation electrode evaporated on the quartz plate. An improvement of 12 ppm in the frequency-temperature characteristic through the range from −20° C. to 70° C. was observed with the quartz device of the invention. This improvement is a result of using a quartz with an equal thermal expansion coefficient as the holding member, and because thermal stress caused by a difference in the thermal expansion coefficients of the quartz and adhesive does not occur because an adhesive is not used.

It is to be noted that because quartz is an anistropic crystal, the thermal expansion coefficient will vary relative to the crystal axis. It follows that if the crystal axis of the quartz plate 11 is aligned with the crystal axis of the holding member 12, the thermal expansion coefficients of the quartz plate 11 and holding member 12 at the bond will be precisely matched, and stress from temperature changes will be zero, i.e., nonexistent. Because the quartz plate 11 can essentially be freely configured, a nearly ideal frequency-temperature characteristic can be obtained.

The improvement obtained by crystal axis alignment was further demonstrated by manufacturing a quartz device configured as described above but with the crystal axes of the quartz plate 11 and holding member 12 aligned prior to direct bonding. A further improvement of 2 ppm in the frequency-temperature characteristic through the range from −20° C. to 70° C. was observed when compared with the quartz device according to the invention described above, resulting in a 14 ppm improvement relative to the conventional quartz device.

It is to be noted that the use of direct bonding to hold the quartz plate in this example also results in improved mechanical strength determined by resistance to dropping and impact shock compared with quartz devices manufactured using a conductive or other type of adhesives. Because of the thermal stability of the direct bond interface, reliability with heating is improved. In addition, the long-term frequency stability after sealing in a housing is also improved because there are no unwanted gases released from a conductive adhesive.

It is to be further noted that while quartz is selected as the holding member material in this example the holding member shall not be so limited, and in principle any material with a thermal expansion coefficient equal to or nearly equal to the thermal expansion coefficient of quartz can also be used. One specific example of such a material is flint glass.

The thermal expansion coefficient of AT cut quartz plate is approximately $9 \times 10^{-6}$ in the greatest direction. The thermal expansion coefficient of a flint glass plate is $8.9 \times 10^{-6}$, or nearly equal to that of AT cut quartz plate. If a glass with a thermal expansion coefficient equal to or nearly equal to the thermal expansion coefficient of the quartz plate 11 is used as the holding member, there will be virtually no stress due to temperature change at the bond between the quartz plate 11 and the holding member. As a result, the same practical effects obtained by the present example can be obtained.

To demonstrate this, a quartz device shaped as described above but manufactured using a type of flint glass with a thermal expansion coefficient of $8.9 \times 10^{-6}$ as the material of the holding member 12 was prepared. An improvement of 10 ppm in the frequency-temperature characteristic through the range from $-20°$ C. to $70°$ C. was observed with this quartz device relative to the conventional quartz device. The additional benefits of lower cost and relatively simple processability, including etching, are also obtained with a glass holding member simply because the material is glass.

It is also not necessary for the holding member to be smaller than the quartz plate, and, for example, the quartz plate can be mounted on the holding member of a vessel shape, as will be explained in a modification below.

Modification of Example 36

Figure 30C:
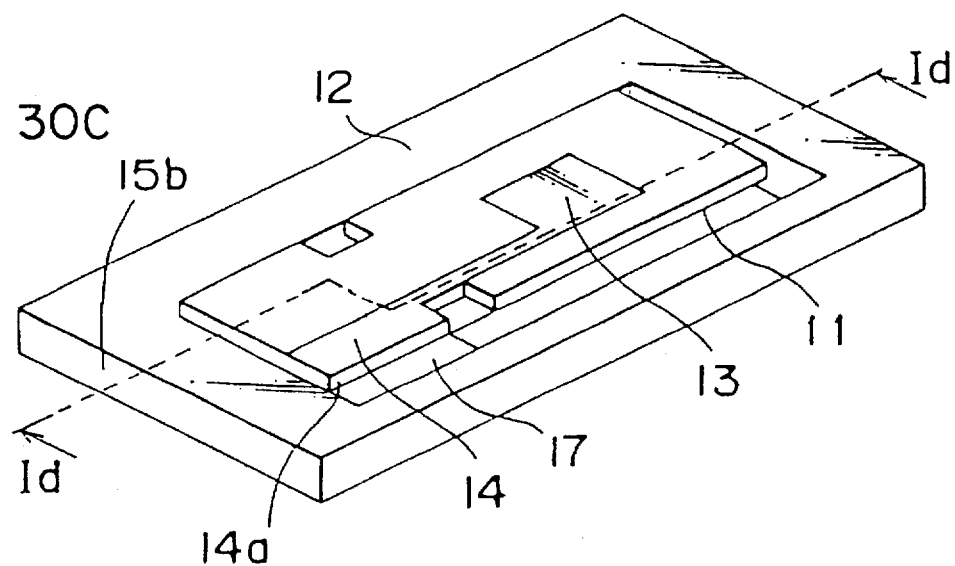
Figure 30D:
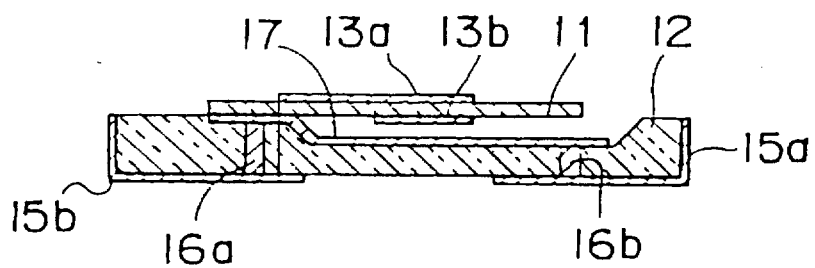
Figure 31A:
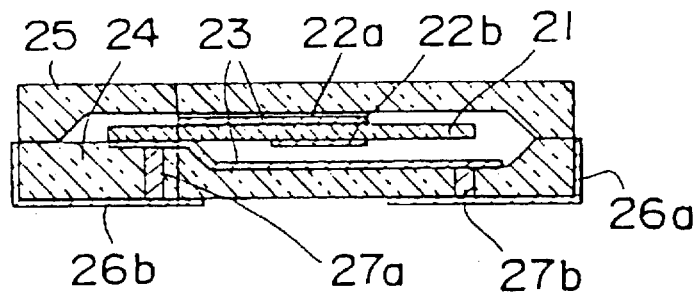
FIGS. 31a, 31b and 31c are a cross-sectional view, a perspective view without a cover substrate, and a perspective view with a cover substrate, respectively, showing a quartz device according to Example 37 of the invention.
Figure 31B:
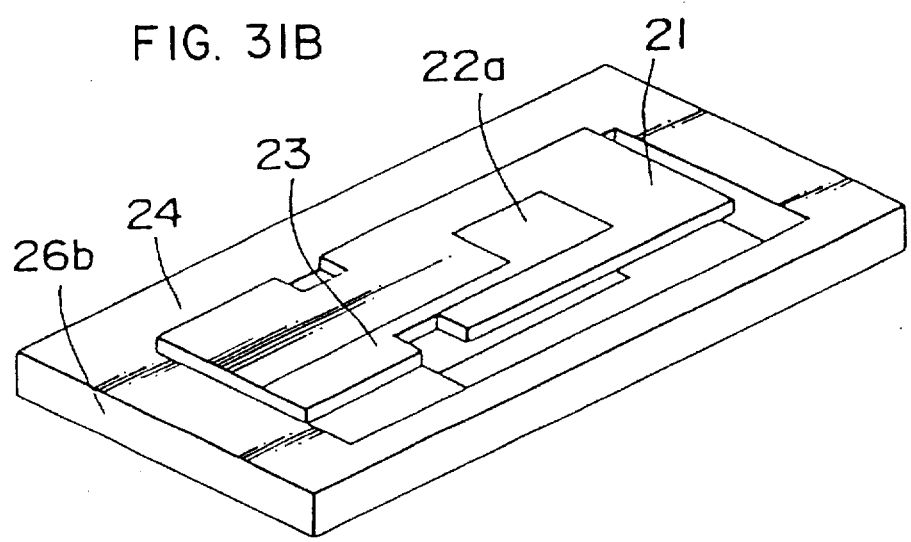
Figure 31C:
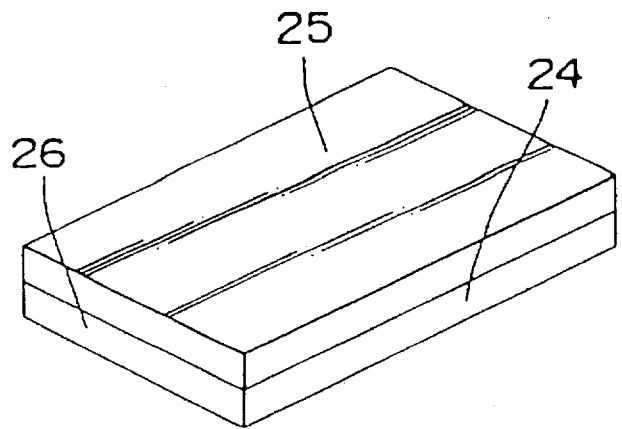

Referring to FIGS. 30b to 30d, a modification of Example 36 is shown. The device comprises quartz plate 11, vessel shaped holding member 12 having a recess at about the center thereof, excitation electrode 13a, runner electrode 14, terminal 15, and through holes 16. A counter electrode 13b is provided on the opposite surface of the quartz plate 11. A runner electrode also extends from the counter electrode 13b. The quartz plate 11 and holding member 12 are AT cut quartz plate, and the vessel shaped holding member 12 is sized sufficiently larger than the quartz plate 11 to enable placing of a cover member, such as shown in FIG. 31c, to form a practical airtight seal. The specific dimensions of the quartz plate 11 are 4 mm long and 2 mm wide, and the holding member 12 is 5 mm long and 3 mm wide with a recess depth of 0.5 mm. A portion of the quartz plate 11 is connected to the vessel shaped holding member 12 by direct bonding, and the major portion of the quartz plate 11 which is subject to the vibration hangs over the recess of the holding member 12.

The through holes 16a, 16b are pre-formed at suitable positions through the holding member 12 and used to provide electrodes to pass therethrough. Specifically, the excitation electrode 13b laminated on the lower surface of the quartz plate 11 is extended and is connected to an electrode passing through the through hole 16a and is further connected to terminal 15b, as best shown in FIG. 30d. Similarly, the excitation electrode 13a laminated on the upper surface of the quartz plate 11 is extended along runner electrode 14, and then to a side electrode 14a and further to another runner electrode 17. The electrode 17 is connected to an electrode passing through the through hole 16b and is further connected to terminal 15a, as shown in FIG. 30d.

Figure 31D:
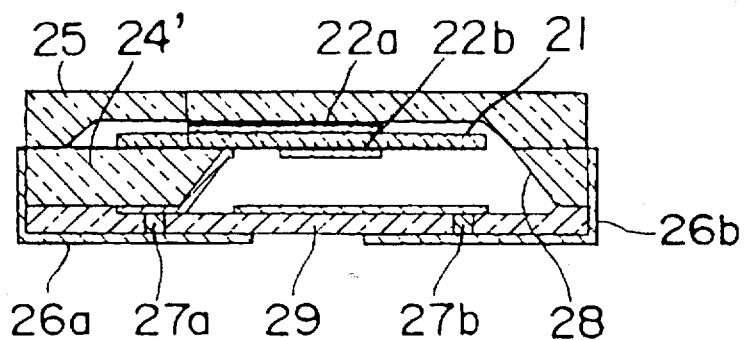
FIGS. 31d to 31f are a cross-sectional view, a perspective view without a cover substrate, and a perspective view with a cover substrate, respectively, showing a modification of Example 37.

Instead of the recess, it is possible to form an open through hole in the holding member 12, such as in a manner shown in FIG. 31d.

It will be obvious that the same effects described above are obtained with these devices. In addition, the new benefit of the quartz plate 11 becoming more resistant to damage is obtained because the quartz plate 11 is mounted on the holding member 12.

EXAMPLE 37

A quartz device according to Example 37 of the present invention is described below with reference to the accompanying FIGS. 31a to 31c. FIG. 31a is a cross-section view, FIG. 31b is an internal view, and FIG. 31c is an external view of the quartz device. As shown in FIGS. 31a to 31c, the quartz device comprises a quartz plate 21 made of quartz, holding member 24 made of quartz, excitation electrodes 22a and 22b, runner electrodes 23, cover substrate 25, terminals 26a and 26b, and through holes 27a and 27b.

In this example, the holding member 24 holds the quartz plate 21, and also functions as the housing substrate forming an airtight seal with the cover substrate 25. Preferably, both the holding member 24 and cover substrate 25 are made of quartz. The quartz plate 21 is directly bonded to the holding member 24, which has a recessed center, and the holding member 24 is directly bonded to the cover substrate 25, which also has a recessed center, thereby forming an airtight seal around the quartz device housed inside. As a result, thermal stress resulting from adhesion between the quartz plate 21 and a non-quartz material cannot act on the quartz plate 21. In addition, by pulling the runner electrode 23 to the outside through the through holes 27a and 27b, this construction also eliminates the use of adhesives in the quartz device.

Modification of Example 37

Figure 31E:
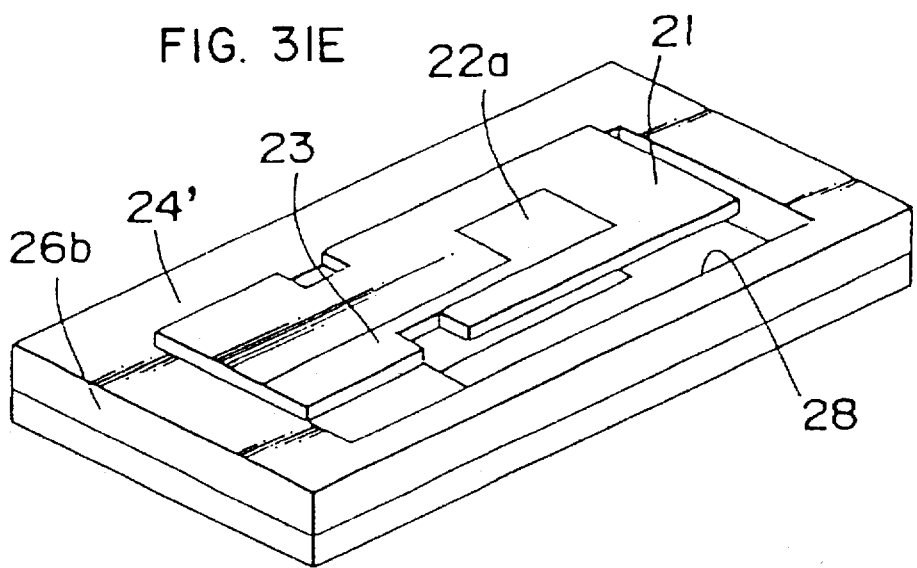
Figure 31F:
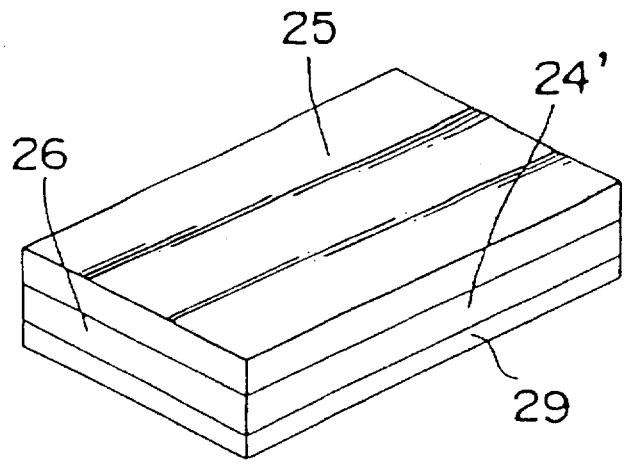

Referring to FIGS. 31d to 31f, a modification of Example 37 is shown.

When compared with the quartz device of FIG. 31a to 31c, the quartz device of this modification has a holding member 24' formed with an opening 28 at position where the recess was formed. Furthermore, a bottom substrate 29 made of quartz is provided. As shown in FIG. 31d, the edge of the holding member 24' connected to the quartz plate 21 has an acute angle so that the runner electrode extending from the excitation electrode 22b to the inner surface of the opening 28 can be deposited without any disconnection.

In addition to the benefits described with respect to Example 36 above, the additional benefit of making the overall size of this quartz device extremely small is also obtained by thus forming an airtight seal by direct bonding of the holding member and cover substrate. In a conventional quartz device using a quartz plate measuring 3 mm long by 1 mm wide, the overall size, including the housing, is 8 mm long and 4 mm wide, the maximum size reduction possible. Using a quartz plate of equal dimensions in the present embodiment, however, the overall quartz device size is only 5 mm long by 3 mm wide, less than 47% of the total area of the conventional quartz device. There are two reasons for this size reduction.

First, the space required to apply the adhesive in the conventional device is reduced to a small space by using direct bonding. Second, while a gap between the adhesive member and the vibrating member must be provided in the conventional quartz device to reduce the change in the oscillation frequency accompanying thermal stress resulting from the thermal expansion coefficient difference, thermal stress does not occur in this example as a result of direct bonding of materials with equal thermal expansion coefficients in this quartz device, and this gap can therefore be eliminated.

It is to be further noted that while quartz is selected as the material of the holding member and the cover substrate in this embodiment, these materials shall not be so limited, and in principle any material with a thermal expansion coefficient equal to or nearly equal to the thermal expansion coefficient of quartz can also be used for at least the material of the holding member.

To demonstrate this, a quartz device shaped as described above but manufactured using a type of flint glass with a thermal expansion coefficient of $8.9 \times 10^{-6}$ as the material of the holding member and the cover substrate was prepared. While the other effects of this example were obviously obtained, the additional benefits of lower cost and relatively simple processability, including etching, are also obtained because of the type of material used.

EXAMPLE 38

Figure 32A:
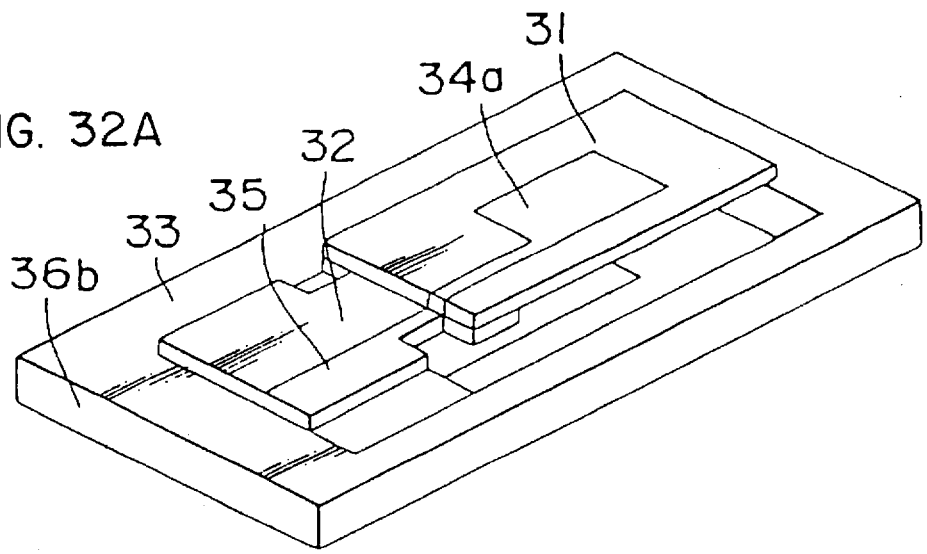
FIGS. 32a and 32b are perspective views showing a quartz device without and with a control circuit, respectively, according to Example 38 of the invention.
Figure 34A:
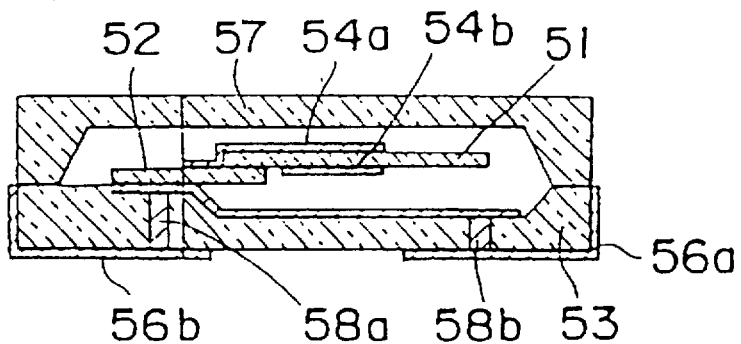
FIGS. 34a, 34b and 34c are a cross-sectional view, a perspective view without a cover substrate, and a perspective view with a cover substrate, respectively, showing a quartz device according to Example 40 of the invention.
Figure 34B:
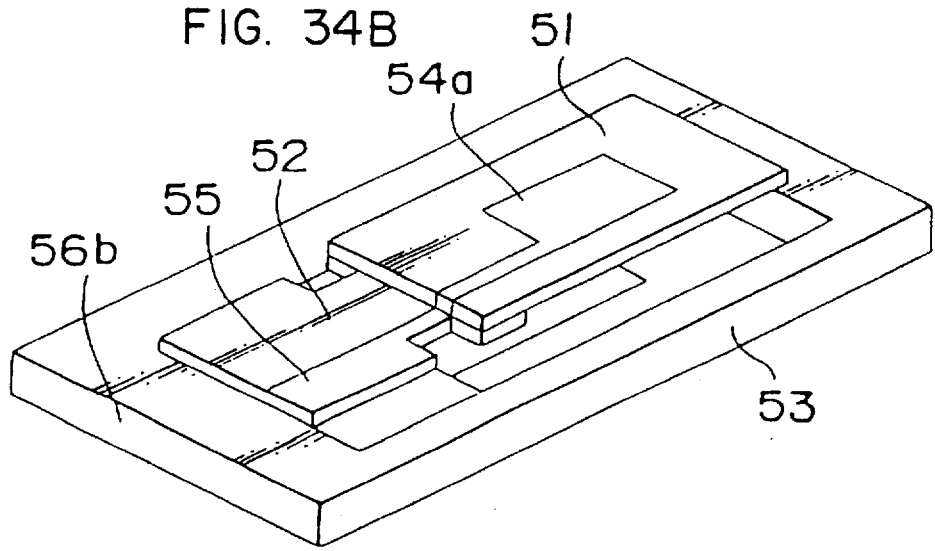
Figure 34C:
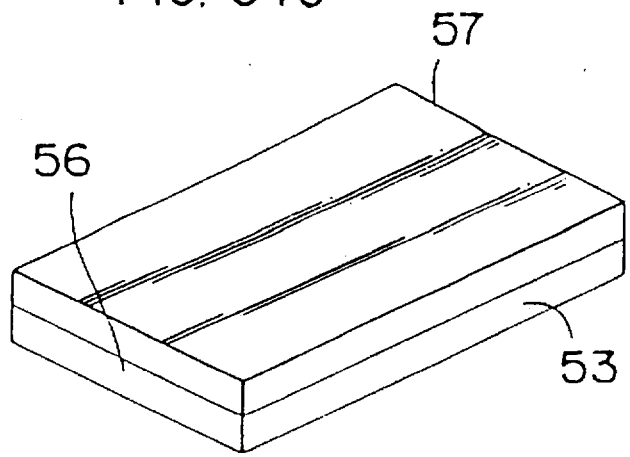

A quartz device according to Example 38 of the present invention is described below with reference to the accompanying figures, of which FIG. 32a is an external view of this quartz device. As shown in this figure, the quartz device comprises a quartz plate 31, holding member 32, vessel shaped housing substrate 33 having a recess at about the center thereof, excitation electrodes 34a and 34b, runner electrode 35, and terminals 36a and 36b. The vessel shaped housing substrate 33 is sized sufficiently larger than the quartz plate 31 to enable placing of a cover member, such as shown in FIG. 34c, to form a practical airtight seal. A portion of the quartz plate 31 is connected to a portion of holding member 32, and another portion of holding member 32 is connected to a portion of the vessel shaped housing substrate 33 adjacent the recess, and the major portion of the quartz plate 31 which is subject to the vibration hangs over the recess of the housing substrate 33. The connections between the portion of the quartz plate 31 and the portion of holding member 32, and between the portion of holding member 32 and the portion of the vessel shaped housing substrate 33 are done by direct bonding.

In this example, the holding member 32 is quartz and the housing substrate 33 is silicon. Part of the periphery of the quartz plate 31 is attached by direct bonding to the holding member 32 in a manner that will not inhibit vibration of the quartz plate 31, and the part of the holding member 32 to which the quartz plate 31 is not attached is connected to the housing substrate 33 by direct bonding. The excitation electrodes are connected to the terminals through the via holes as described in the alternative construction of Example 36 above.

The quartz plate 31, holding member 32, and housing substrate 33 are configured to inhibit the application of stress caused by ambient temperature changes from acting on the quartz plate 31. Specifically, the width of the holding member 32 is narrower than the width of the quartz plate 31.

Because both the quartz plate 31 and holding member 32 are quartz in this example, virtually no temperature change-related stress occurs at the bond between the quartz plate 31 and holding member 32. Stress due to the difference in the thermal expansion coefficients of the housing substrate 33 and quartz plate 31 is nearly all concentrated on the holding member 32, thus inhibiting the transmission of stress from the housing substrate 33 to the quartz plate 31. Change in the frequency due to stress caused by temperature changes can therefore be suppressed to an extremely low level, and the frequency stability characteristic of the quartz device is improved.

This improvement was demonstrated by comparing a quartz device according to this embodiment with a conventional quartz device manufactured to the same shape (3 mm long, and 1 mm wide) with an excitation electrode evaporated on the quartz plate. An improvement of 9 ppm in the frequency-temperature characteristic through the range from $-20°$ C. to $70°$ C. was observed with the quartz device of the invention.

The use of direct bonding to hold the quartz plate in this embodiment also results in improved mechanical strength determined by resistance to dropping and impact shock compared with quartz devices manufactured using a conductive or other type of adhesive. Because of the thermal stability of the direct bond interface, reliability with heating is improved. In addition, the long-term frequency stability after sealing in a housing is also improved because there are no unwanted gases released from a conductive adhesive.

Because this structure further comprises the holding member between the quartz plate and housing substrate, the quartz plate and housing substrate can be directly bonded through the holding member even when the thermal expansion coefficients of the quartz plate and housing substrate differ, and the new effect of a greater degree of freedom in the selection of housing substrate materials is obtained.

Figure 32B:
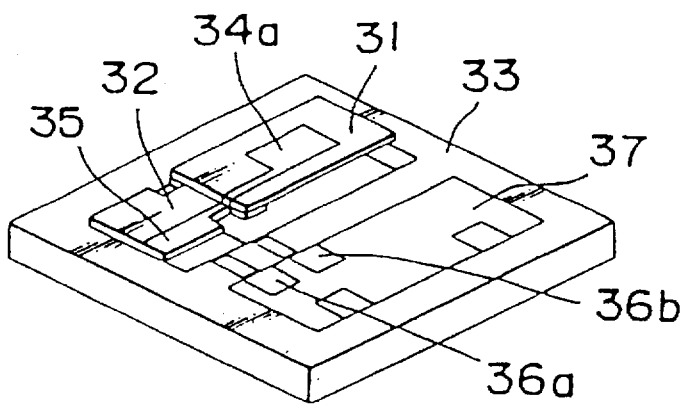

For example, if the housing substrate 33 is a semiconductor substrate, the circuitry for driving and controlling the quartz plate can be integrated in the device, and a single chip quartz oscillator, TCXO, VCXO, or other applied quartz device product can be manufactured. The external view of a single chip quartz oscillator is shown in FIG. 32b. This device comprises a quartz plate 31, holding member 32, housing substrate 33, excitation electrode 34, runner electrode 35, terminal 36, and control circuit 37, such as an IC circuit. By using a silicon housing substrate and forming the oscillation circuit in part of the housing substrate according to the present example, the quartz plate directly bonded to the housing substrate through the holding member can be oscillated by this oscillation circuit.

If the housing substrate 33 is a glass substrate, processing the housing substrate 33 is easier and the cost can also be reduced.

It is to be further noted that while quartz is selected as the holding member material in this example, the holding member shall not be so limited, and in principle any material with a thermal expansion coefficient equal to or nearly equal to the thermal expansion coefficient of quartz can also be used. This is as described in Example 36 above.

While the orientation of the crystal axes of the quartz in the quartz plate and holding member has not been discussed above, these crystal axes are preferably aligned as was described in Example 36 above.

EXAMPLE 39

Figure 33:
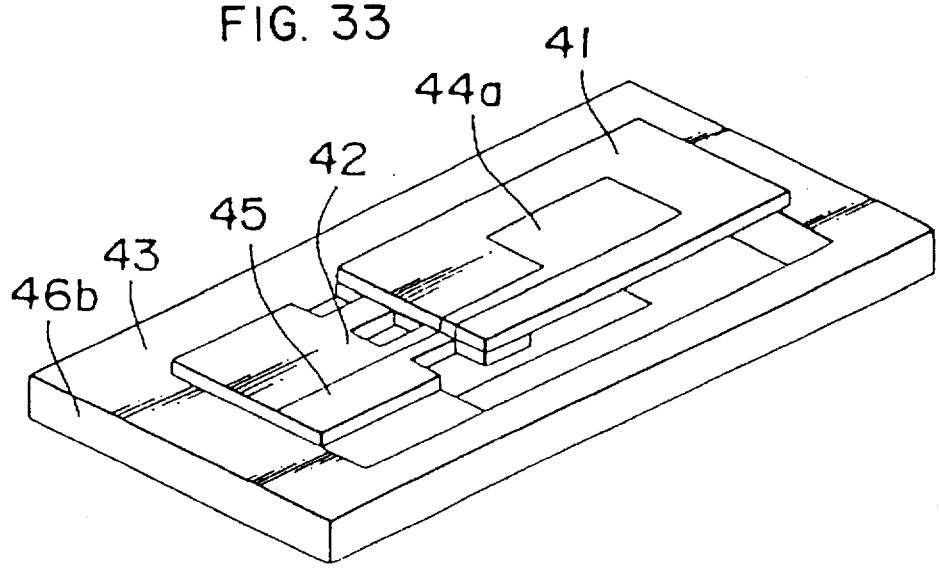
FIG. 33 is a perspective view of a quartz device according to Example 39 of the invention.

A quartz device according to Example 39 of the present invention is described below with reference to the accompanying figures, of which FIG. 33 is an external view of this quartz device. As shown in this figure, the quartz device comprises a quartz plate 41, holding member 42, housing substrate 43, excitation electrodes 44a and 44b, runner electrode 45, and terminals 46a and 46b.

In this example, the holding member 42 is quartz. The overall construction is the same as that of Example 38 except that the holding member 42 is processed to a shape enabling easier elastic deformation. Specifically, a recess is formed at approximately the middle of the part not directly bonded to the quartz plate 41 and housing substrate 43, and the quartz plate 41 is supported by two cross members. As a result of this construction, the stress due to a difference in the thermal expansion coefficients of the housing substrate 43 and holding member 42 is virtually all alleviated by deformation of the holding member 42, and virtually no stress is applied from the housing substrate 43 to the quartz plate 41. The effect of minimizing any change in oscillation frequency due to stress caused by temperature changes is further improved compared to Example 38, and the frequency stability characteristic is therefore further improved. A real improvement of 2 ppm in the frequency-temperature characteristic of this example compared with Example 38, and 11 ppm compared with the conventional quartz device, was observed.

It is to be further noted that while quartz is selected as the holding member material in this example, the holding member shall not be so limited, and in principle any material with a thermal expansion coefficient equal to or nearly equal to the thermal expansion coefficient of quartz can also be used. This is as described in Example 36 above.

While the orientation of the crystal axes of the quartz in the quartz plate and holding member has not been discussed with respect to this example, these crystal axes are preferably aligned as was described in Example 36 above.

EXAMPLE 40

A quartz device according to Example 40 of the present invention is described below with reference to the accompanying FIGS. 34a to 34c. FIG. 34a is a cross section, FIG. 34b is an internal view, and FIG. 34c is an external view of this quartz device. As shown in FIGS. 34a to 34c, the quartz device comprises a quartz plate 51, holding member 52, housing substrate 53, excitation electrode 54a and 54b, runner electrode 55, terminals 56a and 56b, cover substrate 57, and through holes 58a and 58b.

In this example, the holding member 52 is quartz. The quartz plate 51, holding member 52, housing substrate 53, excitation electrode 54 and other components are configured identically to those of the quartz device according to Example 38.

The quartz plate 51 and holding member 52, holding member 52 and housing substrate 53, and the housing substrate 53 and cover substrate 57, which has a recessed center, respectively, are directly bonded, thus forming an airtight seal around the inside of the quartz device. As a result, thermal stress resulting from adhesion between the quartz plate 51 and a non-quartz material cannot act on the quartz plate 51. In addition, by pulling the runner electrode 55 to the outside through the via holes 58, this construction also eliminates adhesives in the quartz device.

In addition to the benefits described with respect to Example 38 above, the additional benefit of making the overall size of this quartz device extremely small is also obtained by thus forming an airtight seal by direct bonding of the housing substrate and cover substrate. In a conventional quartz device using a quartz plate measuring 3 mm long by 1 mm wide, the overall size including the housing is 8 mm long and 4 mm wide, the maximum size reduction possible. Using a quartz plate of equal dimensions in the present example, however, the overall quartz device size is only 6 mm long by 3 mm wide, approximately 56% of the total area of the conventional quartz device.

It is to be further noted that while quartz is selected as the holding member material in this example, the holding member shall not be so limited, and in principle any material with a thermal expansion coefficient equal to or nearly equal to the thermal expansion coefficient of quartz can also be used. This is as described in Example 36 above.

In addition, if the housing substrate 53 is a semiconductor substrate, single chip applied quartz devices can be easily manufactured as described in Example 38 above. By additionally applying the present example, however, the size of the single chip applied quartz device can easily be made extremely small. A specific example is described in comparison to a TCXO.

In a conventional TCXO, the quartz oscillator and the circuit components controlling and driving the quartz oscillator are separately manufactured and assembled in a single housing to form the device. The size of a conventional TCXO is therefore typically 18 mm long, 13 mm wide, and 5 mm high. By integrating the quartz oscillator and the circuit components controlling and driving the quartz oscillator, and directly bonding the housing substrate and cover substrate according to the present example, however, the resulting device dimensions are 5 mm long, 4.5 mm wide, and 3 mm high, a mere 6% of the conventional device size.

If the housing substrate 53 and cover substrate 57 are additionally manufactured from a glass substrate, processing the housing substrate 53 and cover substrate 57 is easier, and the cost is further reduced.

While the orientation of the crystal axes of the quartz in the quartz plate and holding member has not been discussed with respect to this example, these crystal axes are preferably aligned as was described in Example 36 above.

In addition, while the seal of this quartz device is formed by the housing substrate, the invention shall not be so limited. This example can be easily applied to other electronic components to form a seal with the same effects.

EXAMPLE 41

Example 41 according to the present invention is described below with reference to FIGS. 35a to 35e, illustrating the steps for manufacturing the quartz device of the modification of Example 36 described above in connection with FIGS. 30b–30d. Shown in FIGS. 35a to 35e are the quartz plate 61 having plural rectangular projections, holding member bulk 62 having plural recesses at positions corresponding to the plural rectangular projections, excitation electrode 63, terminal 64, runner electrode 67, quartz wafer 65, and through holes 66.

In this manufacturing method, a 350 µm thick, 3 inch square AT cut quartz wafer is used for the quartz wafers 65 and for the holding member bulk 62.

Figure 35A:
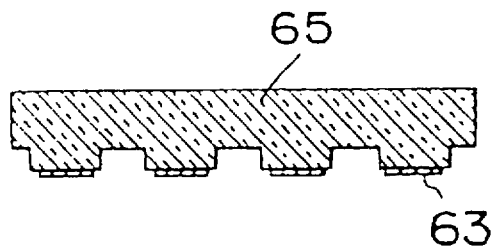
FIGS. 35a to 35e are cross-sectional views showing the steps for manufacturing the quartz device shown in FIGS. 30b to 30d.

The one quartz wafer 65 is mechanically lapped and etched to a 50 µm depth leaving plural rectangular projections 3 mm long and 1 mm wide which is a size equal to the size of the quartz plates 61. Thereafter, as shown in FIG. 35a, excitation electrode 63 and runner electrode are formed by vacuum vapor deposition of chrome and gold to a thickness of 200 Å and 500 Å, respectively.

For the direct bonding of holding member bulk 62 and the quartz wafer 65, the surface of the quartz wafer 65 is polished to a mirror finish. The polished surfaces are then treated to form hydrophilic groups using a solution of ammonia water, hydrogen peroxide, and water which are heated to 60° C., and then water washed. The surfaces are then carefully washed to remove any foreign matter on the contact surfaces of the quartz wafer 65 and holding member bulk 62. The holding member bulk 62 and the quartz wafer 65 are then placed in contact with each other with the surfaces still in a clean state so as to connect the quartz wafer 65 and the holding member bulk 62 by direct bonding effected between a portion of each of the rectangular projections and a portion adjacent each of the recesses. At this point, the holding member bulk 62 and the quartz wafer 65 are carefully positioned to make an electric contact between runner electrode and terminal 64 through the electrode provided in the through hole 66.

Figure 35B:
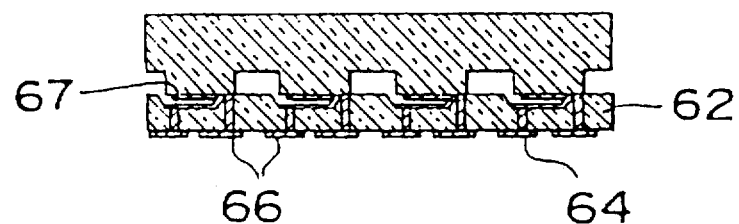

While a fairly high adhesion strength is obtained in this state alone, heat treatment is applied to increase the adhesion strength to a level permitting subsequent lapping (grinding). This state is shown in FIG. 35b.

It is to be noted that the crystal transition temperature of quartz is 870° C., and the piezoelectric properties of the quartz will be lost when the wafers cool to room temperature if the heat treatment temperature exceeds 870° C. The heat treatment temperature, therefore, cannot exceed 870° C. The heat treatment temperature is thus set at, for example, 500° C. in this example.

Figure 35C:
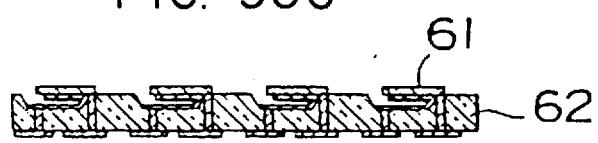

To separate the individual quartz plate 61, the quartz wafer 65 directly bonded to the holding member bulk 62 is lapped while holding the holding member bulk 62 to form the quartz plate 61, as shown in FIG. 35c.

Figure 35D:
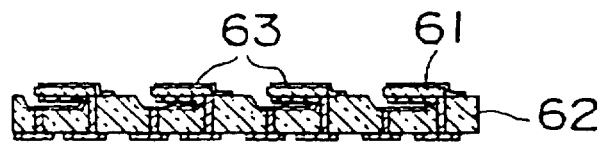

The excitation electrode 63 and runner electrode are then formed on the quartz plate 61. The excitation electrodes 64 and runner electrodes 65 are formed by vacuum vapor deposition of chrome and gold to a thickness of 200 Å and 500 Å, respectively. This is shown in FIG. 35d.

Figure 35E:

The holding member bulk 62 is then cut to separate the holding members, resulting in the quartz device structure described in the modification of Example 36 above. This is shown in FIG. 35e.

The quartz plate 61 and holding member bulk 62 can be processed to extremely precise dimensions by applying such semiconductor manufacturing technologies as photolithography and etching, resulting in an extremely small, high precision, high performance quartz device.

In addition, while quartz is selected as the material of the holding member in this example, this material shall not be so limited, and in principle any material with a thermal expansion coefficient equal to or nearly equal to the thermal expansion coefficient of the quartz plate can also be used for the material of the holding member as was described in Example 36 above.

The heat treatment temperature of the direct bonding process above was also described as being 500° C., but the invention shall not be so limited. The adhesion strength was investigated in the temperature ranges of 100°–350° C., 350°–500° C., 500°–570° C., and 570°–860° C. Because the adhesion strength increases as the heat treatment temperature rises, an appropriate heat treatment temperature within the temperature range retaining the piezoelectric properties of the quartz after heat treatment can be selected.

While a quartz plate measuring 3 mm by 1 mm is used in the above description, it will be obvious that applying the construction of the present invention to smaller quartz devices will obtain quartz devices with higher stability than that of quartz devices manufactured using the conventional holding method.

While the crystal orientation of the quartz plate and holding member has not been discussed above, the thermal expansion coefficients of the quartz plate and holding member will be identical if the crystal axes of these members are precisely aligned, and an ideal frequency-temperature characteristic can be obtained as was described in Example 36 above.

According to Example 41 described above, it is possible to eliminate the step of treating the polished surfaces to form hydrophilic groups using a solution of ammonia water, hydrogen peroxide, and water which are heated to 60° C., but instead inserting the step of heating the holding member bulk 62 and the quartz wafer 65 in a $5\times10^{-5}$ torr vacuum while applying 300 volts between the holding member bulk 62 and the quartz wafer 65. When such a voltage is applied between the holding member bulk 62 and the quartz wafer 65, an electric attractive force caused by the electric charge holds the member bulk 62 and wafer 65 tightly together to effect the direct bonding between the member bulk 62 and wafer 65. For applying 300 volts, the holding member bulk 62 may be held at the ground level and −300 volts may be applied to the quartz wafer 65.

EXAMPLE 42

Example 42 according to the present invention is described below with reference to FIGS. 36a to 36f, illustrating the steps for manufacturing the quartz device of Example 38 described above in connection with FIG. 32a. Shown in FIGS. 36a to 36f are the quartz plate 71, holding member 72, housing substrate bulk 73, excitation electrode 74, runner electrode 75, terminal 76, quartz wafers 77, 78, and through holes 79. Each of the quartz wafers 77, 78 has plural rectangular projections, and the housing substrate bulk 73 has plural recesses at positions corresponding to the plural rectangular projections. In this example, quartz wafer 78 serves as a holding member bulk.

In this manufacturing method, a 350 µm thick, 3 inch square AT cut quartz wafer is used for the quartz wafers 77, 78, and a 3 inch square, 450 µm thick p-silicon single crystal wafer with a crystal face azimuth of 100 is used for the housing substrate bulk 73.

The one quartz wafer 77 is mechanically lapped and etched to a 50 µm depth leaving plural rectangular projections 3 mm long and 1 mm wide which will be a size equal to the size of the quartz plates 71. The other quartz wafer 78 is similarly mechanically lapped and etched leaving plural rectangular projections which will be a size equal to the size of the holding members 72. The surfaces, particularly the surfaces of the rectangular projections, of the quartz wafers 77, 78 are polished to a mirror finish.

The polished surfaces are then treated to form hydrophilic groups using a solution of ammonia water, hydrogen peroxide, and water which are heated to 60° C., and then water washed. The surfaces are then carefully washed to remove any foreign matter on the rectangular members' contact surfaces which will serve as the quartz plates 71 and holding members 72. The quartz wafers 77, 78 are then placed in contact with each other with the surfaces still in a clean state. While a fairly high adhesion strength is obtained in this state alone, heat treatment at about 500° C. is applied to increase the adhesion strength to a level permitting subsequent lapping. This state is shown in FIG. 36a. Here, the positions of the quartz wafers 77, 78 are adjusted so that only a portion of the rectangular projections' surface of quartz wafer 77 contact a portion of the rectangular projections' surface of quartz wafer 78.

The quartz wafer 78, i.e., the holding member bulk, is lapped while holding the quartz wafer 77 to form the holding members 72. Then excitation electrodes 74 and runner electrodes 75 are formed on the quartz wafer 77 and holding members 72 by vacuum vapor deposition of chrome and gold to a thickness of 200 Å and 500 Å, respectively. This is shown in FIG. 36b.

To directly bond the housing substrate bulk 73 with the holding member 72, the upper surface of the housing substrate bulk 73 is polished to a mirror finish. The polished surfaces are then treated to form hydrophilic groups using a solution of ammonia water, hydrogen peroxide, and water which are heated to 60° C., and then water washed. The runner electrodes 75, via holes 79, and terminals 76 are pre-formed in the housing substrate bulk 73. The surfaces of the housing substrate bulk 73 and the holding members 72 formed on the quartz wafer 77 are then carefully washed to remove any foreign matter. The surfaces of the housing substrate bulk 73 and the holding members 72 formed on the quartz wafer 77 are then contacted with the surfaces still in a clean state. At this point, the holding members 72 and the housing substrate bulk 73 are carefully positioned to make an electric contact between runner electrode 63 and terminal 76 through the electrode provided in the through hole 79.

While a fairly high adhesion strength is obtained in this state alone, heat treatment is applied to increase the adhesion strength to a level permitting subsequent lapping. This state is shown in FIG. 36c. It is to be noted that the heat treatment temperature cannot exceed 870° C. for the reason described above. In addition, a sudden temperature difference also cannot be applied because the thermal expansion coefficients of silicon and quartz differ. The heat treatment temperature is thus set at, for example, 500° C. in this example.

The quartz wafer 77 held by the holding members 72 directly bonded to the housing substrate bulk 73 is then lapped by holding the housing substrate bulk 73 to separate each of the quartz plates 71. This is shown in FIG. 36d.

The excitation electrodes 74 are formed at approximately the center of the quartz plates 71 on the quartz wafer 77. The runner electrode members are also formed at the same time by vacuum vapor depositions of chrome and gold to a thickness of 200 Å and 500 Å, respectively. This is shown in FIG. 36e.

The housing substrate bulk 73 is cut to produce separate housing substrates, resulting in the quartz device structure described in example above. This is shown in FIG. 36f.

The quartz plate 71, holding member 72, and housing substrate bulk 73 can be processed to extremely precise dimensions by applying such semiconductor manufacturing technologies as photolithography and etching, resulting in an extremely small, high precision, high performance quartz device.

In addition, while quartz is selected as the material of the holding member in this example, this material shall not be so limited, and in principle any material with a thermal expansion coefficient equal to or nearly equal to the thermal expansion coefficient of the quartz plate can also be used for the material of the holding member as was described in Example 36 above. Furthermore, semiconductor is selected as the material of the housing substrate bulk 73 so that it is possible to provide integrated circuits on the housing substrate bulk 73, resulting in quartz devices such as shown in FIG. 32b.

The heat treatment temperature of the direct bonding process above was also described as being 500° C., but the invention shall not be so limited, and other temperature, such as 400° C. can be used.

According to Example 42 described above, the step of treating the polished surfaces to form hydrophilic groups using a solution of ammonia water, hydrogen peroxide, and water which are heated to 60° C., is presented immediately before effecting the direct bonding between quartz wafers 77 and 78 and between holding member 72 and housing substrate bulk 73. It is to be noted that each such step can be replaced by the step of heating the members to be directly bonded in a $5 \times 10^{-5}$ torr vacuum while applying 300 volts between these two members.

For applying 300 volts, the quartz wafer 78 may be held at the ground level and −300 volts may be applied to the quartz wafer 77 in the first instance; and the housing substrate bulk 73 may be held at the ground level and −300 volts may be applied to the holding member 72 in the second instance.

(3) The piezoelectric filters, and methods of manufacture therefor, will now be described by way of example and with reference to the drawings.

EXAMPLE 43

Figure 37:
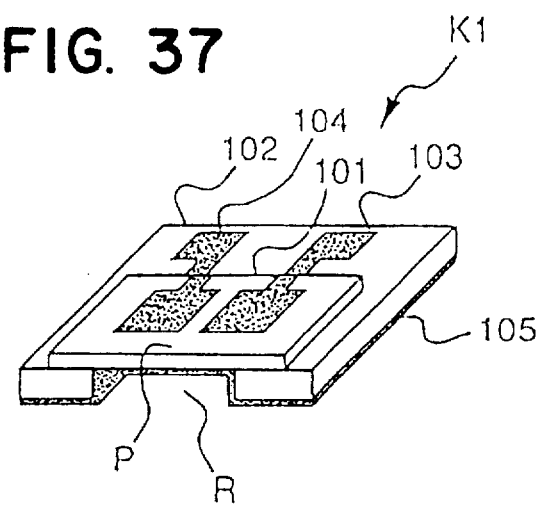
FIG. 37 is a perspective view of a piezoelectric filter according to Example 43 of the present invention.

Referring to the drawings, there is shown in FIG. 37, a piezoelectric filter K1 according to Example 43 of the present invention. The piezoelectric filter K1 includes an oscillatory AT-CUT quartz substrate 101 acting as a piezoelectric substrate, a glass substrate 102 for holding the quartz substrate 101, an input electrode 103, an output electrode 104 and an earth electrode 105. The quartz substrate 101 is bonded to the glass substrate 102 by direct bonding. The input and output electrodes 103 and 104 are provided on upper faces of the quartz substrate 101 and the glass substrate 102, while the earth electrode 105 is provided on lower faces of the quartz substrate 101 and the glass substrate 102. The glass substrate 102 is formed with a recess R, while the quartz substrate 101 has an oscillatory portion P confronting the recess R.

Figure 39:
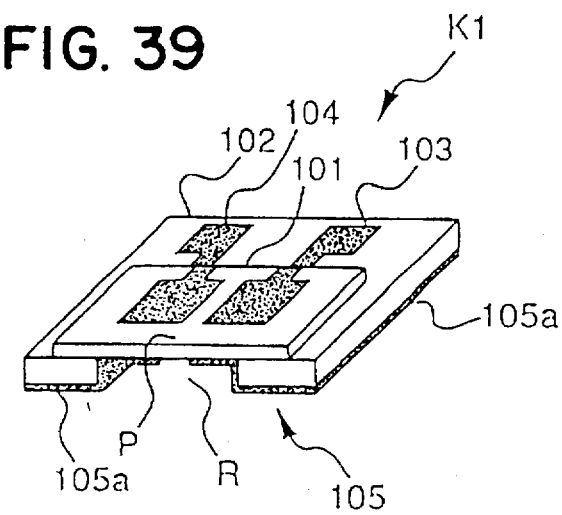
FIG. 39 is a perspective view of a variation of the piezoelectric filter of FIG. 37, in which an earth electrode is divided into a pair of earth electrodes.

As shown in FIG. 39, in the piezoelectric filter K1, the earth electrode 105 may also be divided into a plurality of, for example, a pair of earth electrodes 105a.

Furthermore, in this example, quartz is used for the piezoelectric substrate but may also be replaced by any one of lithium tantalate, lithium niobate and lithium borate.

Figure 38:
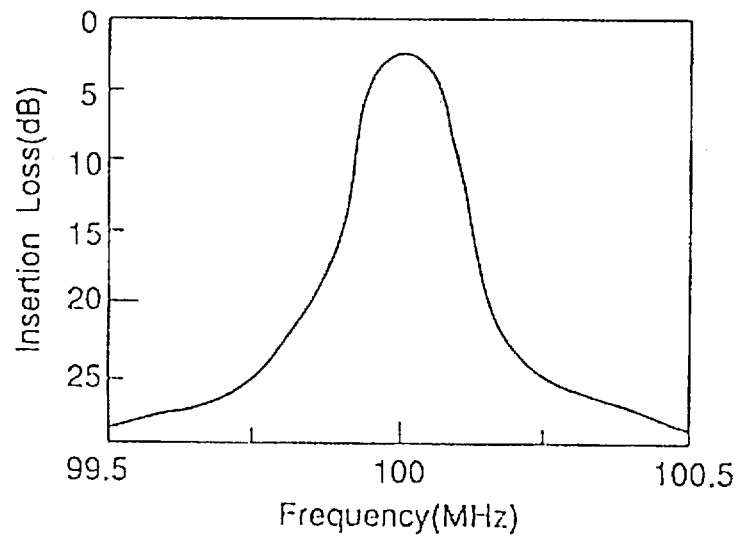
FIG. 38 is a graph showing characteristics of the piezoelectric filter of FIG. 37.

The piezoelectric filter K1 of the above described arrangement has characteristics shown in FIG. 38. As shown in FIG. 38, the piezoelectric filter K1 has a central frequency of 100 MHz, which has been so far difficult to obtain in a known piezoelectric filter.

Figure 40:
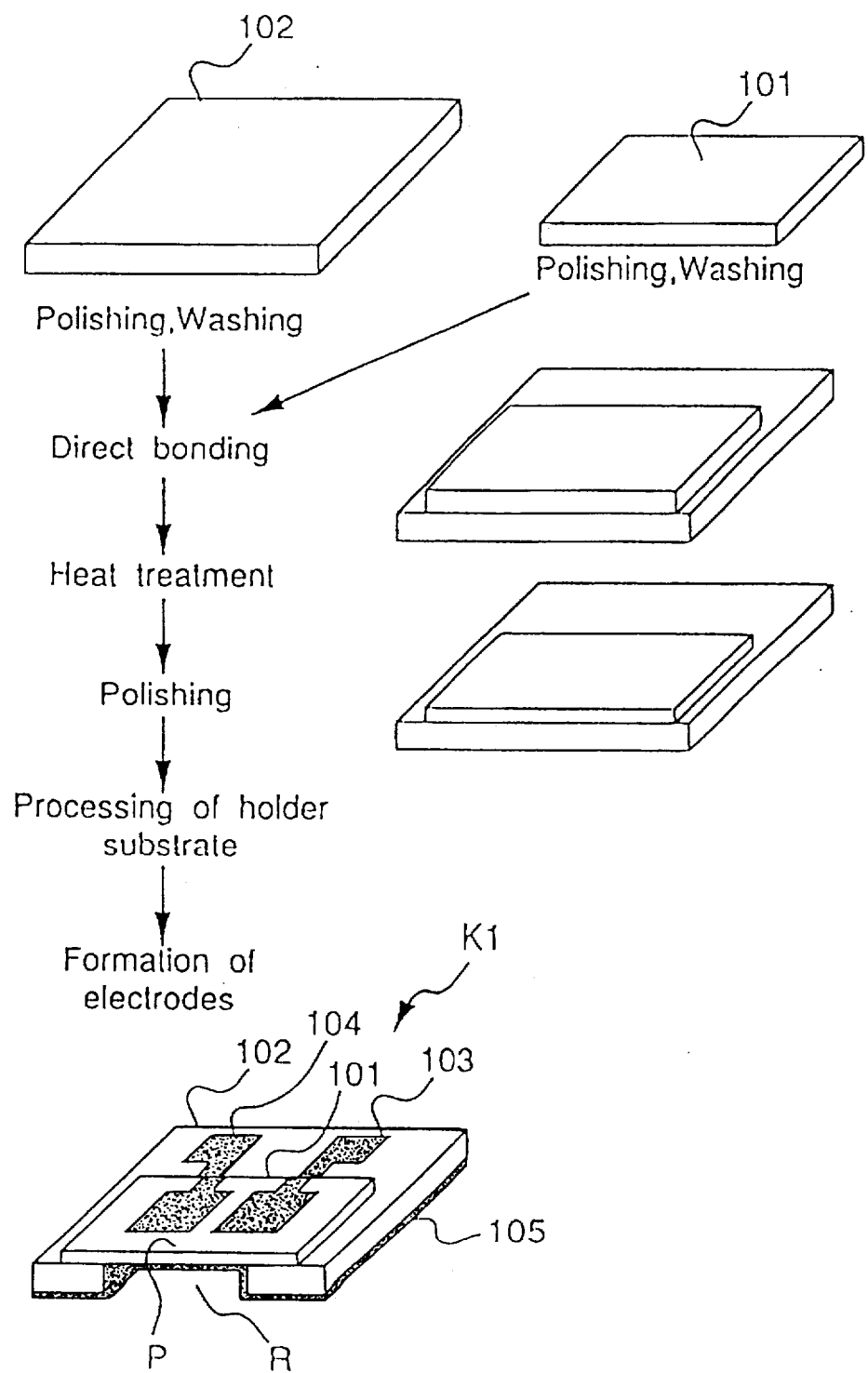
FIG. 40 is a view showing production steps of the piezoelectric filter of FIG. 37.

FIG. 40 shows production steps of the piezoelectric filter K1. The quartz substrate 101 and the glass substrate 102 are initially polished and washed. Then, the quartz substrate 101 and the glass substrate 102 are subjected to a hydrophilic treatment by using hydrophilic liquid so as to be bonded to each other by direct bonding. At this time, the quartz substrate 101 and the glass substrate 102 are already bonded to each other. However, since this bonding strength is quite small, the quartz substrate 101 and the glass substrate 102 can be neither secured to each other nor processed. Thus, in order to increase the bonding strength, the quartz substrate 101 and the glass substrate 102 are heat treated at a predetermined temperature which should be lower than a temperature leading to loss of piezoelectric property of the piezoelectric substrate 101 and a softening point of the glass substrate 102. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. On the other hand, glass used for the glass substrate 102 has a softening point of 450° C. Thus, the predetermined temperature is set at 300° C. By this heat treatment step, the quartz substrate 101 and the glass substrate 102 are securely bonded to each other without using adhesive. Then, the quartz substrate 101 is polished so as to adjust its thickness. Subsequently, in order to produce the oscillatory portion P of the quartz substrate 101, a portion of the glass substrate 102, which confronts the oscillatory portion P, is removed by etching and thus, the recess R is obtained. Then, the signal electrodes 103 and 104 and the earth electrode 105 are produced by depositing chromium and gold, respectively and photolithography.

Figure 41:
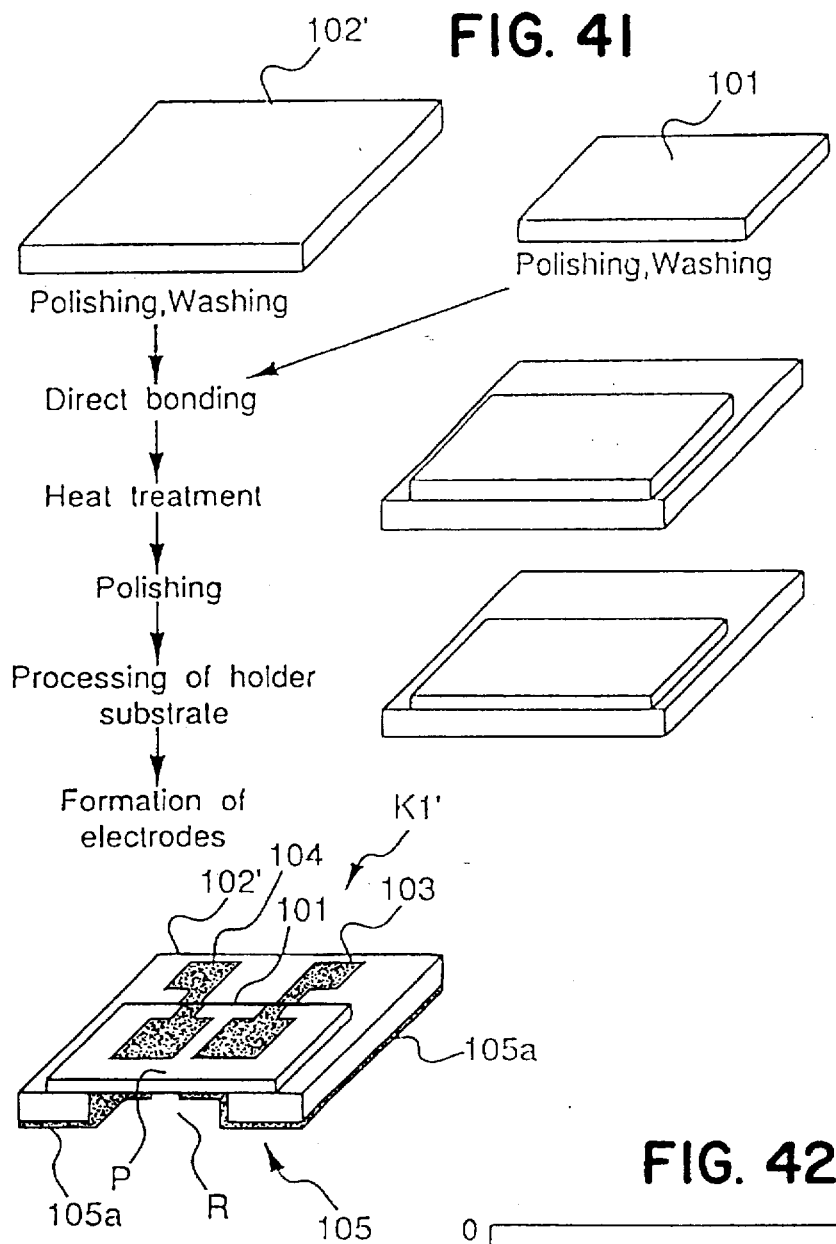
FIG. 41 is view showing production steps of a piezoelectric filter which is a first modification of the piezoelectric filter of FIG. 37.

FIG. 41 shows production steps of a piezoelectric filter K1' which is a first modification of the piezoelectric filter K1. The piezoelectric filter K1' includes a glass substrate 102' which is made of glass having a coefficient of thermal expansion substantially identical with that of quartz of the quartz substrate 101. Since other constructions of the piezoelectric filter K1' are similar to those of the piezoelectric filter K1, the description is abbreviated for the sake of brevity.

In FIG. 41, the quartz substrate 101 and the glass substrate 102' are initially polished and washed. Then, the quartz substrate 101 and the glass substrate 102' are subjected to a hydrophilic treatment by using hydrophilic liquid so as to be bonded to each other by direct bonding. At this time, the quartz substrate 101 and the glass substrate 102' are already bonded to each other. However, since this bonding strength is quite small, the quartz substrate 101 and the glass substrate 102' can be neither secured to each other nor processed. Thus, in order to increase the bonding strength, the quartz substrate 101 and the glass substrate 102' are heat treated at a temperature of 450° C. The bonding strength is determined by this heat treatment temperature. As the heat treatment temperature is raised, the bonding strength increases. However, permissible heat treatment temperature is determined by coefficients of thermal expansion of quartz of the piezoelectric substrate 101 and glass of the glass substrate 102' and thicknesses of the quartz substrate 101 and the glass substrate 102'. The heat treatment temperature can be raised further as the above coefficients of thermal expansion become smaller and thickness of the quartz substrate 101 becomes smaller relative to that of the glass substrate 102'. By this heat treatment step, the quartz substrate 101 and the glass substrate 102' are securely bonded to each other without using adhesive. Thereafter, in order to put the quartz substrate 101 to high-frequency use, the quartz substrate 101 is polished. Since the heat treatment has been performed at 450° C., bonding strength between the quartz substrate 101 and the glass substrate 102' is quite large. As a result, the quartz substrate 101 can be polished to a thickness of 8 μm. Subsequently, in order to produce the oscillatory portion P of the quartz substrate 101, a portion of the glass substrate 102, which confronts the oscillatory portion P, is removed by etching and thus, the recess R is obtained. Then, the signal electrodes 103 and 104 and the earth electrode 105 are produced by depositing chromium and gold, respectively and photolithography.

Figure 42:
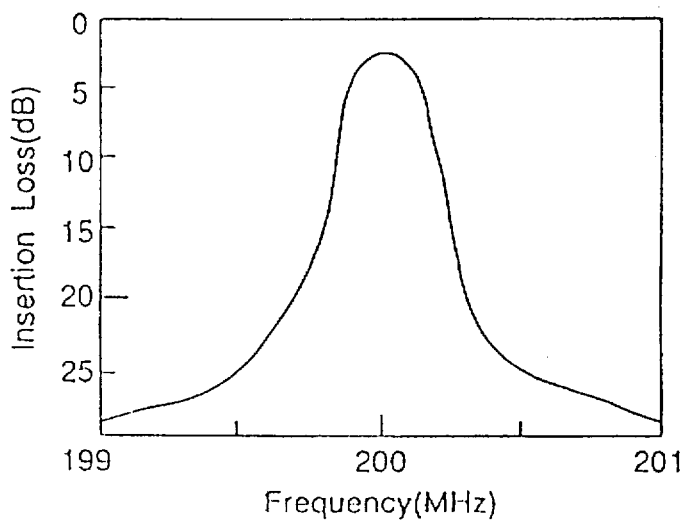
FIG. 42 is a graph showing characteristics of the piezoelectric filter of FIG. 41.

The piezoelectric filter K1' produced as described above has characteristics shown in FIG. 42. As shown in FIG. 42, the piezoelectric filter K1' has a central frequency of 200 MHz, which has been so far difficult to obtain in a known method of producing a piezoelectric filter.

Figure 43:
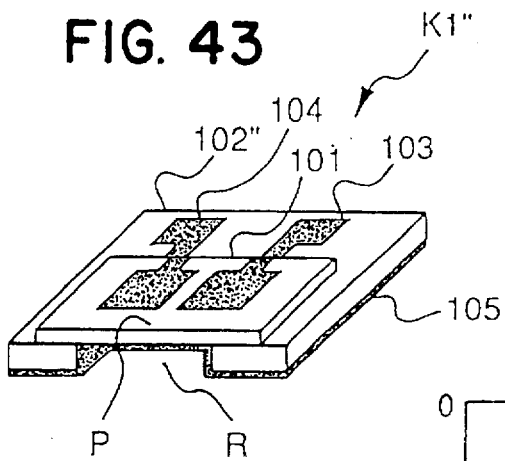
FIG. 43 is a perspective view of a piezoelectric filter which is a second modification of the piezoelectric filter of FIG. 37.

FIG. 43 shows a piezoelectric filter K1" which is a second modification of the piezoelectric filter K1. In the piezoelectric substrate K1", the glass substrate 102 of the piezoelectric filter K1 is replaced by a silicon substrate 102". Since other constructions of the piezoelectric filter K1" are similar to those of the piezoelectric filter K1, the description is abbreviated for the sake of brevity.

Figure 44:
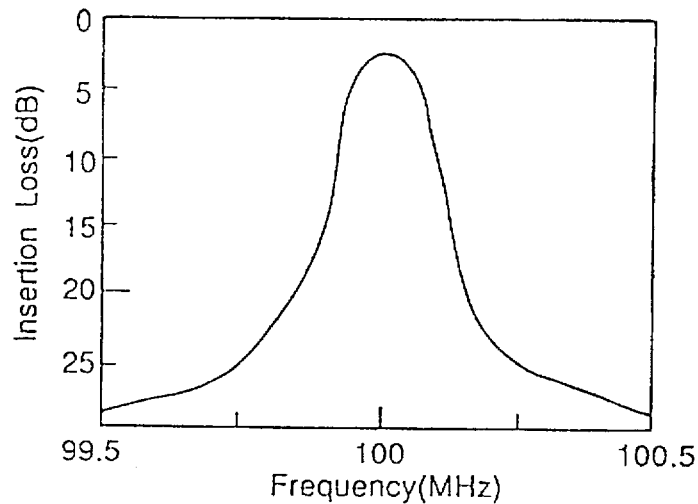
FIG. 44 is a graph showing characteristics of the piezoelectric filter of FIG. 43.

The piezoelectric substrate K1" of the above described arrangement has characteristics shown in FIG. 44. As shown in FIG. 44, the piezoelectric filter K1" has a central frequency of 100 MHz, which has been so far difficult to obtain in a known piezoelectric filter.

Figure 45:
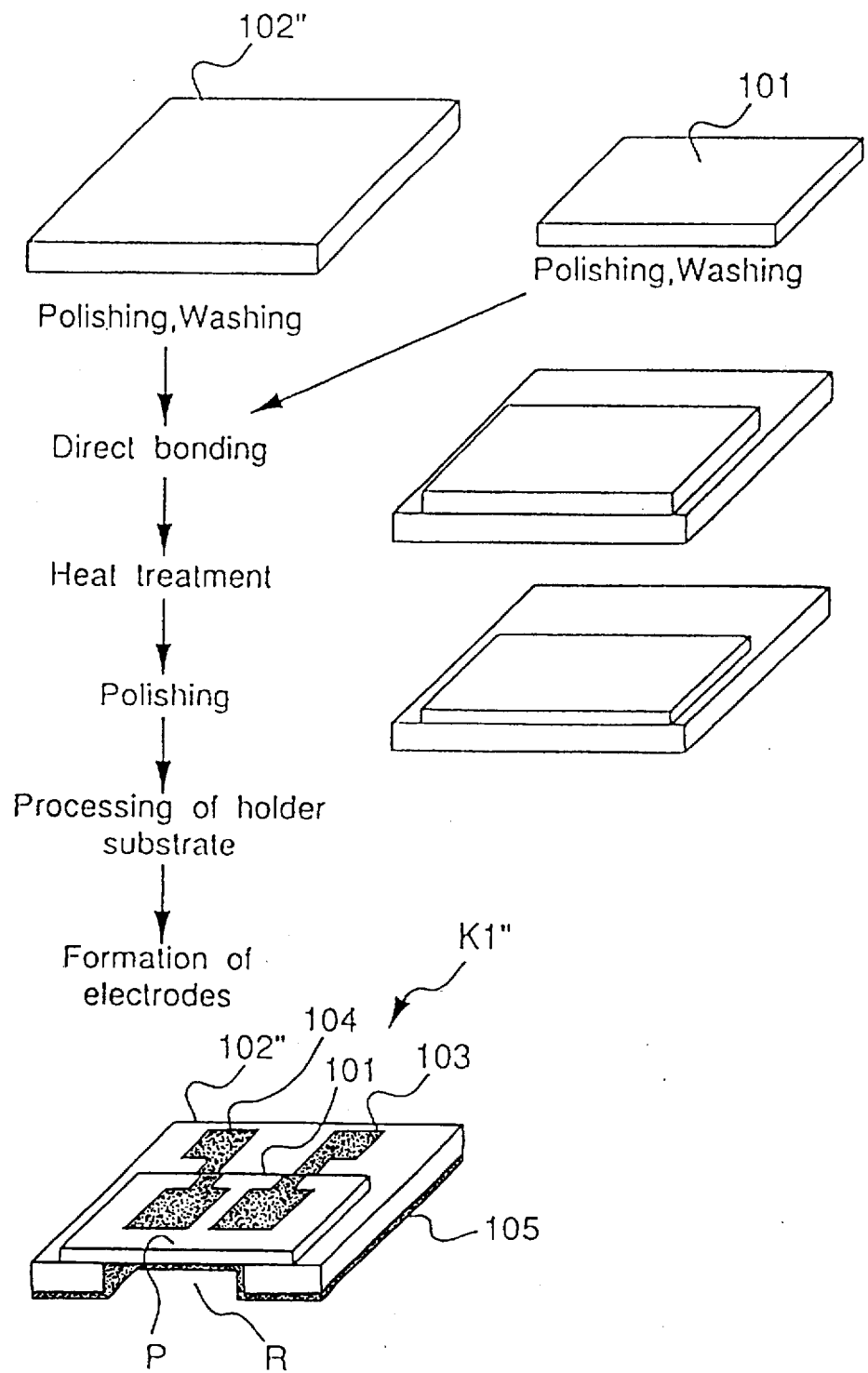
FIG. 45 is a view showing production steps of the piezoelectric filter of FIG. 43.

FIG. 45 shows production steps of the piezoelectric filter K1". The quartz substrate 101 and the silicon substrate 102" are initially polished and washed. Then, the quartz substrate 101 and the silicon substrate 102" are subjected to a hydrophilic treatment by using hydrophilic liquid so as to be bonded to each other by direct bonding. At this time, the quartz substrate 101 and the silicon substrate 102" are already bonded to each other. However, since this bonding strength is quite small, the quartz substrate 101 and the silicon substrate 102" can be neither secured to each other nor processed. Thus, in order to increase the bonding strength, the quartz substrate 101 and the silicon substrate 102" are heat treated at a predetermined temperature which should be lower than a temperature leading to loss of piezoelectric property of the piezoelectric substrate 101. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. Thus, the predetermined temperature is set at 300° C. By this heat treatment step, the quartz substrate 101 and the silicon substrate 102" are securely bonded to each other without using adhesive. Then, the quartz substrate 101 is polished so as to adjust its thickness. Subsequently, in order to produce the oscillatory portion P of the quartz substrate 101, a portion of the silicon substrate 102", which confronts the oscillatory portion P, is removed by etching and thus, the recess R is obtained. Then, the signal electrodes 103 and 104 and the earth electrode 105 are produced by depositing chromium and gold, respectively and photolithography.

Figure 46:
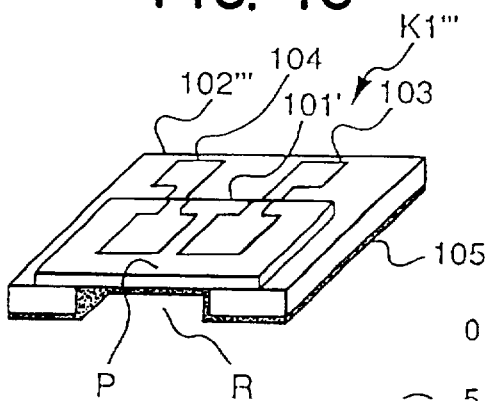
FIG. 46 is a perspective view of a piezoelectric filter which is a third modification of the piezoelectric filter of FIG. 37.

FIG. 46 shows a piezoelectric filter K1''' which is a third modification of the piezoelectric filter K1. In the piezoelectric filter K1''', the quartz substrate 101 acting as a piezoelectric substrate and the glass substrate 102 for holding the quartz substrate 101 in the piezoelectric filter K1 are, respectively, replaced by a substrate 101' made of lithium niobate and a substrate 102''' made of lithium tantalate. Since other constructions of the piezoelectric filter K1''' are similar to those of the piezoelectric filter K1, the description is abbreviated for the sake of brevity.

Figure 47:
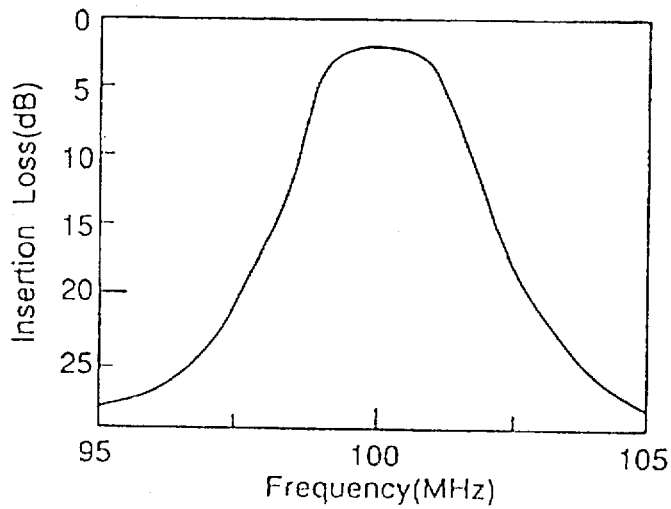
FIG. 47 is a graph showing characteristics of the piezoelectric filter of FIG. 46.

The piezoelectric filter K1''' of the above described arrangement has characteristics shown in FIG. 47. As shown in FIG. 47, the piezoelectric filter K1''' has a central frequency of 100 MHz, which has been so far difficult to obtain in a known piezoelectric filter.

FIG. 48 shows production steps of the piezoelectric filter K1'''. The substrates 101' and 102''' are initially polished and washed. Then, the substrates 101' and 102''' are subjected to a hydrophilic treatment by using hydrophilic liquid so as to be bonded to each other by direct bonding. At this time, the substrates 101' and 102''' are already bonded to each other. However, since this bonding strength is quite small, the substrates 101' and 102''' can be neither secured to each other nor processed. Thus, in order to increase the bonding strength, the substrates 101' and 102''' are heat treated at a predetermined temperature which should be lower than a temperature leading to loss of piezoelectric property of the piezoelectric substrate 101'. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. Thus, the predetermined temperature is set at 300° C. By this heat treatment step, the substrates 101' and 102''' are securely bonded to each other without using adhesive. Then, the substrate 101' is polished so as to adjust its thickness. Subsequently, in order to produce the oscillatory portion P of the substrate 101', a portion of the substrate 102''', which confronts the oscillatory portion P, is removed by etching and thus, the recess R is obtained. Then, the signal electrodes 103 and 104 and the earth electrode 105 are produced by depositing chromium and gold, respectively and photolithography.

In this modification, combination of lithium niobate and lithium tantalate is described but other combinations can be employed based on principles and functions identical with those of this combinations

EXAMPLE 44

Figure 49:
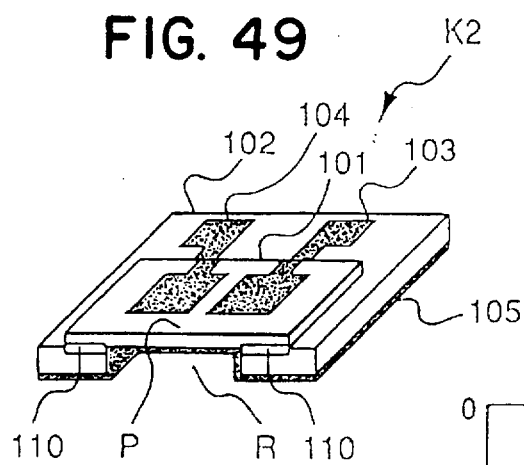
FIG. 49 is a perspective view of a piezoelectric filter according to Example 44 of the present invention.

FIG. 49 shows a piezoelectric filter K2 according to Example 44 of the present invention. In the piezoelectric filter K2, the quartz substrate 101 and the glass substrate 102 for holding the glass substrate 101 are directly bonded to each other by $SiO_2$ 110 formed on the glass substrate 102. Since other constructions of the piezoelectric filter K2 are similar to those of the piezoelectric filter K1, the description is abbreviated for the sake of brevity.

Figure 50:
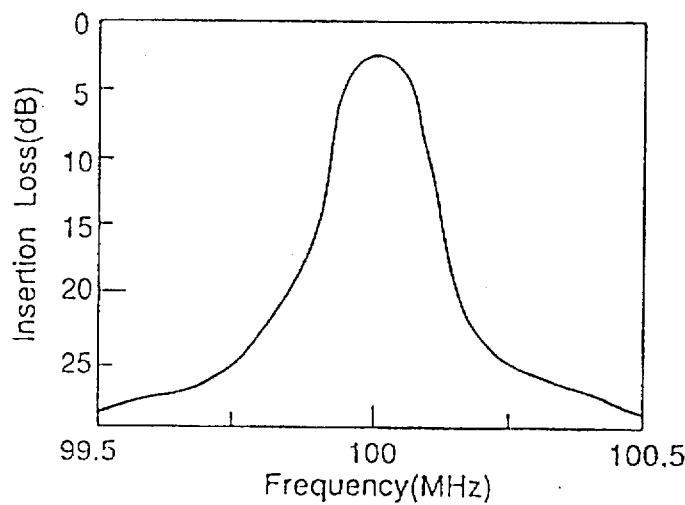
FIG. 50 is a graph showing characteristics of the piezoelectric filter of FIG. 49.

The piezoelectric filter K2 of the above described arrangement has characteristics shown in FIG. 50. As shown in FIG. 50, the piezoelectric filter K2 has a central frequency of 100 MHz, which has been so far difficult to obtain in a known piezoelectric filter.

Figure 51:
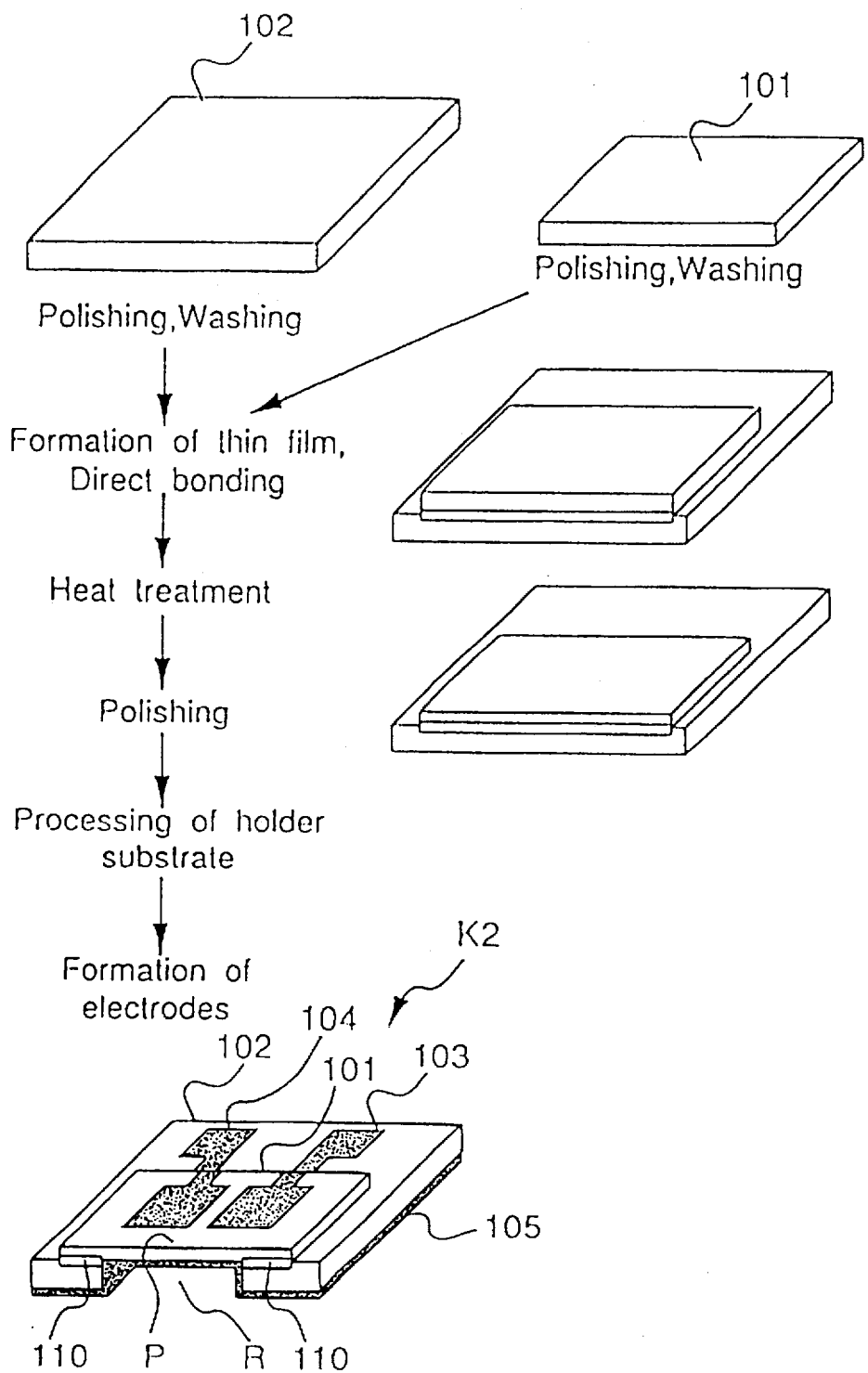
FIG. 51 is a view showing production steps of the piezoelectric filter of FIG. 49.

FIG. 51 shows production steps of the piezoelectric filter K2. Initially, the quartz substrate 101 and the glass substrate 102 are polished and washed. Then, $SiO_2$ 110 is formed on the glass substrate 102 to a thickness of 1 μm by using CVD method. Then, the quartz substrate 101 and $SiO_2$ 110 on the glass substrate 102 are subjected to a hydrophilic treatment by using hydrophilic liquid so as to be bonded to each other by direct bonding. At this time, the quartz substrate 101 and the glass substrate 102 are already bonded to each other. However, since this bonding strength is quite small, the quartz substrate 101 and the glass substrate 102 can be neither secured to each other nor processed. Thus, in order to increase the bonding strength, the quartz substrate 101 and the glass substrate 102 are heat treated at a predetermined temperature which should be lower than a temperature leading to loss of piezoelectric property of the piezoelectric substrate 101 and a softening point of the glass substrate 102. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. On the other hand, glass used for the glass substrate 102 has a softening point of 450° C. Thus, the predetermined temperature is set at 300° C. By this heat treatment step, the quartz substrate 101 and the glass substrate 102 are securely bonded to each other without using adhesive. Then, the quartz substrate 101 is polished so as to adjust its thickness. Subsequently, in order to produce the oscillatory portion P of the quartz substrate 101, a portion of the glass substrate 102, which confronts the oscillatory portion P, is removed by etching and thus, the recess R is obtained. Then, the signal electrodes 103 and 104 and the earth electrode 105 are produced by depositing chromium and gold, respectively and photolithography.

In this process, $SiO_2$ 110 is formed as a thin film and thus, is softer than glass of the glass substrate 102 and quartz of the quartz substrate 101. Hence, even if minute foreign matter is present at the direct bonding interface between the quartz substrate 101 and the glass substrate 102, $SiO_2$ 110 absorbs the foreign matter, so that direct bonding between the quartz substrate 101 and the glass substrate 102 is facilitated advantageously. On the contrary, if $SiO_2$ is not provided at the direct bonding interface, such a case may happen that the quartz substrate 101 and the glass substrate 102 cannot be directly bonded to each other due to minute foreign matter present at the bonding interface. However, in this example, since $SiO_2$ is present at the bonding interface, the quartz substrate 101 and the glass substrate 102 can be directly bonded to each other even if minute foreign matter exists at the direct bonding interface. As a result, such an effect can be achieved that yield is raised with substantially no change of electrical characteristics.

In this process, the piezoelectric substrate is made of quartz. However, even if the piezoelectric substrate is made of any one of lithium niobate, lithium tantalate and lithium borate, the same result can be obtained. Meanwhile, the substrate for holding the quartz substrate is made of glass. However, even if the substrate for holding the quartz substrate is made of any one of silicon, quartz, lithium borate, lithium niobate, lithium tantalate and lithium, the same result can be obtained. Furthermore, in this example, $SiO_2$ is employed as silicon compound present at the direct bonding interface between the quartz substrate and the glass substrate. However, even if $SiO_2$ is replaced by Si or SiN, the same result can be obtained by achieving effects identical with those of $SiO_2$. Meanwhile, in this process, CVD method is employed for producing $SiO_2$ but may be replaced by any other method of formulating a similar film, for example, sputtering method, deposition method, etc. Furthermore, in this process, silicon compound is formed on the glass substrate but may be formed on the piezoelectric substrate so as to achieve the same effects.

Figure 52:
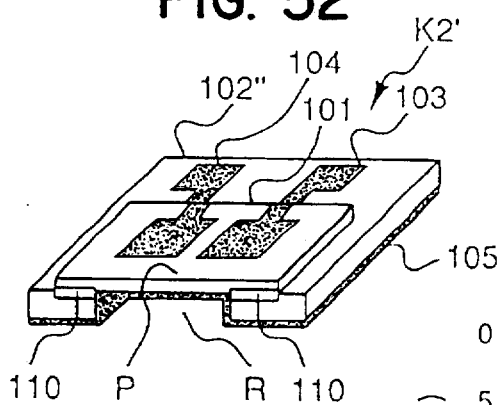
FIG. 52 is a perspective view of a piezoelectric filter which is a first modification of the piezoelectric filter of FIG. 49.

FIG. 52 shows a piezoelectric filter K2' which is a first modification of the piezoelectric filter K2. In the piezoelectric filter K2', the glass substrate 102 of the piezoelectric filter K2 is replaced by the silicon substrate 102''. Since other constructions of the piezoelectric filter K2' are similar to those of the piezoelectric filter K2, the description is abbreviated for the sake of brevity.

Figure 53:
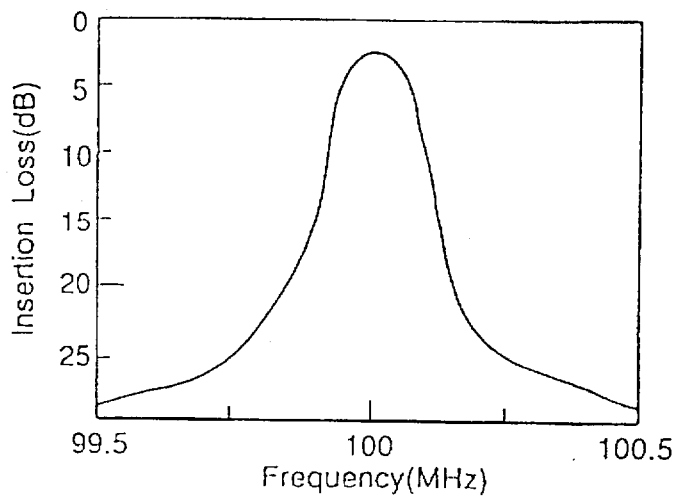
FIG. 53 is a graph showing characteristics of the piezoelectric filter of FIG. 52.

The piezoelectric filter K2' of the above described arrangement has characteristics shown in FIG. 53. As shown in FIG. 53, the piezoelectric filter K2' has a central frequency of 100 MHz, which has been so far difficult to obtain in a known piezoelectric filter.

Figure 54:
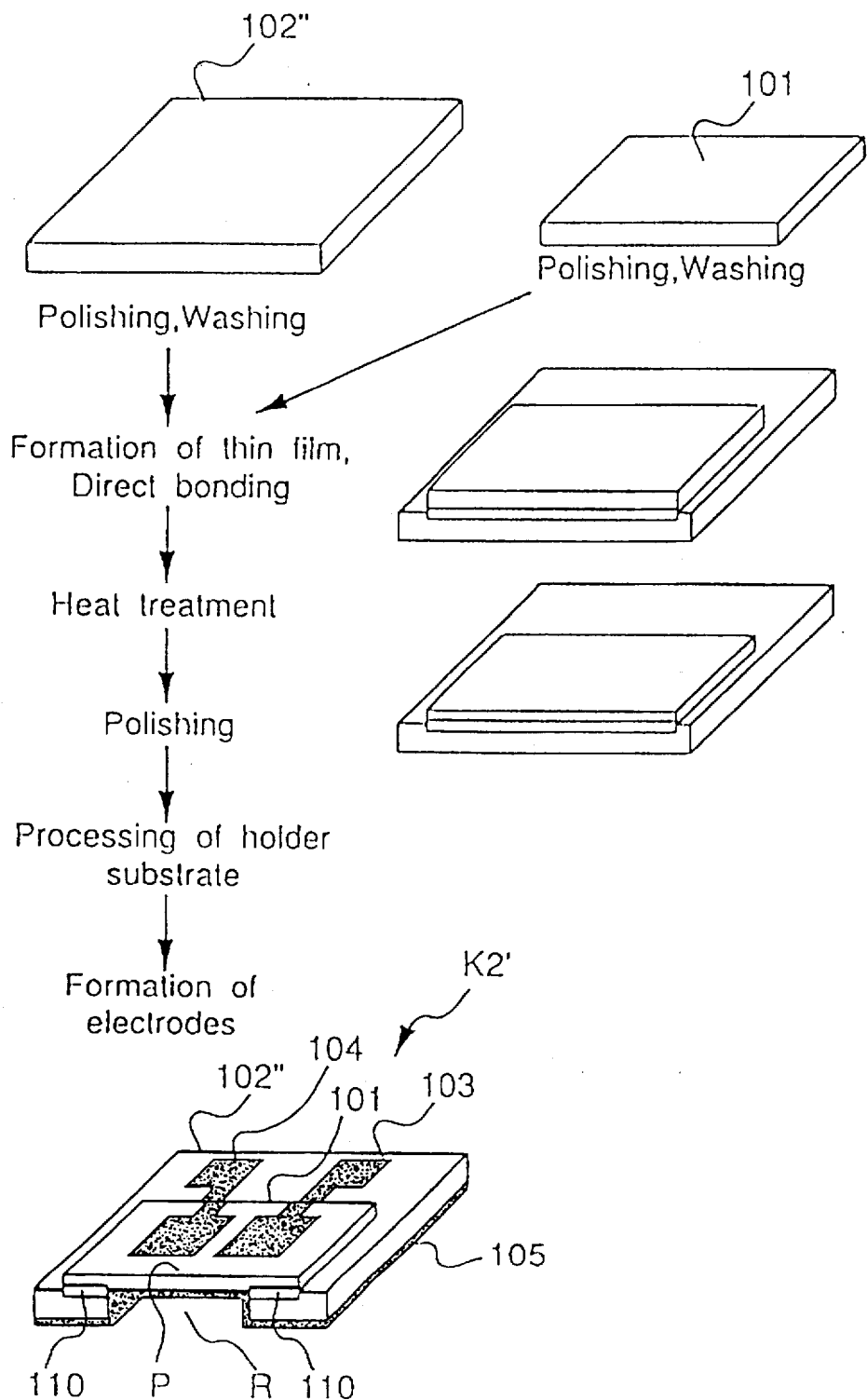
FIG. 54 is a view showing production steps of the piezoelectric filter of FIG. 52.

FIG. 54 shows production steps of the piezoelectric filter K2'. The quartz substrate 101 and the silicon substrate 102'' are initially polished and washed. SiO$_2$ 110 is formed on the silicon substrate 102" to a thickness of 1 μm by using CVD method. Then, the quartz substrate 101 and SiO$_2$ 110 on the silicon substrate 102" are subjected to a hydrophilic treatment by using hydrophilic liquid so as to be bonded to each other by direct bonding. At this time, the quartz substrate 101 and the silicon substrate 102" are already bonded to each other. However, since this bonding strength is quite small, the quartz substrate 101 and the silicon substrate 102" can be neither secured to each other nor processed. Thus, in order to increase the bonding strength, the quartz substrate 101 and the silicon substrate 102" are heat treated at a predetermined temperature which should be lower than a temperature leading to loss of piezoelectric property of the piezoelectric substrate 101. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. Thus, the predetermined temperature is set at 300° C. By this heat treatment step, the quartz substrate 101 and the silicon substrate 102" are securely bonded to each other without using adhesive. Then, the quartz substrate 101 is polished so as to adjust its thickness. Subsequently, in order to produce the oscillatory portion P of the quartz substrate 101, a portion of the silicon substrate 102", which confronts the oscillatory portion P, is removed by etching and thus, the recess R is obtained. Then, the signal electrodes 103 and 104 and the earth electrode 105 are produced by depositing chromium and gold, respectively and photolithography.

In the piezoelectric filter K2' produced as described above, the same effects as those of the piezoelectric filter K2 can be obtained.

Figure 55:
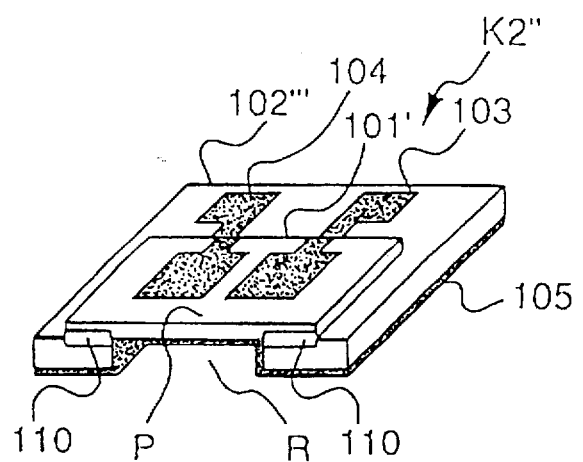
FIG. 55 is a perspective view of a piezoelectric filter which is a second modification of the piezoelectric filter of FIG. 49.

FIG. 55 shows a piezoelectric filter K2" which is a second modification of the piezoelectric filter K2. In the piezoelectric filter K2", the quartz substrate 101 and the glass substrate 102 of the piezoelectric filter K2 are replaced by the substrate 101' made of lithium niobate and the substrate 102'" made of lithium tantalate, respectively. Since other constructions of the piezoelectric filter K2" are similar to those of the piezoelectric filter K2, the description is abbreviated for the sake of brevity.

Figure 56:
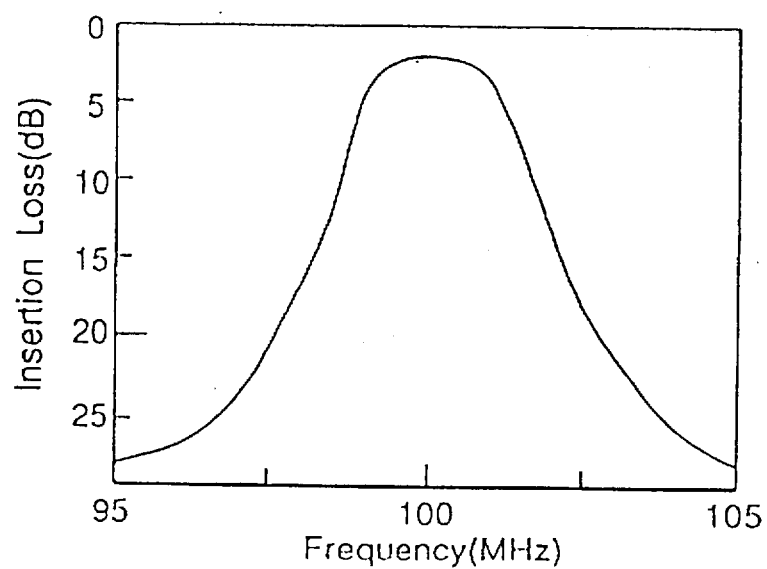
FIG. 56 is a graph showing characteristics of the piezoelectric filter of FIG. 55.

The piezoelectric filter K2" has characteristics shown in FIG. 56. As shown in FIG. 56, the piezoelectric filter K2" has a central frequency of 100 MHz, which has been so far difficult to obtain in a known piezoelectric device.

Figure 57:
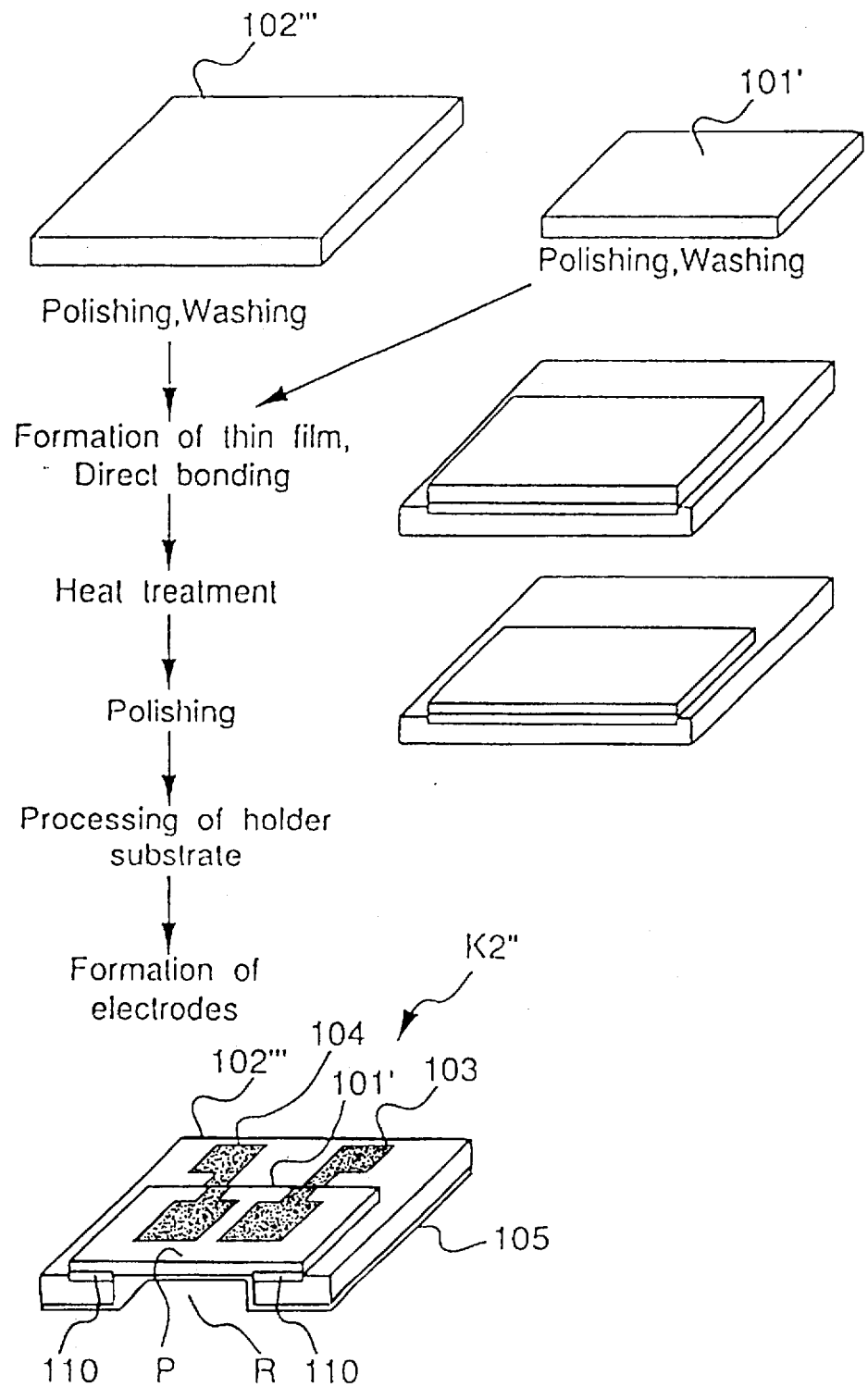
FIG. 57 is a view showing production steps of the piezoelectric filter of FIG. 55.
Figure 58:
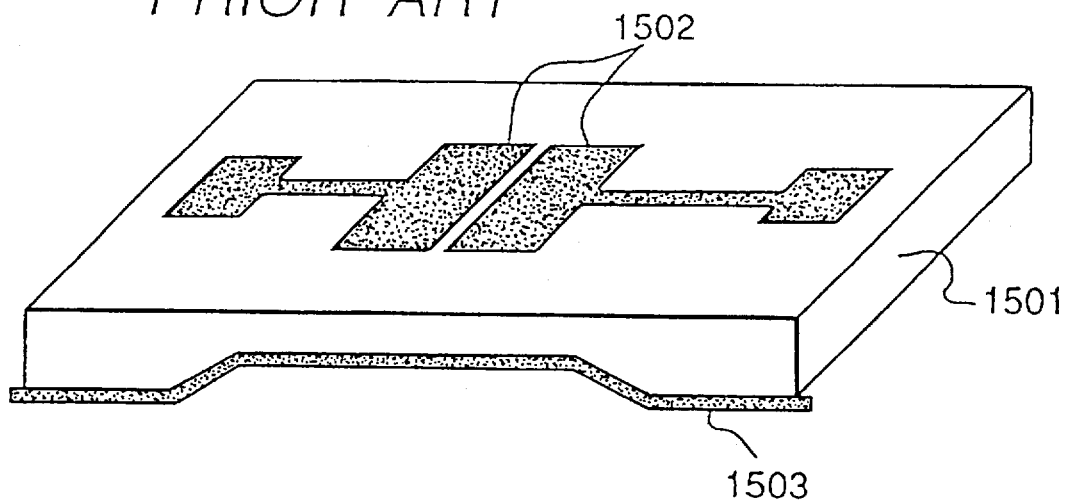
FIG. 58 is a perspective view of a prior art piezoelectric filter.
Figure 59:
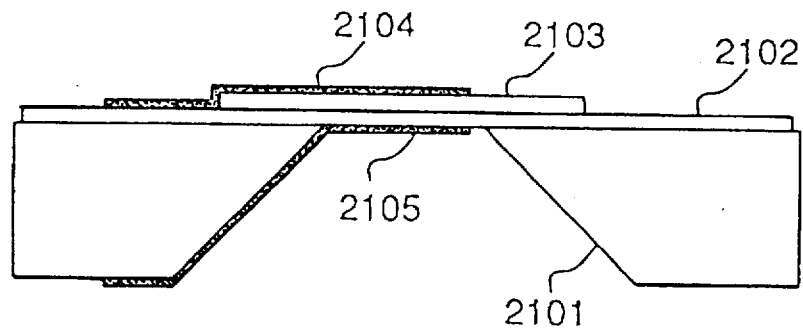
FIG. 59 is a front elevational view of another prior art piezoelectric filter.

FIG. 57 shows production steps of the piezoelectric filter K2". The substrates 101' and 102'" are initially polished and washed. SiO$_2$ 110 is formed on the substrate 102'" to a thickness of 1 μm by using CVD method. Then, the substrate 101' and SiO$_2$ 110 on the substrate 102'" are subjected to a hydrophilic treatment by using hydrophilic liquid so as to be bonded to each other by direct bonding. At this time, the substrates 101' and 102'" are already bonded to each other. However, since this bonding strength is quite small, the substrates 101' and 102'" can be neither secured to each other nor processed. Thus, in order to increase the bonding strength, the substrates 101' and 102'" are heat treated at a predetermined temperature which should be lower than a temperature leading to loss of piezoelectric property of the piezoelectric substrate 101'. Meanwhile, quartz loses its piezoelectric property at a temperature of 573° C., lithium tantalate loses its piezoelectric property at a temperature of about 600° C., lithium niobate loses its piezoelectric property at a temperature of about 1000° C. and lithium borate loses its piezoelectric property at a temperature of about 600° C. Thus, the predetermined temperature is set at 300° C. By this heat treatment step, the substrates 101' and 102'" are securely bonded to each other without using adhesive. Then, the substrate 101' is polished so as to adjust its thickness. Subsequently, in order to produce the oscillatory portion P of the substrate 101', a portion of the substrate 102'", which confronts the oscillatory portion P, is removed by etching and thus, the recess R is obtained. Then, the signal electrodes 103 and 104 and the earth electrode 105 are produced by depositing chromium and gold, respectively and photolithography.

In the piezoelectric filter K2" produced as described above, the same effects as those of the piezoelectric filter K2 can be achieved.

Although the present invention has been fully described in connection with the preferred examples thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A quartz device comprising:

a quartz plate made of quartz and having first and second surfaces;

a first excitation electrode deposited on said first surface of said quartz plate;

a second excitation electrode deposited on said second surface of said quartz plate opposing said first excitation electrode;

a holding plate made of a material having a thermal expansion coefficient substantially equal to that of said quartz plate, said holding plate having a surface held via direct bonds, which are free of organic adhesives, to a surface of said quartz plate; and a housing substrate having a recess, a portion of said quartz plate being connected to a portion of said holding plate by direct bonds free of organic adhesives, a portion of said holding plate being connected to a portion of said housing substrate by direct bonds free of organic adhesives, and a major portion of said quartz plate which is subject to vibration hanging over said recess of said housing substrate.

2. An integrated unitary body comprising:

a substrate having opposite first aid second surfaces and being formed of a material selected from the group consisting of monocrystalline quartz crystal, lithium niobate, lithium tantalate, lithium borate, semiconductor, and glass;

a piezoelectric plate having first and second portions and opposite first and second surfaces and being formed of a material selected from the group consisting of monocrystalline quartz crystal, lithium niobate, lithium tantalate, and lithium borate, said second surface of said second portion of said piezoelectric plate being direct bonded to said first surface of said substrate such that component atoms of said substrate and component atoms of said piezoelectric plate are coupled mutually through at least one member selected from the group consisting of oxygen and hydroxyls;

a first excitation electrode provided on said first surface of said first portion of said piezoelectric plate; and a second excitation electrode provided on said second surface of said first portion of said piezoelectric plate opposing said first excitation electrode;

a housing having a recess;

wherein said substrate is a plate;

wherein a portion of said housing is connected to a portion of said substrate by direct bonding; and wherein said first portion of said piezoelectric plate hangs over said recess of said housing.

3. An integrated unitary body as claimed in claim 2, wherein said housing is formed of a material selected from the group consisting of quartz, glass and silicon.

4. An integrated unitary body as claimed in claim 2, wherein said housing is formed of glass.

5. An integrated unitary body as claimed in claim 2, wherein said housing is formed of semiconductor.

6. An integrated unitary body as claimed in claim 5, wherein said housing is further provided with an integrated circuit.

7. An integrated unitary body for use in an electronic device, comprising:

a semiconductor substrate having opposite first and second surfaces;

a monocrystalline quartz crystal piezoelectric plate having opposite first and second surfaces, said second surface of said piezoelectric plate being direct bonded to said first surface of said semiconductor substrate such that component atoms of said semiconductor substrate and component atoms of said piezoelectric plate are coupled mutually through at least one member selected from the group consisting of oxygen and hydroxyls.

8. An integrated unitary body as claimed in claim 7, wherein said semiconductor substrate is formed of a material selected from the group consisting of silicon and a III–V group compound semiconductor.

9. An integrated unitary body as claimed in claim 7, wherein said semiconductor substrate is formed of a material selected from the group consisting of GaAs and InP.

10. An integrated unitary body as claimed in claim 7, further comprising a first excitation electrode provided on said first surface of said piezoelectric plate; and a second excitation electrode provided on said second surface of said piezoelectric plate so as to oppose said first excitation electrode.

11. An integrated unitary body as claimed in claim 10, further comprising:

a first terminal electrode mounted to said substrate and electrically connected to said first excitation electrode; and a second terminal electrode mounted to said substrate and electrically connected to said second excitation electrode.

12. An integrated unitary body as claimed in claim 10, further comprising a further electrode provided on said second surface of said substrate; and wherein said second excitation electrode is electrically connected through a via-hole to said further electrode.

13. An integrated unitary body as claimed in claim 7, wherein a pair of excitation electrodes are provided on one of said first and second surfaces of said piezoelectric plate.

14. An integrated unitary body for use in an electronic device, comprising:

a semiconductor substrate having opposite first and second surfaces;

a monocrystalline quartz crystal piezoelectric plate having opposite first and second surfaces, said piezoelectric plate being bonded to said semiconductor substrate such that said second surface of said piezoelectric plate confronts said first surface of said semiconductor substrate; and a thin film interposed between said semiconductor substrate and said piezoelectric plate, said thin film being direct bonded to one of said semiconductor substrate and said piezoelectric plate such that component atoms of said thin film are coupled, through at least one member selected from the group consisting of oxygen and hydroxyls, to component atoms of the one of said semiconductor substrate and said piezoelectric plate that is direct bonded to said thin film.

15. An integrated unitary body as claimed in claim 14, wherein said thin film includes silicon.

16. An integrated unitary body as claimed in claim 14, further comprising a first excitation electrode provided on said first surface of said piezoelectric plate; and a second excitation electrode provided on said second surface of said piezoelectric plate so as to oppose said first excitation electrode.

17. An integrated unitary body as claimed in claim 16, further comprising:

a first terminal electrode mounted to said substrate and electrically connected to said first excitation electrode; and a second terminal electrode mounted to said substrate and electrically connected to said second excitation electrode.

18. An integrated unitary body as claimed in claim 16, further comprising a further electrode provided on said second surface of said substrate; and wherein said second excitation electrode is electrically connected through a via-hole to said further electrode.

19. An integrated unitary body as claimed in claim 14, wherein a pair of excitation electrodes are provided on one of said first and second surfaces of said piezoelectric plate.

20. An integrated unitary body for use in an electronic device, comprising:

a semiconductor substrate having opposite first and second surfaces;

a monocrystalline piezoelectric plate having opposite first and second surfaces and being formed of a material selected from the group consisting of monocrystalline lithium niobate, monocrystalline lithium tantalate, and monocrystalline lithium borate, said second surface of said piezoelectric plate being direct bonded to said first surface of said semiconductor substrate such that component atoms of said semiconductor substrate and component atoms of said piezoelectric plate are coupled mutually through at least one member selected from the group consisting of oxygen and hydroxyls.

21. An integrated unitary body as claimed in claim 20, further comprising a first excitation electrode provided on said first surface of said piezoelectric plate; and a second excitation electrode provided on said second surface of said piezoelectric plate so as to oppose said first excitation electrode.

22. An integrated unitary body as claimed in claim 21, further comprising:

a first terminal electrode mounted to said substrate and electrically connected to said first excitation electrode; and a second terminal electrode mounted to said substrate and electrically connected to said second excitation electrode.

23. An integrated unitary body as claimed in claim 21, further comprising a further electrode provided on said second surface of said substrate; and wherein said second excitation electrode is electrically connected through a via-hole to said further electrode.

24. An integrated unitary body as claimed in claim 20, wherein a pair of excitation electrodes are provided on one of said first and second surfaces of said piezoelectric plate.

25. An integrated unitary body for use in an electronic device, comprising:

a semiconductor substrate having opposite first and second surfaces;

a monocrystalline piezoelectric plate having opposite first and second surfaces and being formed of a material selected from the group consisting of monocrystalline lithium niobate, monocrystalline lithium tantalate, and monocrystalline lithium borate, said piezoelectric plate being bonded to said semiconductor substrate such that said second surface of said piezoelectric plate confronts said first surface of said semiconductor substrate;

a thin film interposed between said semiconductor substrate and said piezoelectric plate, said thin film being direct bonded to one of said semiconductor substrate and said piezoelectric plate such that component atoms of said thin film are coupled, through at least one member selected from the group consisting of oxygen and hydroxyls, to component atoms of the one of said semiconductor substrate and said piezoelectric plate that is direct bonded to said thin film.

26. An integrated unitary body as claimed in claim 25, wherein said thin film includes silicon.

27. An integrated unitary body as claimed in claim 25, further comprising a first excitation electrode provided on said first surface of said piezoelectric plate; and a second excitation electrode provided on said second surface of said piezoelectric plate so as to oppose said first excitation electrode.

28. An integrated unitary body as claimed in claim 27, further comprising:

a first terminal electrode mounted to said substrate and electrically connected to said first excitation electrode; and a second terminal electrode mounted to said substrate and electrically connected to said second excitation electrode.

29. An integrated unitary body as claimed in claim 27, further comprising a further electrode provided on said second surface of said substrate; and wherein said second excitation electrode is electrically connected through a via-hole to said further electrode.

30. An integrated unitary body as claimed in claim 25, wherein a pair of excitation electrodes are provided on one of said first and second surfaces of said piezoelectric plate.

31. An integrated unitary body for use in an electronic device, comprising:

a glass substrate having opposite first and second surfaces;

a monocrystalline piezoelectric plate having opposite first and second surfaces and being formed of a material selected from the group consisting of monocrystalline lithium niobate, monocrystalline lithium tantalate, and monocrystalline lithium borate, said second surface of said piezoelectric plate being direct bonded to said first surface of said glass substrate such that component atoms of said glass substrate and component atoms of said piezoelectric plate are coupled mutually through at least one member selected from the group consisting of oxygen and hydroxyls.

32. An integrated unitary body as claimed in claim 31, further comprising a first excitation electrode provided on said first surface of said piezoelectric plate; and a second excitation electrode provided on said second surface of said piezoelectric plate so as to oppose said first excitation electrode.

33. An integrated unitary body as claimed in claim 32, further comprising:

a first terminal electrode mounted to said substrate and electrically connected to said first excitation electrode; and a second terminal electrode mounted to said substrate and electrically connected to said second excitation electrode.

34. An integrated unitary body as claimed in claim 32, further comprising a further electrode provided on said second surface of said substrate; and wherein said second excitation electrode is electrically connected through a via-hole to said further electrode.

35. An integrated unitary body as claimed in claim 31, wherein a pair of excitation electrodes are provided on one of said first and second surfaces of said piezoelectric plate.

36. An integrated unitary body for use in an electronic device, comprising:

a glass substrate having opposite first and second surfaces;

a monocrystalline piezoelectric plate having opposite first and second surfaces and being formed of a material selected from the group consisting of monocrystalline lithium niobate, monocrystalline lithium tantalate, and monocrystalline lithium borate, said piezoelectric plate being bonded to said glass substrate such that said second surface of said piezoelectric plate confronts said first surface of said glass substrate;

a thin film, formed by one of a deposition process and a sputtering process, interposed between said glass substrate and said piezoelectric plate, said thin film being direct bonded to one of said glass substrate and said piezoelectric plate such that component atoms of said thin film are coupled, through at least one member selected from the group consisting of oxygen and hydroxyls, to component atoms of the one of said glass substrate and said piezoelectric plate that is direct bonded to said thin film.

37. An integrated unitary body as claimed in claim 36, wherein said thin film includes silicon.

38. An integrated unitary body as claimed in claim 36, further comprising a first excitation electrode provided on said first surface of said piezoelectric plate; and a second excitation electrode provided on said second surface of said piezoelectric plate so as to oppose said first excitation electrode.

39. An integrated unitary body as claimed in claim 38, further comprising:

a first terminal electrode mounted to said substrate and electrically connected to said first excitation electrode; and a second terminal electrode mounted to said substrate and electrically connected to said second excitation electrode.

40. An integrated unitary body as claimed in claim 38, further comprising a further electrode provided on said second surface of said substrate; and wherein said second excitation electrode is electrically connected through a via-hole to said further electrode.

41. An integrated unitary body as claimed in claim 36, wherein a pair of excitation electrodes are provided on one of said first and second surfaces of said piezoelectric plate.

42. An integrated unitary body for use in an electronic device, comprising:

a substrate having opposite first and second surfaces and being formed of a material selected from the group consisting of lithium niobate, lithium tantalate, and lithium borate;

a monocrystalline quartz crystal piezoelectric plate having opposite first and second surfaces, said second surface of said piezoelectric plate being direct bonded to said first surface of said substrate such that component atoms of said substrate and component atoms of said piezoelectric plate are coupled mutually through at least one member selected from the group consisting of oxygen and hydroxyls.

43. An integrated unitary body as claimed in claim 42, further comprising a first excitation electrode provided on said first surface of said piezoelectric plate; and a second excitation electrode provided on said second surface of said piezoelectric plate so as to oppose said first excitation electrode.

44. An integrated unitary body as claimed in claim 43, further comprising:

a first terminal electrode mounted to said substrate and electrically connected to said first excitation electrode; and a second terminal electrode mounted to said substrate and electrically connected to said second excitation electrode.

45. An integrated unitary body as claimed in claim 43, further comprising a further electrode provided on said second surface of said substrate; and wherein said second excitation electrode is electrically connected through a via-hole to said further electrode.

46. An integrated unitary body as claimed in claim 42, wherein a pair of excitation electrodes are provided on one of said first and second surfaces of said piezoelectric plate.

47. An integrated unitary body for use in an electronic device, comprising:

a substrate having opposite first and second surfaces and being formed of a material selected from the group consisting of lithium niobate, lithium tantalate, and lithium borate;

a monocrystalline quartz crystal piezoelectric plate having opposite first and second surfaces, said piezoelectric plate being bonded to said substrate such that said second surface of said piezoelectric plate confronts said first surface of said substrate; and a thin film interposed between said substrate and said piezoelectric plate, said thin film being direct bonded to one of said substrate and said piezoelectric plate such that component atoms of said thin film are coupled, through at least one member selected from the group consisting of oxygen and hydroxyls, to component atoms of the one of said substrate and said piezoelectric plate that is direct bonded to said thin film.

48. An integrated unitary body as claimed in claim 47, wherein said thin film includes silicon.

49. An integrated unitary body as claimed in claim 47, further comprising a first excitation electrode provided on said first surface of said piezoelectric plate; and a second excitation electrode provided on said second surface of said piezoelectric plate so as to oppose said first excitation electrode.

50. An integrated unitary body as claimed in claim 49, further comprising:

a first terminal electrode mounted to said substrate and electrically connected to said first excitation electrode; and a second terminal electrode mounted to said substrate and electrically connected to said second excitation electrode.

51. An integrated unitary body as claimed in claim 49, further comprising a further electrode provided on said second surface of said substrate; and wherein said second excitation electrode is electrically connected through a via-hole to said further electrode.

52. An integrated unitary body as claimed in claim 47, wherein a pair of excitation electrodes are provided on one of said first and second surfaces of said piezoelectric plate.

53. An integrated unitary body for use in an electronic device, comprising:

a substrate having opposite first and second surfaces and being formed of a material selected from the group consisting of quartz, lithium niobate, lithium tantalate, and lithium borate; and a non-thin film monocrystalline piezoelectric plate having opposite first and second surfaces and being formed of a material selected from the group consisting of monocrystalline lithium niobate, monocrystalline lithium tantalate, and monocrystalline lithium borate, said second surface of said piezoelectric plate being direct bonded to said first surface of said substrate such that component atoms of said substrate and component atoms of said piezoelectric plate are coupled mutually through at least one member selected from the group consisting of oxygen and hydroxyls.

54. An integrated unitary body as claimed in claim 53, further comprising a first excitation electrode provided on said first surface of said piezoelectric plate; and a second excitation electrode provided on said second surface of said piezoelectric plate so as to oppose said first excitation electrode.

55. An integrated unitary body as claimed in claim 54, further comprising:

a first terminal electrode mounted to said substrate and electrically connected to said first excitation electrode; and a second terminal electrode mounted to said substrate and electrically connected to said second excitation electrode.

56. An integrated unitary body as claimed in claim 54, further comprising a further electrode provided on said second surface of said substrate; and wherein said second excitation electrode is electrically connected through a via-hole to said further electrode.

57. An integrated unitary body as claimed in claim 53, wherein a pair of excitation electrodes are provided on one of said first and second surfaces of said piezoelectric plate.

58. An integrated unitary body for use in an electronic device, comprising:

a substrate having opposite first and second surfaces and being formed of a material selected from the group consisting of quartz, lithium niobate, lithium tantalate, and lithium borate;

a non-thin film monocrystalline piezoelectric plate having opposite first and second surfaces and being formed of a material selected from the group consisting of monocrystalline lithium niobate, monocrystalline lithium tantalate, and monocrystalline lithium borate, said piezoelectric plate being bonded to said substrate such that said second surface of said piezoelectric plate confronts said first surface of said substrate; and a thin film interposed between said substrate and said piezoelectric plate, said thin film being direct bonded to one of said substrate and said piezoelectric plate such that component atoms of said thin film are coupled, through at least one member selected from the group consisting of oxygen and hydroxyls, to component atoms of the one of said substrate and said piezoelectric plate that is direct bonded to said thin film.

59. An integrated unitary body as claimed in claim 58, wherein said thin film includes silicon.

60. An integrated unitary body as claimed in claim 58, further comprising a first excitation electrode provided on said first surface of said piezoelectric plate; and a second excitation electrode provided on said second surface of said piezoelectric plate so as to oppose said first excitation electrode.

61. An integrated unitary body as claimed in claim 60, further comprising:

a first terminal electrode mounted to said substrate and electrically connected to said first excitation electrode; and a second terminal electrode mounted to said substrate and electrically connected to said second excitation electrode.

62. An integrated unitary body as claimed in claim 60, further comprising a further electrode provided on said second surface of said substrate; and wherein said second excitation electrode is electrically connected through a via-hole to said further electrode.

63. An integrated unitary body as claimed in claim 58, wherein a pair of excitation electrodes are provided on one of said first and second surfaces of said piezoelectric plate.

* * * * *